(12) United States Patent
Kamoshida et al.

(10) Patent No.: US 6,388,484 B1
(45) Date of Patent: May 14, 2002

(54) CLOCK CONTROL CIRCUIT

(75) Inventors: Masahiro Kamoshida; Haruki Toda, both of Yokohama; Tsuneaki Fuse, Tokyo; Yukihito Oowaki, Yokohama, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/243,483

(22) Filed: Feb. 3, 1999

(30) Foreign Application Priority Data

Mar. 18, 1998 (JP) .......................... 10-069062

(51) Int. Cl.⁷ ............................... H03L 7/00
(52) U.S. Cl. .................. 327/161; 327/284; 327/297; 327/269; 365/233.5
(58) Field of Search ................... 327/141, 161, 327/172, 176, 261, 263, 269, 270–276, 277, 284, 291, 293, 297; 365/189.04, 194, 233, 233.5

(56) References Cited

U.S. PATENT DOCUMENTS 5,699,003 A * 12/1997 Saeki ..................... 327/261
5,867,432 A * 2/1999 Toda ....................... 365/194

FOREIGN PATENT DOCUMENTS

JP 8-237091 9/1996

OTHER PUBLICATIONS

Saeki et al., A 2.5–ns Clock Access, 250–MHz, 256–Mb SDRAM with Synchronous Mirror Delay, vol. 31, No. 11, Nov. 1996, pp. 1656–1668.

Saeki et al., SP 23.4: A 2./5ns Clock Access 250MHz 256Mb SDRAM with a Synchronous Mirror Delay, (1996), p.374.

Saeki et al., A 10ps Jitter 2 Clock Cycle Lock Time CMOS Digital Clock Generator Based on an Interleaved synchronous Mirror Delay Scheme, (1997), p.109.

Oowaki et al., TD: Deep sub–micron and digital directions/paper tp 6.2, (1998), pp. 88 and 420.

* cited by examiner

Primary Examiner—Kenneth B. Wells
Assistant Examiner—Minh Nguyen
(74) Attorney, Agent, or Firm—Foley & Lardner

(57) ABSTRACT

In this clock control circuit, clock signal CLK from a receiver is supplied to a pulse generating circuit, and the pulse generating circuit generates forward pulse, which is clock signal CLK delayed as much time as A, and pulse s which is synchronized with dock signal CLK and has a pulse width of A. Consequently, as forward pulse becomes "H" while pulse s is "L" without generating pulse which width is narrower than A, the edge part of forward pulse is securely propagated by a forward-pulse delay line even if it is high frequency. Propagation of forward pulse stops at rising edge of pulse s, and rearward pulse is generated in a corresponding stage. This rearward pulse is propagated by a rearward-pulse delay line, and outputted from an output buffer. As each delay element of forward-pulse delay line and rearward-pulse delay line is configured with one-gate circuits, propagation time of forward pulse and rearward pulse can be adjusted to the time ($\tau-A$) with high accuracy to improve synchronization accuracy.

14 Claims, 36 Drawing Sheets

CLOCK CONTROL CIRCUIT

BACKGROUND OF THE INVENTION

1. Field of the Invention

The present invention relates to a clock control circuit suitable for a system which requires an internal clock having a constant delay relation to an external clock in an integrated circuit.

2. Related Art Statement

Recently, a computer system sometimes adopts a synchronous memory, such as a synchronous DRAM, in order to fulfill the requirements for faster processing. A memory of a synchronous type is also designed to use a clock, which is synchronized to the system clock of a computer system within the memory.

When a delay occurs between a clock used within a memory (hereinafter referred to as internal clock) and an external clock, such as a system clock, and particularly when the operating speed is high, malfunction is apt to occur in a circuit even when the delay time is small.

Accordingly, a clock control circuit is adopted to synchronize an internal clock signal to an external clock signal. FIG. 1 is a circuit diagram showing a related art on such a clock control circuit. A brief description will be given on the theory with reference to the waveform diagrams in FIGS. 1 and 2.

In FIG. 1, an external clock signal CK, shown in FIG. 2, is inputted to an input terminal 1. This external clock signal CK is taken in through a receiver 2. The receiver 2 outputs an amplified clock signal CLK after waveform shaping of the external clock signal. When a delay time at the receiver 2 is D1, the output clock signal CLK of the receiver 2 turns out to be as shown in FIG. 2. A period of the external clock signal CK is supposed to be $\tau$. Without a clock control circuit, as an output signal of the receiver 2 is used as an internal clock signal, the delay time D1 becomes a synchronization error when synchronization of an external clock signal CK is shortened. In contrast to this, a clock control circuit 9 is designed to generate signals delayed to an external clock signal by two periods of the external clock period by delaying the output clock signal CLK of the receiver 2 by the time $(2\tau-D1)$.

That is, a clock control circuit 9, as shown in FIG. 2, first generates pulse FCL which rises after the time A from the rising timing of the output clock signal CLK of the receiver 2. The time from the rising of this pulse FCL to the rising of the next clock signal CLK is, as shown in FIG. 2, the time $(\tau-A)$. The clock control circuit 9 finds the same time $(\tau-A)$ as the time $(\tau-A)$, and generates a rearward pulse RCL, shown in FIG. 2, after the time $2(\tau-A)$ from the rising of pulse FCL. The rearward pulse RCL is amplified by an output buffer 6 to be able to drive an internal circuit, and outputted as an internal clock signal CK'.

As shown in FIG. 2, the time from the rising of the clock signal CLK to the rising of the next pulse RCL is $\tau-(\tau-A)=A$. A delay time of the output buffer 6 is supposed to be D2. Consequently, as shown in FIG. 2, the clock signal CLK, which has been delayed by the receiver 2 by the time D1 to the external clock signal CK is outputted after being further delayed by the time A by a delay monitor 3, by the time $2(\tau-A)$ by forward-pulse and rearward-pulse delay lines 4 and 5, and by the time D2 by the output buffer 6.

Consequently, a delay of an internal clock signal to an external clock signal becomes $2\tau$, and the internal clock signal and the external clock signal are synchronized.

This circuit requires a pulse having an external clock signal whose pulse width is narrower than A. When a period of an external clock signal becomes small and A correspondingly becomes small, pulse must be generated to have narrower width, and operation in high frequency becomes difficult.

Hereinafter, configuration, operation and problem of circuits of the related art will be described in detail.

First, description will be given on function and configuration of each part. As a delay time given by the receiver 2 and the output buffer 6 can be found beforehand, it is possible to prepare the delay monitor 3 having a delay time A to be A=D1+D2, as shown in FIG. 2.

In FIG. 1, the delay monitor 3 is a device to obtain this delay time A. The delay monitor 3 is designed to generate forward pulse FCL, which is the clock signal CLK from the receiver 2 delayed by the delay time A, and to output it to a forward-pulse delay line 4. The delay time A is set to a value larger than the pulse width of the clock signal CLK. The forward-pulse delay line 4 is for obtaining a delay time $(\tau-A)$, and a rearward-pulse delay line 5 is also for obtaining a delay time $(\tau-A)$. As is described later it is designed so that rearward pulse RCL, the output of the rearward-pulse delay line 5, is one delayed by $D1+A+2(\tau-A)$ to the external clock signal and further delayed by the time D2 by the output buffer 6 to be outputted as an internal clock signal CK'.

That is, the external clock signal CK inputted through the input terminal 1 is outputted from the output buffer 6, being delayed by $D1+A+2(\tau-A)+D2$. When the delay time A of the delay monitor 3 is set to D1+D2, an internal clock signal CK', which is synchronized by being delayed by $2\tau$ to the external clock signal CK, is obtained from the output buffer 6.

The forward-pulse delay line 4 is composed of a plurality of cascaded forward-pulse delay circuits 4-1, 4-2, . . . Each of the forward-pulse delay circuits 4-1, 4-2, . . . is configured with an AND circuit of a NAND circuit and an inverter. To an input terminal of each of the forward-pulse delay circuits 4-2, 4-3, . . . , the output of the forward-pulse delay circuits 4-1, 4-2, . . . in the preceding stage is supplied respectively.

The rearward-pulse delay line 5 is composed of a plurality of cascaded rearward-pulse delay circuits 5-1, 5-2, . . . Each of the rearward-pulse delay circuits 5-1, 5-2, . . . is configured with an AND circuit of a NAND circuit and an inverter. To an input terminal of each of the rearward-pulse delay circuits 5-1, 5-2, . . . , the output of the rearward-pulse delay circuits 5-2, 5-3, . . . in the succeeding stage is supplied respectively. Each of the forward-pulse delay circuits 4-1, 4-2, . . . and each of the rearward-pulse delay circuits 5-1, 5-2, . . . are designed to operate with the same delay time respectively.

Output terminals of the forward-pulse delay circuits 4-1, 4-2, . . . are respectively connected to one input terminal of each of control circuits 7-1, 7-2, . . . , each of which forms a control circuit group 7. The control circuits 7-1, 7-2, . . . are configured with NAND circuits, and the clock signal CLK from the receiver 2 is supplied to the other input terminals of the control circuits 1-1, 7-2, . . .

The control circuits 7-1, 7-2, . . . are designed to supply two-input NAND output as control signals not only to the other input terminals of the forward-pulse delay circuits 4-3, 4-4, . . . , but also to the other input terminals of the rearward-pulse delay circuits 5-1, 5-2, . . . To the other input terminals of the forward-pulse delay circuits 4-1, 4-2, . . . in a first and second stages, electric potential at high level corresponding to logical value "1" (hereinafter referred to as "H") is applied. It is also designed so that, to the other input terminals of the rearward-pulse delay circuits in the last stage, signals of "H" are supplied. Output terminals of the rearward-pulse delay circuit 5-1 in the first stage are connected to the output buffer 6. The output buffer 6 is designed to delay the output of the rearward-pulse delay circuit 5-1 by the delay time D2 and to output it as the internal clock signal CK'.

A delay unit 8 is configured with a forward-pulse delay circuit in the first stage, a control circuit and a delay element for succeeding stage pulse.

Each of the forward-pulse delay circuits 4-3, 4-4, . . . is designed to propagate the output of the forward-pulse delay circuits 4-2, 4-3, . . . in the preceding stage to the next stage by having a control signal of "H" inputted respectively. Similarly, each of the rearward-pulse delay circuits 5-1, 5-2, . . . is designed to propagate the output of the rearward-pulse delay circuits 5-2, 5-3, . . . in the succeeding stage to the preceding stage by having a control signal of "H" inputted respectively.

Now, the operation of a related art configured in such a manner will be described in detail with reference to the circuit diagram in FIG. 1 and the operation waveform diagram in FIG. 2.

The external clock signal CK shown in FIG. 2 is inputted through the receiver 2. The output clock signal CLK of the receiver 2 is delayed by the time D1 to the external clock signal CK as shown in FIG. 2. This clock signal CLK is supplied to the delay monitor 3 to be further delayed by the time A, and supplied to the forward-pulse delay line 4 as forward pulse FCL shown in FIG. 2.

Before this forward pulse FCL is generated, the clock signal CLK is on a low level corresponding to a logical value "0" (hereinafter referred to as "L"), and output terminals of the control circuits 7-1, 7-2, . . . becomes "H". As the other input terminals of the forward-pulse delay circuits 4-1, 4-2, . . . are fixed at "H", all the other input terminals of the forward-pulse delay circuits 4-1, 4-2, . . . are at "H", and each of the forward-pulse delay circuits 4-1, 4-2, . . . sequentially propagates inputted forward pulse FCL. In addition, as one of the input terminals of the rearward-pulse delay circuits in the last stage is fixed at "H", in an initial state where no pulse has been inputted yet, all output terminals of the rearward-pulse delay circuits 5-1, 5-2, . . . are at "H".

Thus, forward pulse propagates by the forward-pulse delay line 4 when the clock signal CLK is at "L". When the clock signal CLK is at "H" the control circuits 7-1, 7-2, . . . output inverted signals of the output of the forward-pulse delay circuits 4-1, 4-2, . . . as control signals. Consequently, out of the forward-pulse delay circuits 4-1, 4-2, . . . , control signals in a stage where the "H" part of forward pulse FCL is transmitted become "L", and control signals in a stage where the "L" part is transmitted become "H".

By supplying this control signal "L" to a forward-pulse delay circuit where a forward pulse at "H" was inputted, the output of all the forward-pulse delay circuits 4-3, 4-4, . . . in and after the third stage is initialized at "L". Accordingly, a time for forward pulse to propagate by the forward-pulse delay line 4 is a time from the rising of the forward pulse FCL to the rising of the next clock signal CLK, that is, as shown in FIG. 2, the time (τ–A).

Actually, a little delay time exists during a time from the rising timing of the clock signal CLK until the control signal changes. Accordingly, by supplying control signals prepared by a control circuit 7-n in the n-th stage to a forward-pulse delay circuit in the (n+x)th stage, this delay time is offset and all the forward-pulse delay circuits can be initialized. FIG. 1 shows an example where x=2.

The number of stages of a forward-pulse delay circuit, which propagated an output corresponding to the rising edge of forward pulse FCL (P1 part in FIG. 2), corresponds to the time (τ–A). An example of a related art shown in FIG. 1 is designed so that a rearward pulse is generated by a rearward-pulse delay circuit at the rising timing of the clock signal CLK, made propagate by the rearward-pulse delay line 5 by the rising edge of rearward pulse by the time (τ–A), then supplied to the output buffer 6. Accordingly, an output corresponding to the rising edge of rearward pulse generated by a rearward-pulse delay circuit (part P2 in FIG. 2) is also generated at a rearward-pulse delay circuit in a number of stages corresponding to the time (τ–A).

That is, a control signal by the control circuit 7-n in the n-th stage is supplied to the delay element 5-n for rearward pulse in the n-th stage. Out of the rearward-pulse delay circuits 5-1, 5-2, . . . , the output of rearward-pulse delay circuits in a stage where the control signal became "L" is changed from "H" to "L". In other words, at rising timing of the clock signal CLK, the output of a rearward-pulse delay circuit corresponding to a forward-pulse delay circuit, which outputted a forward pulse at "H", becomes "L". That is, at rising timing of the clock signal CLK, the stage of a forward-pulse delay circuit to output "H" correspondingly to the rising edge of the forward pulse coincides with the stage of a rearward-pulse delay circuit to output "H" correspondingly to the rising edge of the rearward pulse.

After the forward-pulse delay line 4 is initialized to "L", by "H" of the clock signal CLK, control signals in all stages become "H" until forward pulse at "H" is inputted. With this, rearward pulse propagates from one rearward-pulse delay circuit to another until, after the time (τ–A) from generation of rearward pulse, is outputted from the rearward-pulse delay circuit 5-1, whose rising edge of the rearward pulse RCL is in the first stage (FIG. 2).

The output of the rearward-pulse delay circuit 5-1 is delayed by the output buffer 6 by the time D2, and outputted as the internal clock signal CK' (FIG. 2).

Delay time of the internal clock signal CK' to the external clock signal CK is, as shown in FIG. 2:

$$D1+A+2(\tau-A)+D2 \qquad (1)$$

As the delay time A of the delay monitor 3 is set to be A=D1+D2, the above expression (1) goes as follows:

$$D1+(D1+D2)+2(\tau-D1-D2)+D2=2\tau$$

Thus, delay time of the internal clock signal CK' to the external clock signal CK can be 2τ, synchronization is established between the external clock signal CK and the internal clock signal CK'.

Now, a description will be given on problems which arise from related arts. In the example of a related art in FIG. 1, operation becomes abnormal when the pulse width of the external clock signal CK is larger than the delay time A of the delay monitor 3. FIGS. 3 and 4 illustrate these problems.

Suppose that an external clock signal CK, whose pulse width is larger than A, is inputted as shown in FIG. 4. This external clock signal CK is delayed by the receiver 2 by the time D1, and supplied to the delay monitor 3. The delay monitor 3 delays the clock signal CLK from the receiver 2 by the time A, and outputs forward pulse FCL.

As the pulse width of the clock signal CLK is larger than A, as shown in FIG. 4, the clock signal CLK is always at "H"

at rising timing of forward pulse FCL. FIG. 3 shows logical levels of each part in this case.

That is, as the other input terminals of forward-pulse delay circuits 4-1, 4-2 in the first and the second stages are fixed at "H", they always propagate inputted signals. Accordingly, the forward pulse at "H" propagates up to the forward-pulse delay circuit 4-3 in the third stage unconditionally. That is, the output of the forward-pulse delay circuits 4-1, 4-2 in the first and the second stages is "H". As the clock signal CLK is also "H", a control signal from the control circuits 7-1, 7-2 in the first and the second stages becomes "L".

Consequently, the output of the forward-pulse delay circuits 4-3, 4-4, . . . in and after the third stage, which are controlled by the control circuits 7-1, 7-2, . . . , becomes "L". In other words, when the clock signal CLK is "H", the forward pulse does not propagate by the forward-pulse delay line 4.

In this case, propagation of forward pulse is started by the clock signal CLK's becoming "L". In this case, too, the rising of the next clock signal CLK stops propagation of forward pulse. Consequently, as shown in FIG. 4, at rising edge of forward pulse FCL, propagation is impossible for the time ($\tau$–A).

As the propagation time is the same for both the rising edge of rearward pulse and for the rising edge of forward pulse, the time from the rising edge of forward pulse to the output of the rising edge of rearward pulse is forced to be shorter than ($\tau$–A). As a result, as shown in FIG. 4, it becomes impossible to generate an internal clock signal CK' synchronized with an external clock signal CK'.

To cope with this problem, addition of a pulse generating circuit is considered in order to reduce pulse width of the clock signal CLK. FIGS. 5–7 are block diagrams to show such examples. In FIGS. 5–7, in order to simplify diagrams; signal lines to supply control signals from the control circuit 7 to the forward-pulse delay circuits 4-3, 4-4, . . . are not shown.

FIG. 5 shows an example where the output of a pulse generating circuit 11 is supplied to the delay monitor 3 and the control circuits 7-1, 7-2, . . . , and FIG. 6 shows an example where the output of the pulse generating circuit 11 is supplied to the control circuits 7-1, 7-2, . . . FIG. 7 shows an example where the output of the pulse generating circuit 11 is supplied to the delay monitor 3. This circuit operates when the delay time A at the delay monitor 3 is larger than the pulse width of the output signal CLK of the receiver 2.

The pulse generating circuit 11 is designed to generate a clock signal from the inputted clock signal CLK with a pulse width narrower than A. With this, the control circuits 7-1, 7-2, . . . are controlled with pulse having a width narrower than A. Thus, when input is "H" at the control circuits 7-1, 7-2, . . . , forward pulse is prevented from being inputted to the forward-pulse delay line 4, enabling the rising edge of forward pulse to be propagated for the time ($\tau$–A).

However, recent computer systems have become fast operative and external clock frequencies are very high. That is, as the period $\tau$ of an external clock signal is extremely short, the delay time A is set to a very small value by the delay monitor 3. Accordingly, it is highly difficult to generate pulse signals whose width is narrower than the delay time A of the delay monitor 3 even when pulse with wide width is inputted as an external clock signal.

Meanwhile, the circuit in FIG. 1 generates an internal clock signal CK' synchronized with an external clock signal CK by propagating forward pulse for the time ($\tau$–A) by the forward-pulse delay line 4. However, the time to propagate by the forward-pulse delay line 4 is determined by a delay time of the forward-pulse delay circuits 4-1, 4-2, . . . In the circuit in FIG. 1, as the forward-pulse delay circuits 4-1, 4-2, . . . and the rearward-pulse delay circuits 5-1, 5-2, . . . are configured with two gates of AND circuits, the delay time is relatively large, and error in propagation time of forward pulse is comparatively large. Therefore, its synchronization accuracy is low.

Thus, related art of the clock control circuit has problems: of that it needs to use pulse having very narrow width for control in order to response to high-frequency operation, limiting operating frequency band in high frequency. In addition, the delay time of delay elements for forward and rearward pulse is comparatively long and synchronization accuracy is low.

OBJECTS AND SUMMARY OF THE INVENTION

An object of the present invention is to provide a clock control circuit which enlarges an operating frequency band in high frequency.

Another object of the present invention is to provide a clock control circuit which improves synchronization accuracy.

A clock control circuit according to the present invention comprises a forward-pulse delay line which is configured by cascading delay elements in a predetermined number of stages, a rearward-pulse delay line which is configured by cascading delay elements in a predetermined number of stages, an input device for taking in a first clock signal from the exterior and outputting a second clock signal which is delayed as much as a first delay time from said first clock signal, a forward-pulse generating device for generating a forward pulse by delaying said second clock signal as much as a second delay time, a pulse generating device for generating a control pulse, which is synchronized with said second clock signal, giving permission for said forward pulse inputted to said forward-pulse delay line to be propagated by showing a high level or a low level, and setting the level of said control pulse to said level to permit propagation at the timing where the edge of said forward pulse is inputted to said forward-pulse delay line, a control device for giving said forward pulse to said forward-pulse delay line, permitting propagation of said forward pulse when said control pulse is on a high level or a low level, and delaying it up to timing, which corresponds to the edge of said control pulse, and at the same time, generating rearward pulse in a stage of said rearward-pulse delay line, which corresponds to the stage where said forward pulse was propagated at timing corresponding to the edge of said control pulse, and propagating the generated rearward pulse by said rearward-pulse delay line and outputting it, and an output device for outputting a third clock signal, which is synchronized with said first clock signal by delaying rearward pulse outputted from said rearward-pulse delay line as much as a third delay time.

A clock control circuit according to the present invention also comprises a receiver for taking in a first clock signal from the exterior and outputting a second clock signal which is delayed as much as a first delay time from said first clock signal, a forward-pulse generating circuit for generating forward pulse by delaying said second clock signal as much as a second delay time, a pulse generating circuit for generating a control pulse which is synchronized with said second clock signal and has a pulse duration with the same time width as said second delay time, a forward-pulse delay line which is configured by cascading delay elements in a predetermined number of stages, a rearward-pulse delay line which is configured by cascading delay elements in a predetermined number of stages, a control apparatus for giving said forward pulse to said forward-pulse delay line, permitting said forward pulse to be propagated during the time other than the pulse duration of said control pulse to delay it up to timing which corresponds to edge of said control pulse, and at the same time, generating rearward pulse in a stage of said rearward-pulse delay line which corresponds to the stage where said forward pulse was propagated at the timing corresponding to edge of said control pulse, propagating the generated rearward pulse by said rearward-pulse delay line and outputting rearward pulse, and an output buffer for delaying rearward pulse outputted from said rearward-pulse delay line as much as a third delay time, and outputting a third clock signal which is synchronized with said first clock signal.

A clock control circuit according to the present invention also comprises a forward-pulse delay line wherein delay elements, which are configured with one-gate circuits, are cascaded in a predetermined number of stages, a rearward-pulse delay line wherein delay elements, which are configured with one-gate circuits, are cascaded in a predetermined number of stages, an input means for taking in a first dock signal from the exterior and outputting a second clock signal which is delayed as much as a first delay time from said first clock signal, a control means which gives forward pulse generated by delaying said second clock signal as much as a second delay time to said forward-pulse delay line in order to propagate it and to delay it up to timing corresponding to edge of said second clock signal, and at the same time, generates rearward pulse in a stage of said rearward-pulse delay line corresponding to the stage where said forward pulse was propagated at timing corresponding to edge of said second clock signal, propagates the generated rearward pulse by said rearward-pulse delay line and outputs rearward pulse, and an output means which delays rearward pulse outputted from said rearward-pulse delay line as much as a third delay time, and outputs a third clock signal synchronized with said first clock signal.

A clock control circuit according to the present invention also comprises a forward-pulse delay line whose delay elements are cascaded in a predetermined number of stages, a rearward-pulse delay line whose delay elements are cascaded in a predetermined number of stages, a first input means for taking in a first clock signal from the exterior and outputting a second clock signal delayed as much as a first delay time from this first clock signal, a second input means for outputting a fourth clock signal which is delayed as much time as a second delay time to a third clock signal from the exterior, a control means for giving pulse based on one of said second and fourth clock signals to said forward-pulse delay line, propagates it, delays it up to timing corresponding to edge of the other clock signal, and at the same time, generating rearward pulse in a stage of said rearward-pulse delay line corresponding to the stage where said pulse based on one of the clock signals was propagated at timing corresponding to edge of said the other clock signal, propagating the generated rearward pulse by said rearward-pulse delay line, and outputting rearward pulse, and an output means for delaying rearward pulse outputted from said rearward-pulse delay line as much as a third delay time, and outputting an output clock signal wherein at least either phase or frequency is different from that of said third clock signal as much as a relation based on a mutual relation between said first and third clock signals.

A clock control circuit according to the present invention also comprises a forward-pulse delay line wherein delay elements are cascaded in a predetermined number of stages, a rearward-pulse delay line wherein delay elements are cascaded in a predetermined number of stages, a first input means for taking in a first clock signal from the exterior and outputting a second clock signal which is delayed as much as a first delay time from this first clock signal, a second input means for taking in a third clock signal from the exterior, a control means which gives pulse based on said second clock signal to said forward-pulse delay line, propagates and delays it up to timing corresponding to edge of said third clock signal, and at the same time, generates rearward pulse in a stage of said rearward-pulse delay line corresponding to the stage where pulse based on said second clock signal was propagated at timing corresponding to edge of said third clock signal propagates the generated rearward pulse by said rearward-pulse delay line, and outputs rearward pulse, and an output means which delays rearward pulse outputted from said forward-pulse delay line as much as a third delay time, and outputs an output clock signal wherein at least either phase or frequency is different from that of said third clock signal as much as a relation based on a mutual relation between said first and third clock signals.

Other features and advantages of the present invention will become apparent from the following description.

DETAILED DESCRIPTION OF THE PREFERRED EMBODIMENTS

Figure 1:
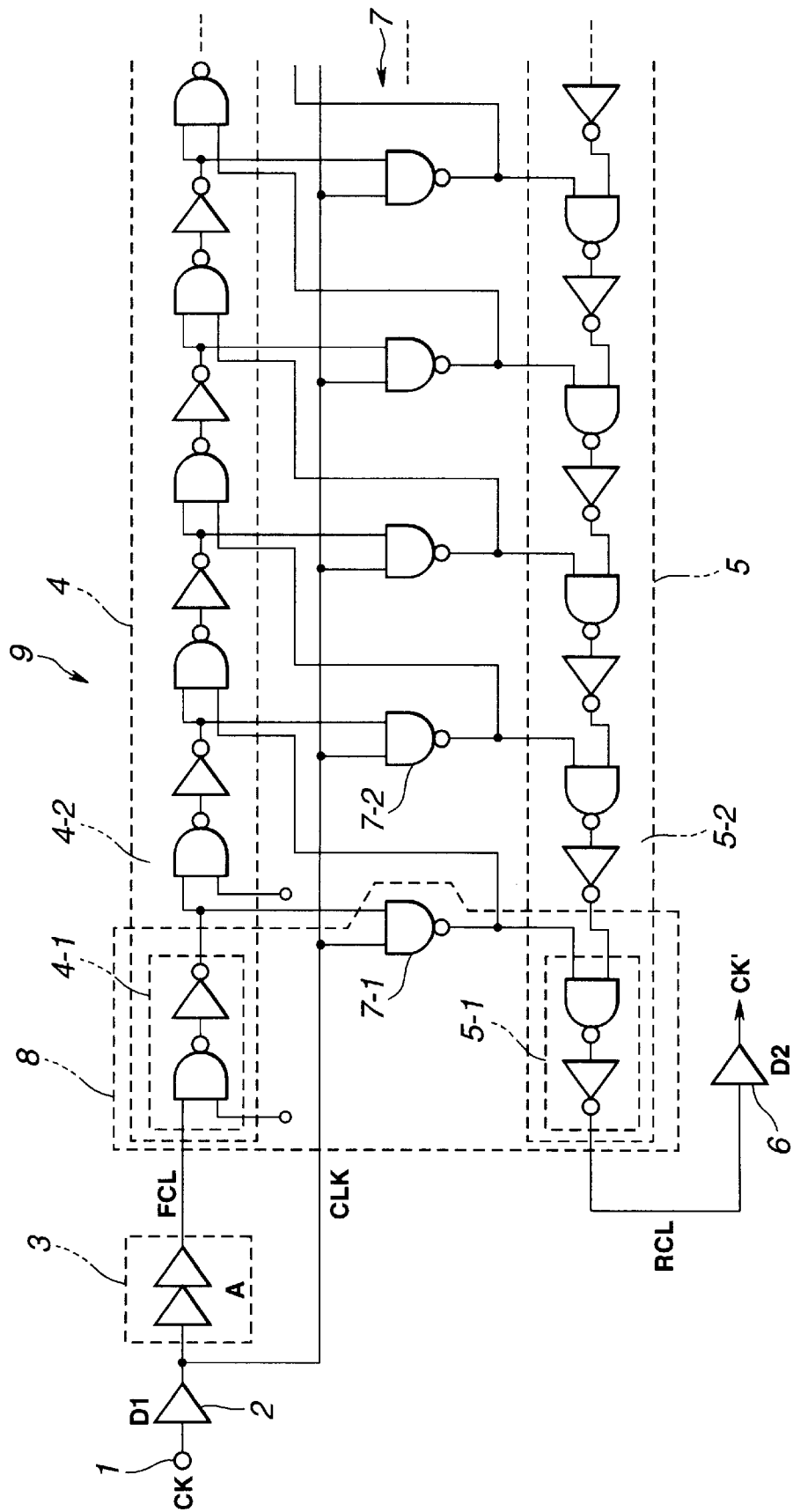
FIG. 1 is a circuit diagram showing a related art on a clock control circuit.
Figure 8:
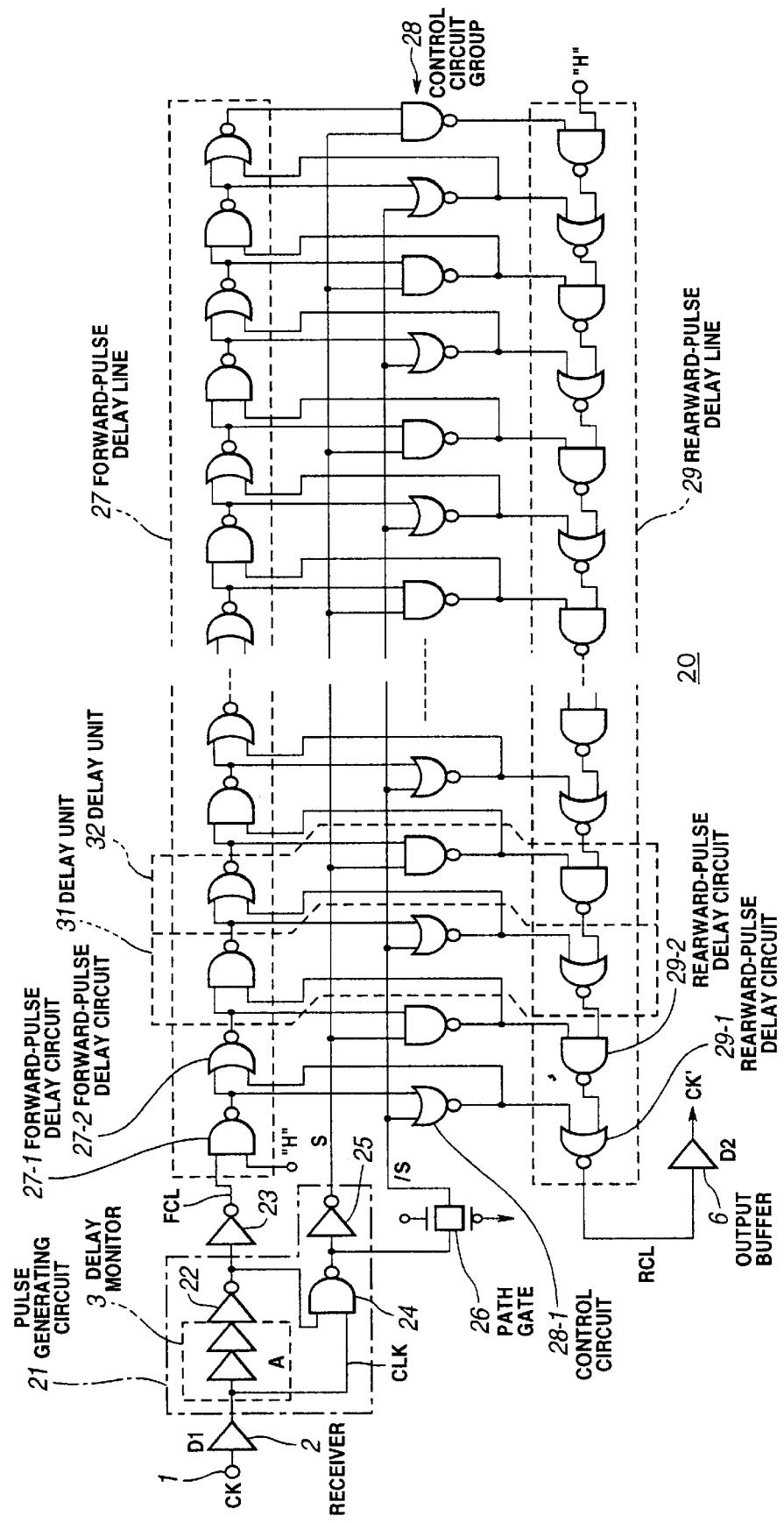
FIG. 8 is a circuit diagram showing a clock control circuit which is in accordance with an embodiment of the present invention.

The present invention will now be described in detail hereinafter with reference to the accompanying drawings. FIG. 8 is a circuit diagram showing an embodiment of a clock control circuit in accordance with the present invention. In FIG. 8, the same elements as those in FIG. 1 are given the same reference numerals.

In this embodiment, pulse to be supplied to control circuits is generated using a pulse generating circuit 21 which generates signals having the same pulse width as the delay time A of the delay monitor 3. With this, even when a pulse width of the external clock signal CK is larger than the delay time A of the delay monitor 3, synchronization of the external clock signal with the internal clock signal becomes establishable. Consequently, it is not necessary to make input signals to delay lines or pulse to be supplied to control circuits narrower than A, giving a circuit suitable for operation in high-frequency band. In addition, in this embodiment, improvement in synchronization accuracy is aimed at by enabling the use of delay elements, which have a shorter delay time, as delay elements to form delay lines.

Hereinafter, composition of this embodiment and function of circuits which configure this embodiment will be described in detail, followed by a description of operation of this embodiment.

First, a description will be given on composition of this embodiment and function of circuits which configure this embodiment.

In FIG. 8, a clock control circuit 20 is composed of a receiver 2, a pulse generating circuit 21, an inverter 23, a path gate 26, a plurality of delay units 31, 32 and an output buffer 6.

The receiver 2 gives waveform shaping to the external clock signal CK inputted through the input terminal 1, and outputs an amplified clock signal CLK. The delay time by the receiver 2 is D1. The clock signal CLK is designed to be supplied to the pulse generating circuit 21. The pulse generating circuit 21 is composed of a delay monitor 3, an inverter 22, a NAND circuit 24, and an inverter 25.

The delay monitor 3 delays the inputted clock signal CLK as much time as A and outputs it to the inverter 22. The combination of the delay monitor 3 and the inverter 22 constitute a forward pulse generating device. The inverter 22 inverts the clock signal CLK and gives it to one side of input terminal of the inverter 23 and the NAND circuit 24. The inverter 23 is designed to supply forward pulse FCL to a forward-pulse delay line 27 by re-inverting the output of the inverter 22.

To the other input terminal of the NAND circuit 24, the clock signal CLK from the receiver 2 has also been given, and the NAND circuit 24 gives it two-input NAND operation, and outputs to the inverter 25 and the path gate 26. The inverter 25 inverts and outputs the output of the NAND circuit 24, and the path gate 26 outputs a logical value similar to that of the output of the NAND circuit 24. As the path gate 26 is an added circuit to adjust delays, when a delay time is equal to the delay time of the inverter 25, other circuits may be used.

The output of the delay monitor 3 is pulse which rises being delayed as much as A from the rising of the clock signal CLK. When a clock signal CLK, whose pulse width is wider than A, is inputted to the pulse generating circuit 21, the inverter 22 outputs pulse which becomes "H" for the time A from the rising of the clock signal CLK. Accordingly, the output of the NAND circuit 24 becomes pulse which becomes "L" for the time A from the rising of the clock signal CLK, and the output of the inverter 25 becomes pulse s which becomes "H" for the time A from the rising of the clock signal CLK. The path gate 26 outputs an inverted signal /s of pulse s.

The pulse generating circuit 21, once the delay time A of the delay monitor 3 is determined, may be another circuit as far as it can generate signals which have a pulse width A and rise synchronously with input signals.

In this embodiment, too, it is designed so that the forward pulse is delayed by the forward-pulse delay line 27 as much time as (τ–A), and rearward pulse, which was generated at the time after this time (τ–A), is propagated by a rearward-pulse delay line 29 as much time as (τ–A), and supplied to the output buffer 6.

The forward-pulse delay line 27, the rearward-pulse delay line 29, and a control circuit group 28 are formed by cascading the delay units 31, 32 alternately. The delay unit 31 is composed of one NAND circuit and two NOR circuits, and the delay unit 32 is composed of one NOR circuit and two NAND circuits.

One NAND circuit of the delay unit 31 forms one stage of forward-pulse delay circuit, one NOR circuit forms one stage of control circuit, and one NOR circuit forms one stage of rearward-pulse delay circuit. Similarly, one NOR circuit of the delay unit 32 forms one stage of forward-pulse delay circuit, one NAND circuit forms one stage of control circuit, and one NAND circuit forms one stage of rearward-pulse delay Circuit.

Thus, the forward-pulse delay line 27 is formed by cascading NAND circuits and NOR circuits alternately, and the rearward-pulse delay line 29 is formed by cascading NOR circuits and NAND circuits alternately. Each of the control circuits in the control circuit group 28, 28-1, 28-2, . . . is formed using a NOR circuit and a NAND circuit alternately.

Although, in FIG. 8, the delay unit 32 is connected after the delay unit 31, the order may be contrary. Similarly, although the delay unit 31 is used in the first stage and the delay unit 32 is used in the last stage, any delay unit may be used in the first and the last stages.

Forward pulse FCL from the inverter 23 is supplied to one input terminal of the forward-pulse delay circuit 27-1 in the first stage of the forward-pulse delay line 27. Pulse s from the inverter 25 is supplied to the other input terminals of the control circuits 28-2, 28-4, . . . , which are formed with NAND circuits. Pulse /s from the path gate 26 is supplied to the other input terminals of the control circuits 28-1, 28-3, . . . , which are formed with NOR circuits.

The output terminals of the forward-pulse delay circuit 27-n in the n-th stage are connected with one side of input terminal of the forward-pulse delay circuit 27-(n+1) in the (n+1)th stage and with one side of the input terminal of the control circuit 28-n. Output terminals of the control circuit 28-n in the n-th stage are connected with the other input terminal of the rearward-pulse delay circuit 29-n in the n-th stage and with the other input terminal of the forward-pulse delay circuits 27-(n+1) in the (n+1)th stage. The other input terminal of the forward-pulse delay circuit 27-1 in the first stage is designed to be supplied with electric potential "H".

In this embodiment, although it is designed that, by pulse s becoming "H", propagation of forward pulse is stopped, and at the same time, the output of forward-pulse delay circuits is initialized, considering the delay time between the time when pulse s became "H" and the time when a control signal corresponding to this "H" is outputted, a control signal from the control circuit 28-n in the n-th stage is designed to be supplied to the forward-pulse delay circuit 27-(n+x) in the (n+x)th stage (x is an integer). FIG. 8 shows an example where x is 1.

One side of the input terminals of the rearward-pulse delay circuits 29-1, 29-2, . . . are connected with output terminals of the rearward-pulse delay circuits 29-2, 29-3, . . . in the succeeding stage. One side of input terminal of the rearward-pulse delay circuit in the last stage is designed to be supplied with electric potential of "H". Output terminals of the rearward-pulse delay circuit 29-1 in the first stage are connected with the output buffer 6. The output buffer 6 is designed to delay rearward pulse as much time as D2 and to output it as the internal clock signal CK'.

Although, in FIG. 8, rearward-pulse delay circuits in the last stage by NAND circuits are used, rearward-pulse delay circuits formed with NOR circuits may be used. In this case, one side of the input terminals of rearward-pulse delay circuits in the last stage are designed to be given with electric potential of "L".

Figure 9:
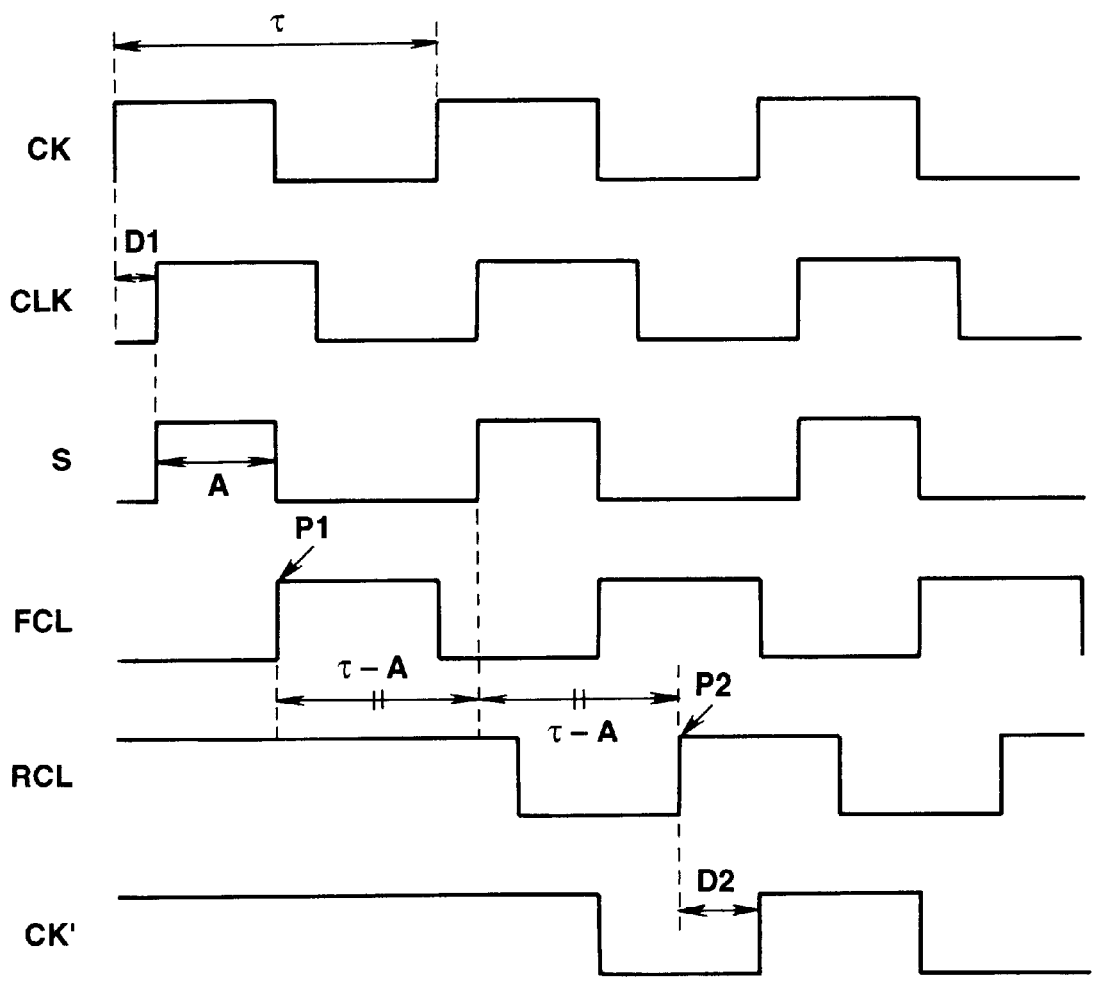
FIG. 9 is a waveform diagram illustrating the operation of the embodiment in FIG. 8.

Next, the operation of an embodiment configured in such a manner will be described with reference to the waveform diagram in FIG. 9. FIG. 9 shows the external clock signal CK, the clock signal CLK from the receiver 2, pulse s from the inverter 25, forward pulse FCL from the inverter 23, rearward pulse RCL, which is the output of the rearward-pulse delay line 29, and the internal clock signal CK' from the output buffer 6.

As described above, the delay time of the receiver 2, the delay monitor 3 and the output buffer 6 is D1, A and D2, respectively. To the input terminal 1, as shown by CK in FIG. 9, the external clock signal CK having a period of $\tau$ and a pulse width larger than A is inputted. This external clock signal CK is taken in by the receiver 2, and as shown by CLK in FIG. 9, is supplied to the pulse generating circuit 21 as the clock signal CLK after the delay time of D1.

Pulse s from the pulse generating circuit 21 is, as shown by (s) in FIG. 9, pulse which rises synchronously with the rising of the clock signal CLK and has a pulse width of A. Pulse /s from the path gate 26 is an inverted signal of pulse s. These pulse /s and pulse s are supplied to the control circuits 28-1, 28-2, . . . to control these control circuits.

The inverter 23 inverts and outputs the output of the inverter 22. That is, the inverter 23 supplies forward pulse FCL, which is the clock signal CLK delayed as much time as A, to one side of the input terminals of the delay element 27-1 in the first stage of the forward-pulse delay line 27.

In the process of propagation through the inverter 22 and the inverter 23, a delay equal to two stages of delay elements arises. This delay can be subtracted by adjusting connection of the control circuit 28-n with the forward-pulse delay circuit 27-(n+x).

Figure 2:
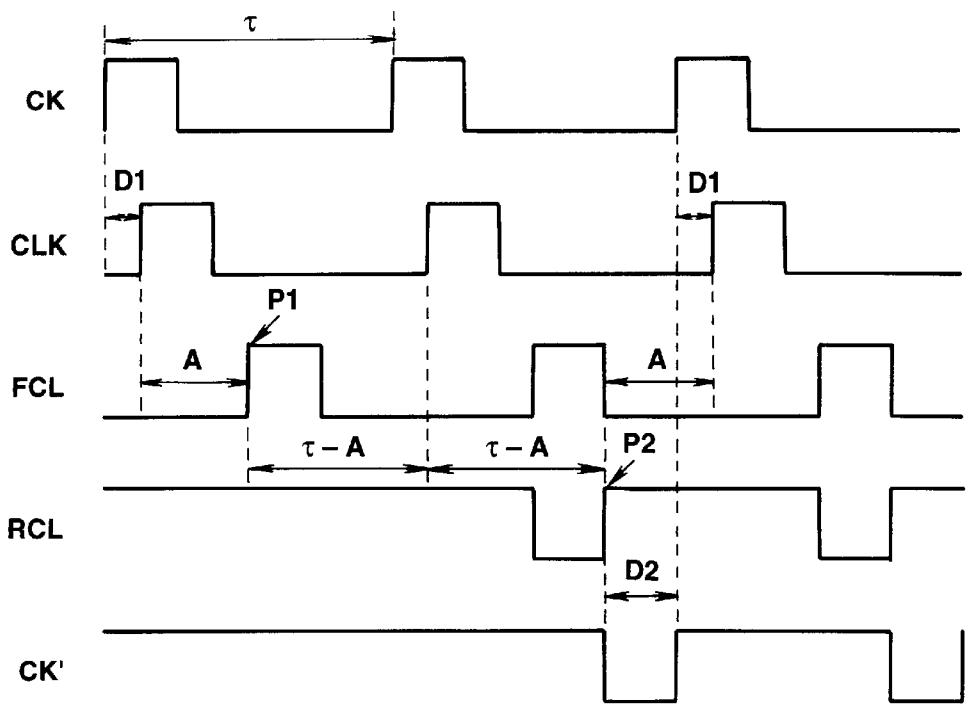
FIG. 2 is a waveform diagram illustrating operation of a related art.
Figure 4:
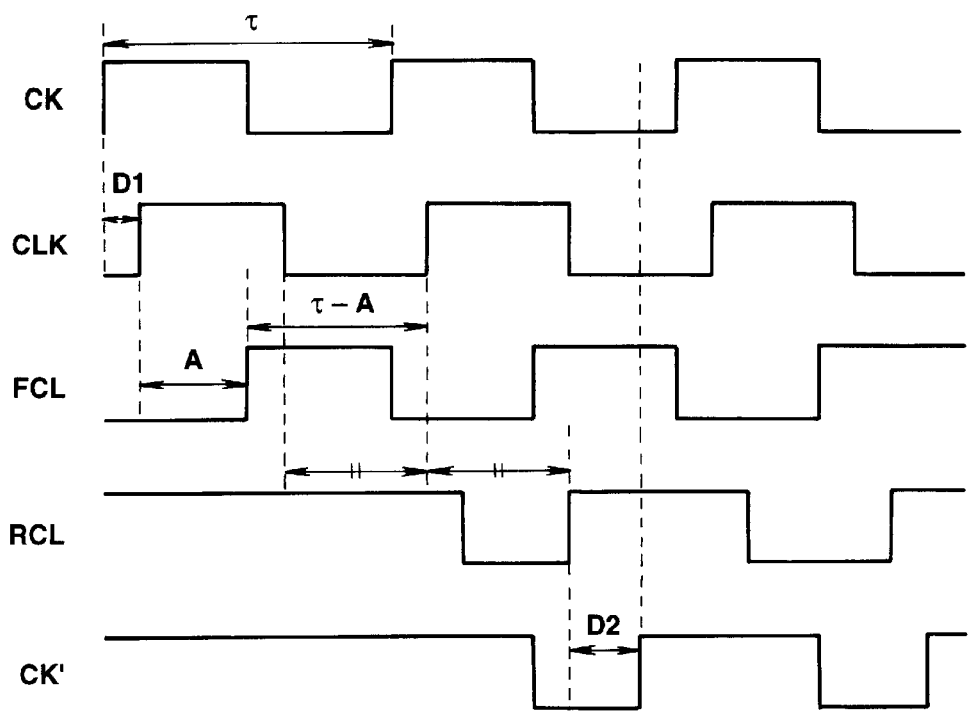
FIG. 4 is a waveform diagram illustrating a problem in a related art.
Figure 3:
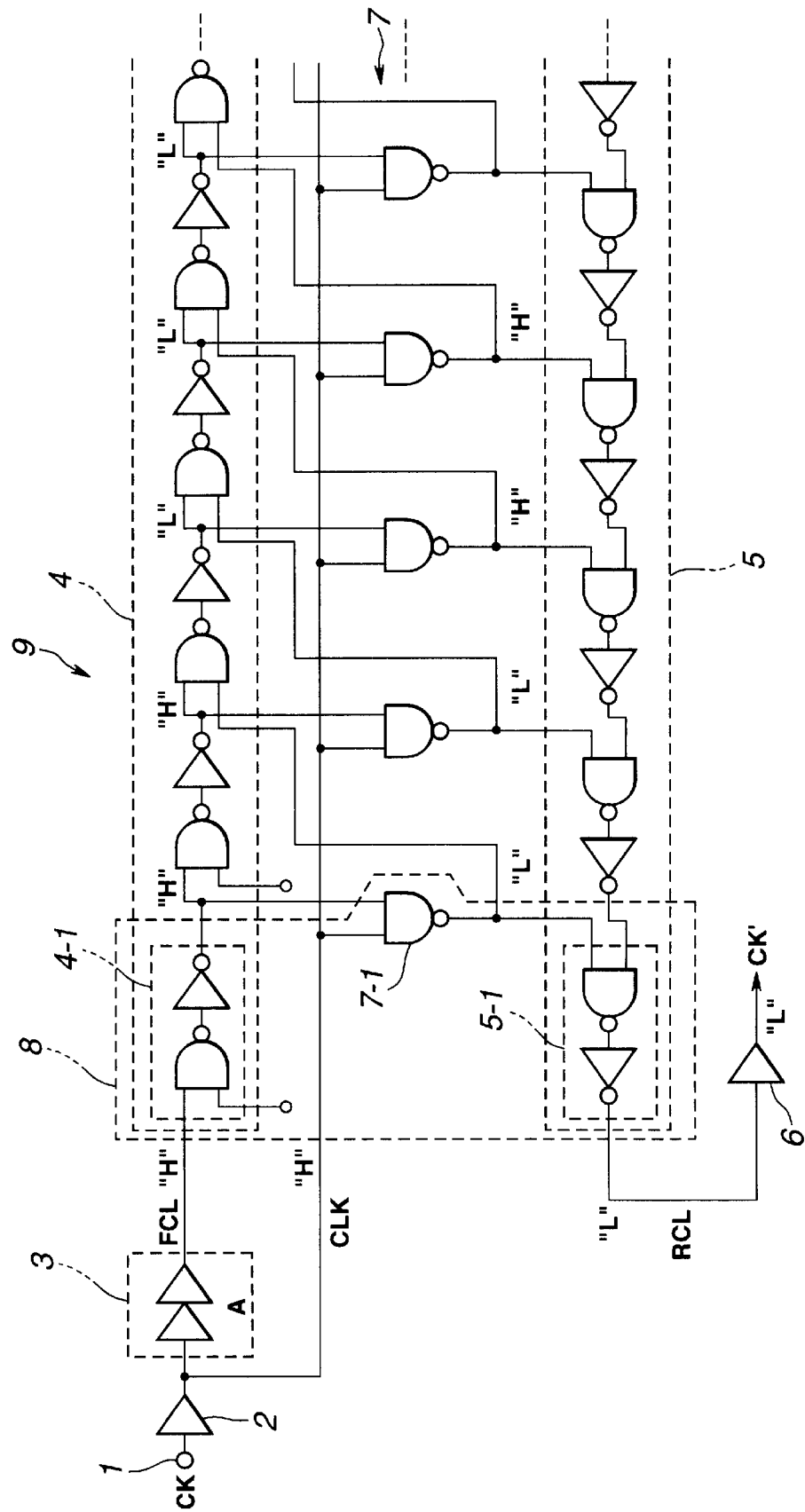
FIG. 3 is a circuit diagram illustrating a problem in a related art.
Figure 5:
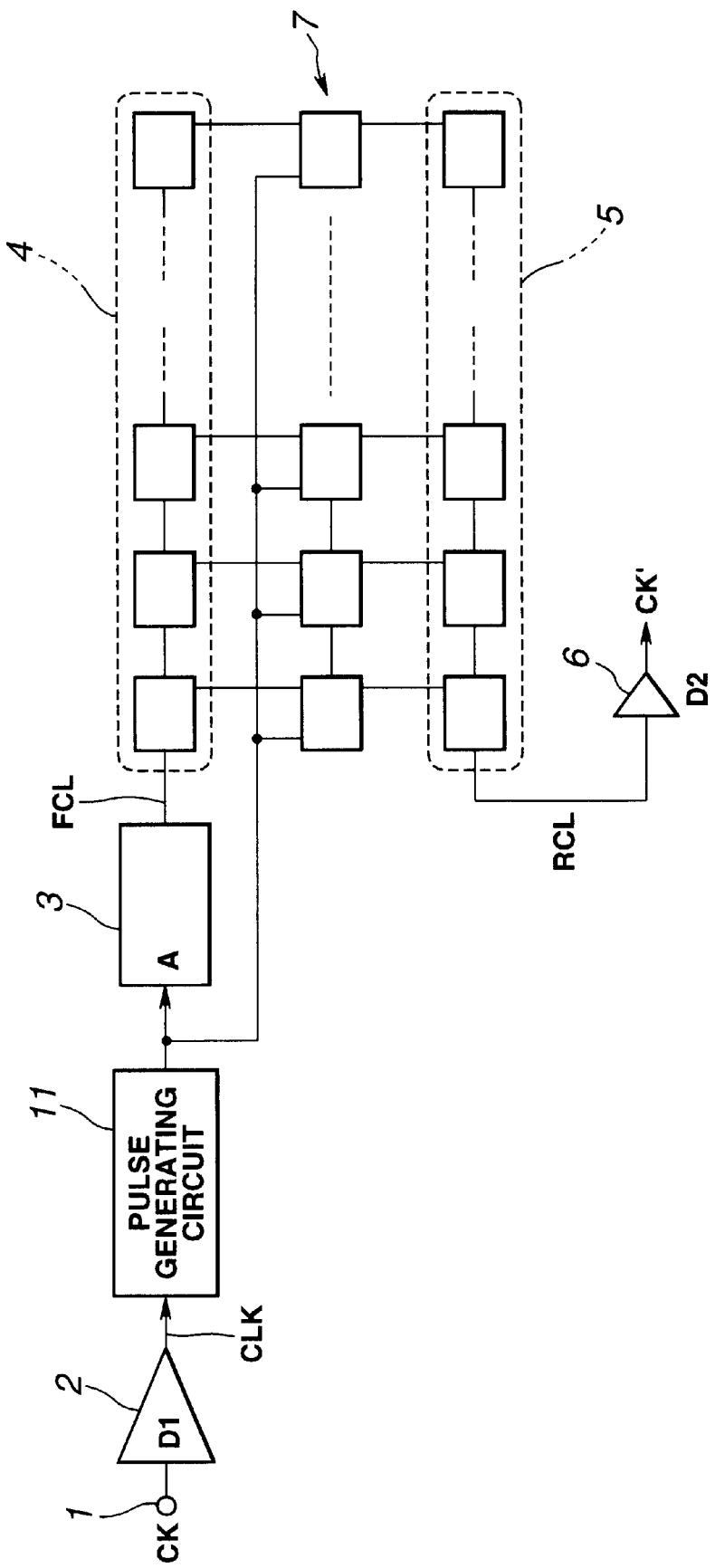
FIG. 5 is a block diagram illustrating a problem in a related art.
Figure 6:
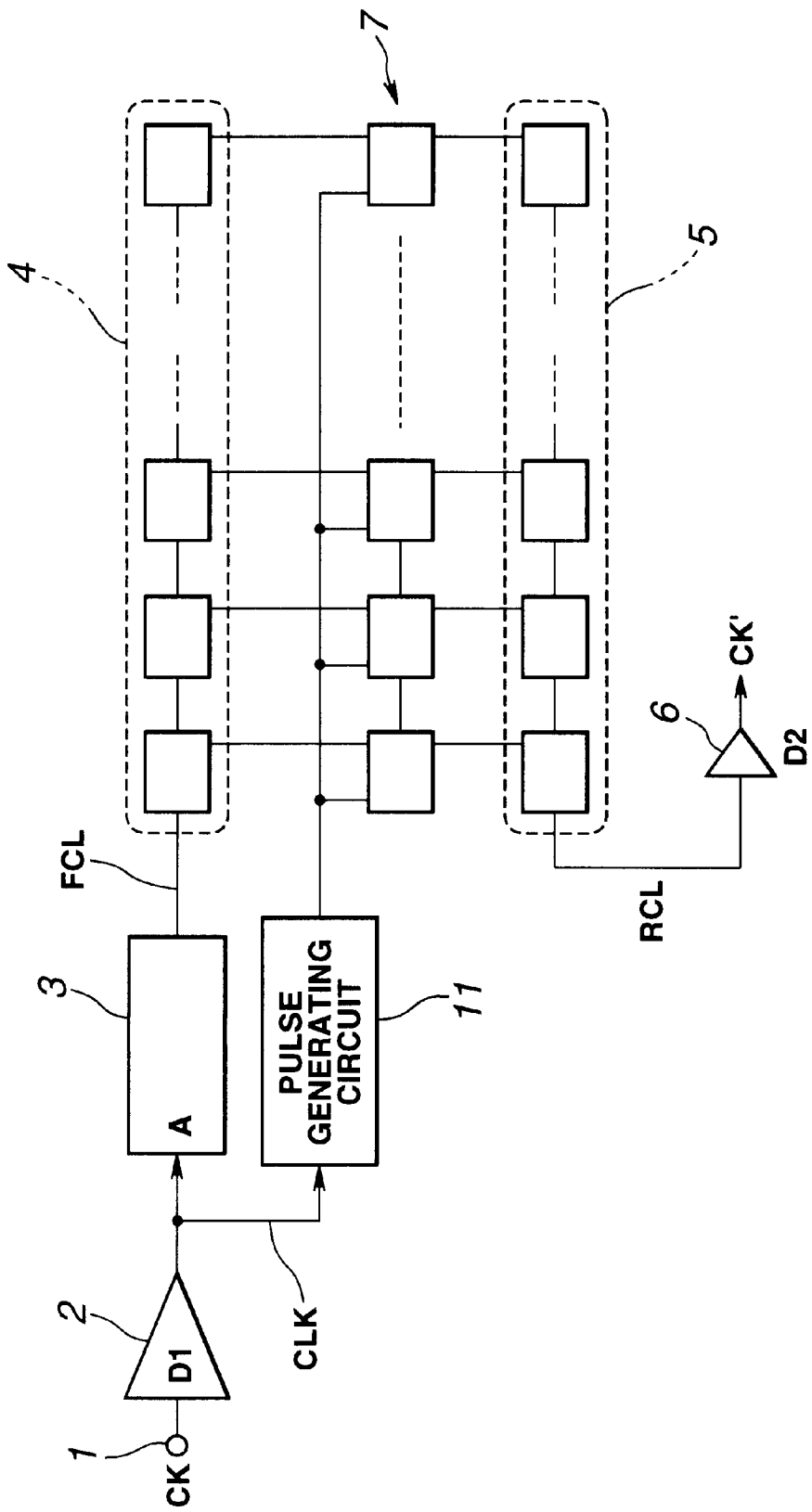
FIG. 6 is a block diagram illustrating a problem in a related art.
Figure 7:
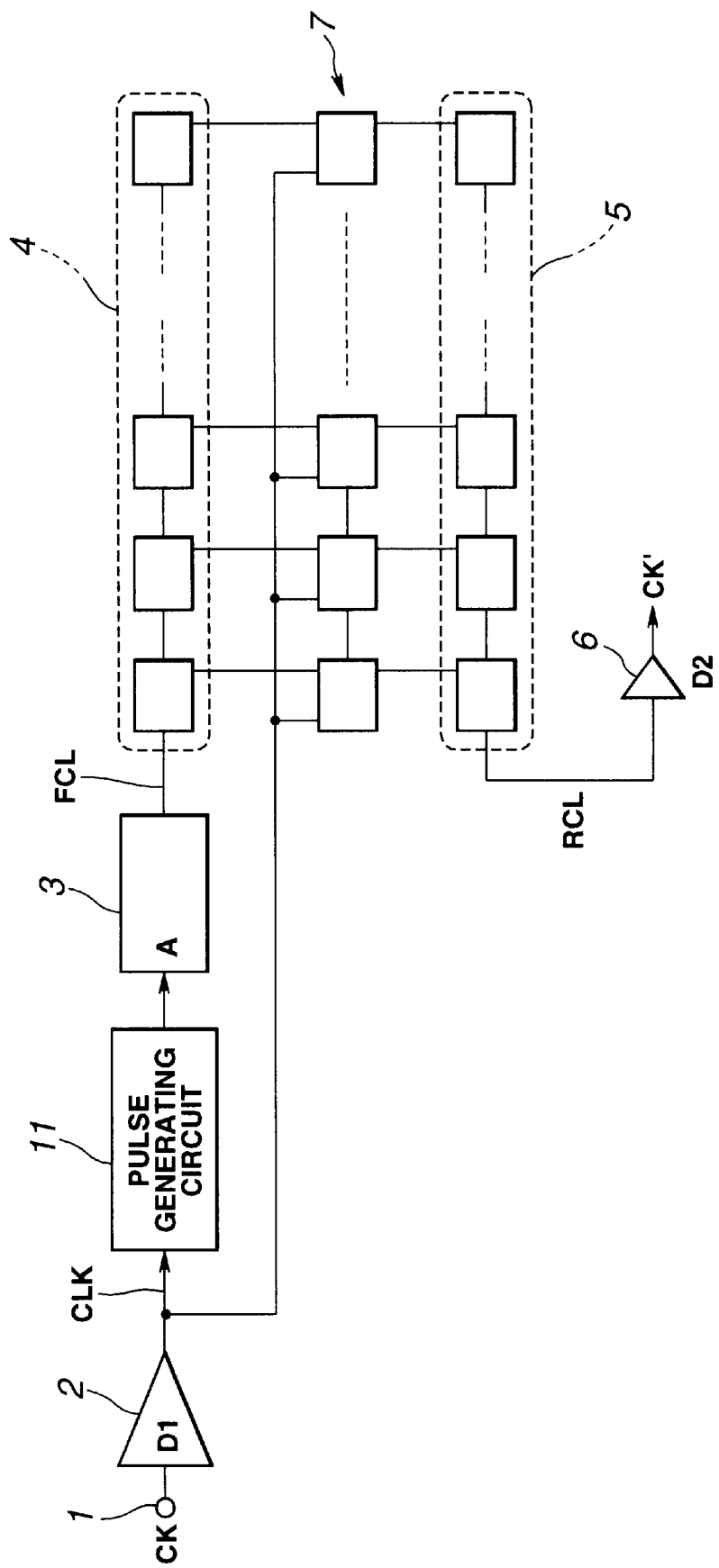
FIG. 7 is a block diagram illustrating a problem in a related art.

Thus, in this embodiment, forward pulse FCL, which has been delayed as much time as A to the clock signal CLK, is supplied to the forward-pulse delay line 27, and pulse, which comprises synchronously with the rising of the clock signal CLK and have the pulse width of A, is supplied to the control circuit group 28. Forward pulse and pulses s, /s, which are supplied to the forward-pulse delay line 27 and the control circuit group 28, have a similar relation to that of the forward pulse and the clock signal CLK in FIG. 2. Accordingly, when the forward-pulse delay line 27, the control circuit group 28 and the rearward-pulse delay line 29 have the same functions as those of forward-pulse delay lines, control circuit groups and rearward-pulse delay lines in the related art, it never occurs that both control signal and forward pulse become "H" simultaneously, as a result, it is found that, even when the pulse width of an external clock signal CK is larger than A, an internal clock signal CK', which is delayed to the external clock signal CK as much as 2 $\tau$, is securely generated.

Forward pulse inputted to the forward-pulse delay line 27 is propagated by the delay line for the time ($\tau$–A), that is, until pulse s becomes "H" next. When pulse s becomes "H", rearward pulse is generated, propagated by a delay line as much as ($\tau$–A), and outputted. Consequently, as shown by RCL in FIG. 9, at the time after ($\tau$–A) from generation of rearward pulse, output corresponding to the rising edge of rearward pulse is outputted from the rearward-pulse delay circuit 29-1 in the first stage.

Rearward pulse RCL from the rearward-pulse delay circuit 29-1 is delayed as much as D2 by the output buffer 6, and from the output buffer 6, an internal clock signal CK', shown by CK' in FIG. 9, is outputted.

That is, delay time of the internal clock signal CK' to the external clock signal CK is:

D1+A+2(τ−A)+D2

Accordingly, by designing the delay time A of the delay monitor 3 of the pulse generating circuit 21 to be (D1+D2), delay time of the internal clock signal CK' to the external clock signal CK is made 2 τ. As a result, synchronization can be established between the external clock signal CK and the internal clock signal CK'.

Thus, in this embodiment, as the pulse generating circuit 21 generates pulse s which is synchronized with the rising of the clock signal CLK and has a pulse width of the same amount of time A as the delay time A of the delay monitor 3, and these pulse s and pulse /s control circuits, synchronization between the external clock signal and the internal clock signal can be established securely even when an external clock signal having a pulse width larger than A is inputted.

In this embodiment, it is unnecessary to have a pulse generating circuit to generate, from an external clock signal CK, pulse having a pulse width narrower than the time A. With such simple configuration, pulse, which rises at rising of the clock signal CLK and has a pulse width of A, is generated from the output of the delay monitor 3. Accordingly, regardless of operating frequency band, as there is no necessity for considering pulse width of the external clock signal CK, it is most suitable for operation in high-frequency band.

Now, operation of the forward-pulse delay line 27, which is art configured using delay units 31, 32, the rearward-pulse delay line 29 and the control circuit 28 mill be described in detail.

Pulse s is supplied to the control circuits 28-2, 28-4, . . . , which are formed with NAND circuits, and pulse /s is supplied to the control circuits 28-1, 28-3, . . . , which are formed with NOR circuits. Accordingly, when pulse s is on "H" and pulse /s is on "L", all the control circuits 28-1,28-2, . . . , to which these pulses are inputted respectively, function as inverters. When pulse s is on "L" and pulse /s is on "H", the control circuits 28-2, 28-4, . . . always output "H", and the control circuits 28-1, 28-3, . . . always output "L".

The table below shows conditions of each circuit given by such pulse s and pulse /s

TABLE 1

|  |  | Pulse s is on "H" | Pulse s is on "L" |
|---|---|---|---|
| Control circuit | Output of NOR circuit | Inverter | "L" |
|  | Output of NAND circuit | Inverter | "H" |
| Forward-pulse delay line | Output of NOR circuit | "L" | Inverter |
|  | Output of NAND circuit | "H" | Inverter |
| Rearward-pulse delay line | Output of NOR circuit | Inverted output of the output of forward-pulse delay circuits or inverter | Inverter |
|  | Output of NAND circuit |  | Inverter |

When pulse s is on "L" and pulse /s is on "H", a control signal of "L" is always supplied to forward-pulse delay circuits 27-2, 27-4, . . . in even stages, where output terminals of the control circuits 28-1, 28-3, . . . in odd stages, which are formed with NOR circuits, are connected. As the forward-pulse delay circuits 27-2, 27-4, . . . in even stages are formed with NOR circuits, in this case, these delay elements 27-2, 27-4, . . . function as inverters.

Similarly, when pulse s is on "L" and pulse /s is on "H", a control signal on "H" is always supplied to the forward-pulse delay circuits 27-3, 27-5, . . . in odd stages, where output terminals of the control circuits 28-2, 28-4, . . . in even stages, which are formed with NAND circuits, are connected. As the forward-pulse delay circuits 27-3, 27-5, . . . in odd stages are formed with NAND circuits, in this case, too, these delay elements 27-3, 27-5, . . . function as inverters.

Accordingly, when pulse s is on "L" and pulse /s is on "H", as shown in the Table 1, all the forward-pulse delay circuits 27-2, 27-3, . . . function as inverters to propagate forward pulse from the preceding stage inputted to one side of input terminals.

Contrary to this, when pulse s is on "H" and pulse /s is on "L", as described above, the control circuits 28-1, 28-2, . . . function as inverters, and gives inverted signals of the output of the forward-pulse delay circuit 27-n in the n-th stage to one side of input terminal of the rearward-pulse delay circuit 29-n in the n-th stage and to the other input terminal of the forward-pulse delay circuit 27-(n+1) in the (n+1)th stage.

Now, suppose a state which is initialized and kept on "L" without being inputted with forward pulse FCL, and pulse s is on "L". In this case, although delay lines are ready for propagating pulse, as FCL is kept on "L", the output of the forward-pulse delay circuits 27-1, 27-2, . . . is fixed on "H", "L", and the forward-pulse delay line 27 is in initialized state. When pulse s is on "L", the control circuits 28-2, 28-4, which are formed with NAND circuits, output "H", and the control circuits 28-1, 28-3, . . . , which are formed with NOR circuits, output "L". As one side of input terminal of a rearward-pulse delay circuit in the last stage, which is formed with NAND circuits, is fixed on "H", the rearward-pulse delay circuits 29-2, 29-4, . . . , which are formed with NAND circuits, always output "L". and the rearward-pulse delay circuits 29-1, 29-3, . . . , which are formed with NOR circuits, always output "H". That is, in this case, output pulse RCL of the rearward-pulse delay line 29 is fixed on "H" and in initialized state.

Now, when pulse s becomes "H" and pulse /s becomes "L", as the control circuits 28-1, 28-2, . . . function as inverters as described above, two-input of the forward-pulse delay circuits 27-2, 27-3, . . . becomes "H", "L", and out of the forward-pulse delay circuits 27-2, 27-3, . . . , NOR circuits always output "L", and NAND circuits always output "H". Accordingly, the forward-pulse delay line 27 stays in initialized state.

Meanwhile, when pulse s becomes "H" and pulse /s becomes "L", the output of the rearward-pulse delay circuits 29-1, 29-2, . . . is changed by the output of the forward-pulse delay circuits 27-1, 27-2, . . . at the time when pulse s changes from "L" to "H".

As shown in FIG. 9, at the time when the first pulse s is inputted, the output of the forward-pulse delay circuits 27-1, 27-2, . . . has been initialized, and the output of the rearward-pulse delay line 29 has also been initialized. That is, in this case, the output of the rearward-pulse delay line 29 stays on "H" as shown by RCL in FIG. 9.

Next, when pulse s falls after the time A from its generation, and at the same time, pulse /s rises, as shown in Table 1, the forward-pulse delay circuits 27-1, 27-2, . . . function as inverters and propagate forward pulse FCL from the inverter 23. Propagation of forward pulse FCL continues until pulse s rises next. The propagation time of forward pulse FCL is, as shown by FCL in FIG. 9, (τ−A). At the time after (τ−A) from input of forward pulse FCL to delay lines, rising edge of forward pulse FCL (the part P 1 in FIG. 9) propagates as many stages as a delay time corresponding to this time (τ–A). The output of forward-pulse delay circuits in this stage and of forward-pulse delay circuits in as many stages as the pulse width of forward pulse FCL in the preceding stages is inverted from initialized state, and the output of forward-pulse delay circuits in stages other than these stages gets on the same level as initialized state. That is, in stages other than these, out of forward-pulse delay circuits, NOR circuits output "L", and NAND circuits output "H".

As shown by (s) in FIG. 9, pulse s rises at the time after (τ–A) from generation of forward pulse FCL. Then, as shown in Table 1, the control circuits 28-1, 28-2, . . . function as inverters. In a stage corresponding to a forward-pulse delay circuit which is propagating the "H" part of forward pulse FCL, out of control circuits, NAND circuits output "L" and NOR circuits output "H". Accordingly, in these stages, out of rearward-pulse delay circuits, NAND circuits output "H" and NOR circuits output "L". The output of rearward-pulse delay circuits in stages other than these becomes same as initialized state. That is, in this case, the rearward-pulse delay circuits 29-1, 29-2, . . . output inverted signals of the output of the forward-pulse delay circuits 27-1, 27-2, . . . in the same stage.

Thus, rising of rearward pulse is generated in a stage where rising of forward pulse FCL propagated. Meanwhile, as shown in Table 1, by "H" of pulse s, the forward-pulse delay line 27 is initialized. As rearward-pulse delay circuits act as inverters, rearward pulse propagates by delay lines.

Rearward pulse propagated by the rearward-pulse delay line 29 is outputted from the rearward-pulse delay circuit 29-1 in the first stage. Suppose that the number of stages for rising edge of forward pulse FCL, shown by FCL in FIG. 9, to propagate by the forward-pulse delay line 27 is equal to the number of stages for rising edge of rearward pulse, shown by the part P 2 in FIG. 9, to propagate by the rearward-pulse delay line 29, and delay time is equal in NAND circuits of the forward-pulse delay line 27 and in NAND circuits of the rearward-pulse delay line 29, and the delay time is equal in NOR circuits of the forward-pulse delay line 27 and in NOR circuits of the rearward-pulse delay line 29. In this case, the time for forward pulse and rearward pulse to propagate respectively by the forward-pulse delay line 27 and the rearward-pulse delay line 29 becomes equal.

Thus, in this embodiment, delay time of the delay units 31, 32 is used as a unit for the propagation time of forward pulse and rearward pulse. Forward-pulse delay circuits and rearward-pulse delay circuits of the delay units 31, 32 are composed of NAND circuits or NOR circuits. Accordingly, a delay time of a forward-pulse delay circuit is as much as a gate of NAND or NOR circuit.

In contrast to this, in the example of the related art shown in FIG. 1, as described above, forward-pulse delay circuits and rearward-pulse delay circuits are composed of NAND circuits and inverters, and the delay time of these is two gates. That is, this embodiment can halve the delay time compared to the example of the related art. As the propagation time of forward pulse and rearward pulse is the delay time multiplied integral times, in this embodiment, the propagation time of forward pulse and rearward pulse can be brought significantly close to (τ–A), and synchronization accuracy between the external clock signal CK and the internal clock signal CK' is improved than in the example of the related art.

That is, this embodiment may be configured with other circuits which correspond to forward-pulse delay lines, control circuit groups and rearward-pulse delay lines shown in an example of the related art, instead of the forward-pulse delay line 27, the control circuit group 28 and the rearward-pulse delay line 29.

However, accuracy is inferior to the case where the delay units 31, 32 are used.

Figure 10:
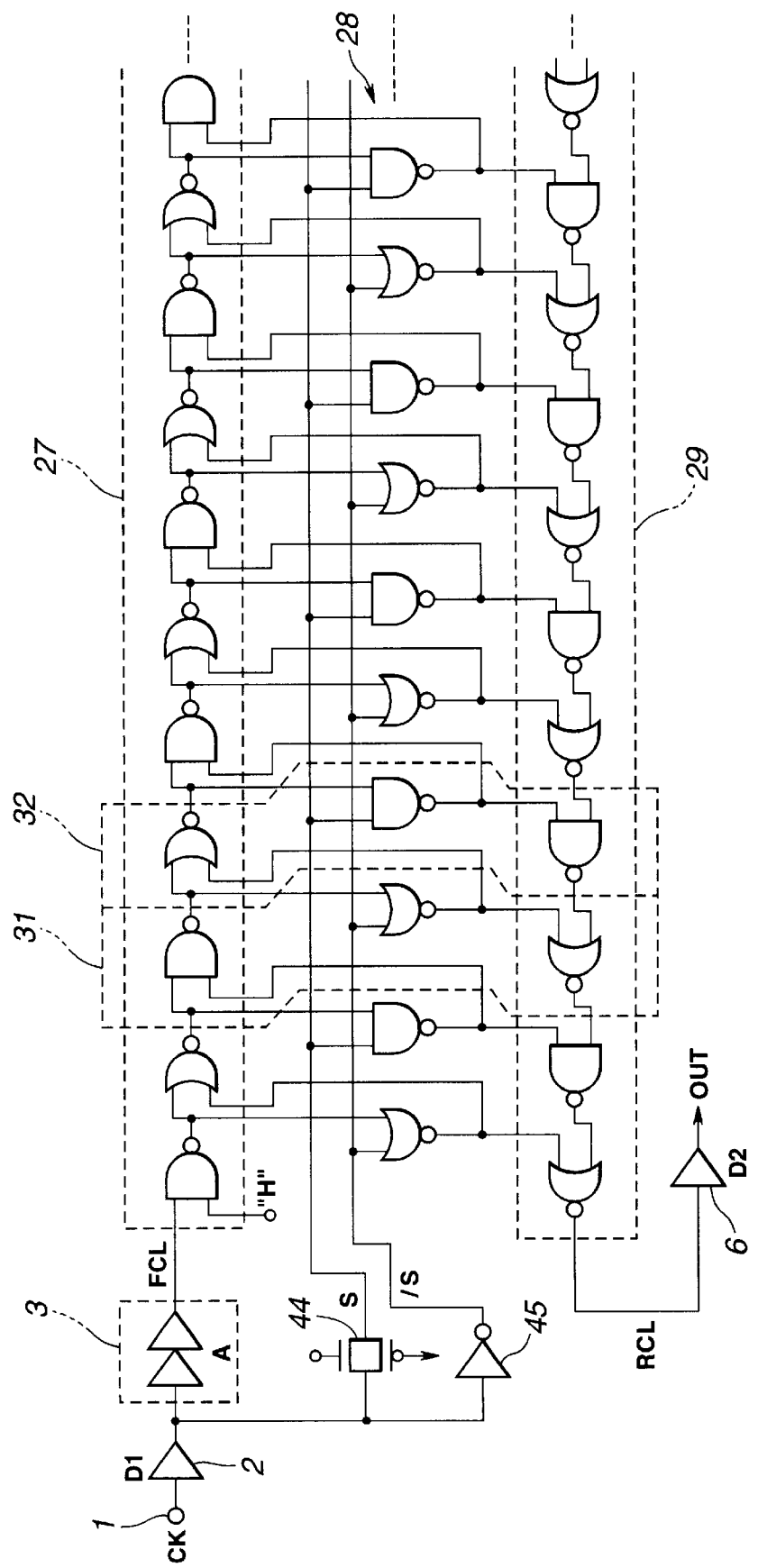
FIG. 10 is a circuit diagram illustrating the embodiment in FIG. 8.

Although the pulse generating circuit 21 is used in this embodiment, it is apparent that the output of the receiver 2 may be supplied as it is to control circuits, similarly to the example of the related art, when a pulse width of the external clock signal CK is smaller than the delay time A of a delay monitor. FIG. 10 is a circuit diagram to show a circuit in this case. In this case, too, as shown in FIG. 10, use of the delay units 31, 32 improves synchronization accuracy.

On the contrary, even when the delay units 31, 32 are used, when an external clock signal CK having a pulse width larger than the delay time A of a delay monitor happens to be inputted, use of the pulse generating circuit 21 is required.

Supposing that the output of the receiver 2 is supplied as it is to the control circuits 28-1, 28-2, . . . , similarly to the example of the related art, propagation of rising edge of forward pulse is stopped.

That is, when both pulse s and forward pulse FCL become "H", output terminals of the forward-pulse delay circuit 27-1 in the first stage become "L". Meanwhile, as shown in Table 1, as each of control circuits functions as an inverter in this case, "H" is supplied to the other input terminal of the forward-pulse delay circuits 27-2 in the second stage. That is, two-input of the forward-pulse delay circuit 27-2 in the second stage, which is formed with NOR circuits, become "H" and "L", and output is fixed on "L". Accordingly, forward pulse cannot propagate by the forward-pulse delay line 27 until pulse s becomes "L".

Thus, when an external clock signal CK having a pulse width larger than A is inputted, adoption of the pulse generating circuit 21 is required. By using the pulse generating circuit 21 and the delay units 31, 32, even when an external clock signal CK having a pulse width larger than A is inputted, an internal clock signal synchronized with an external clock signal can be generated, and at the same time, synchronization accuracy can be improved between the external clock signal and the internal clock signal.

Figure 11:
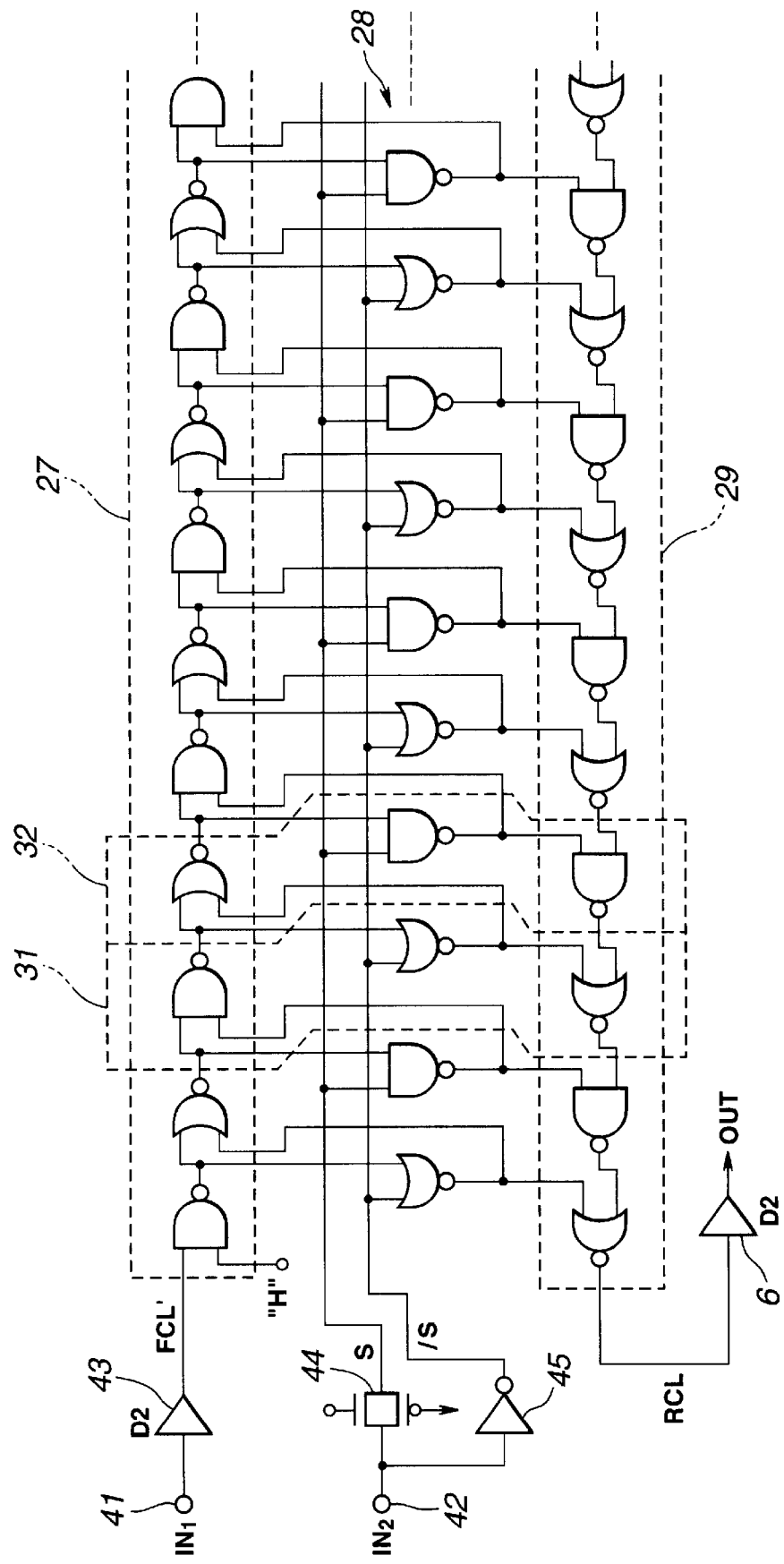
FIG. 11 is a circuit diagram showing another embodiment of the present invention.

FIG. 11 is a circuit diagram to show another embodiment of the present invention. In FIG. 11, the same elements as those in FIG. 8 are given the same reference numerals and description about them is omitted.

This embodiment is an example where a signal, which is further delayed as much as α to a delayed signal when there is a delay of α between two input signals.

The clock control circuit according to this embodiment is composed of a delay circuit 43, a path gate 44, an inverter 45, a plurality of delay units 31, 32 and the output buffer 6. Configuration of the delay units 31, 32 and of the output buffer 6 is the same as that in FIG. 8.

To input terminals 41, 42, predetermined clock signals IN1, IN2 are inputted respectively. The clock signal IN2 is delayed as much as α to the clock signal IN1. The input terminal 41 is connected with the delay circuit 43. The delay circuit 43 delays the clock signal IN1 as much time as the delay time D2, which is the same as the delay time of the output buffer 6, and supplies it as forward pulse FCL' to the forward-pulse delay line 27. The input terminal 42 is connected with the path gate 44 and the inverter 45. The path gate 44 is designed to supply the inputted clock signal IN2 as pulse s to the control circuits 28-2, 28-4, . . . , which are formed with NAND circuits of the control circuit group 28. The inverter 45 is designed to invert the inputted clock signal IN2 and to supply it as pulse /s to the control circuits 28-1, 28-3, . . . , which are formed with NOR circuits of the control circuit grout 28.

Figure 12:
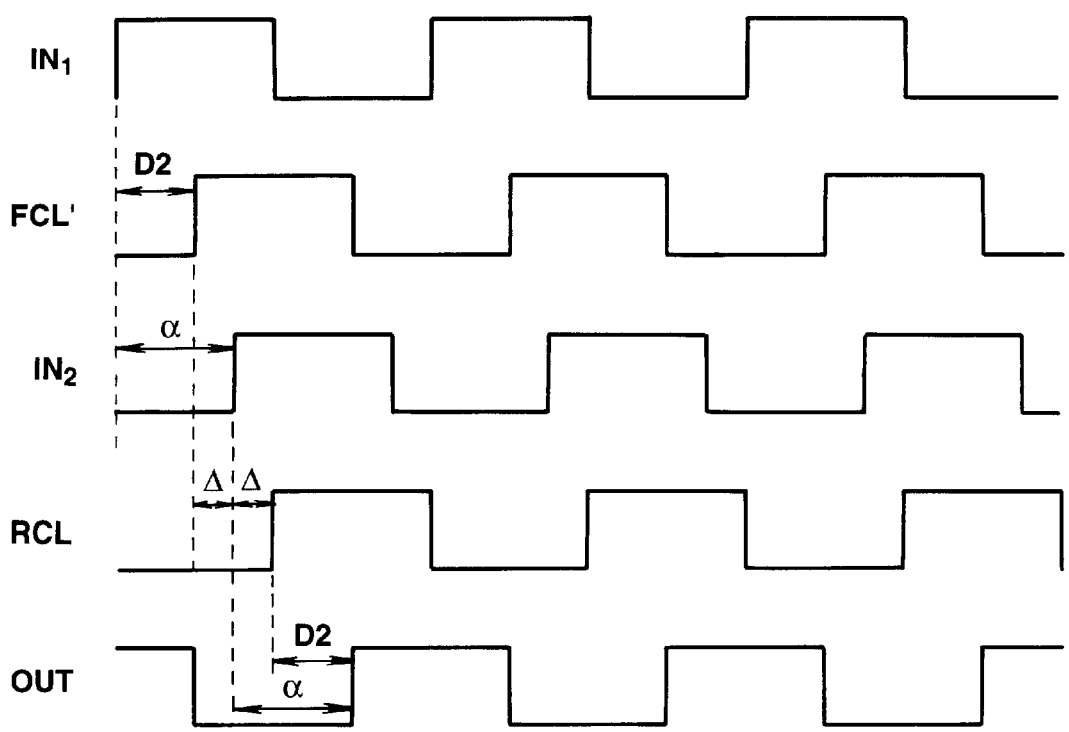
FIG. 12 is a waveform diagram illustrating the operation of the embodiment in FIG. 11.

Next, the operation of an embodiment configured in such a manner will be described with reference to the waveform diagram in FIG. 12. In FIG. 12, IN1 indicates the clock signal IN1, FCL' indicates forward pulse FCL', IN2 indicates the clock signal IN2, RCL indicates rearward pulse RCL, and OUT indicates an output clock signal OUT from the output buffer 6.

Through the input terminal 41, the clock signal IN1 is inputted, and through the input terminal 42, the clock signal IN2 is inputted. The clock signal IN2 is, as shown in FIG. 12, delayed as much time as $\alpha$ to the clock signal IN1. The clock signal IN1 is delayed as much time as D2 by the delay circuit 43, and supplied to the forward-pulse delay line 27 as forward pulse FCL'.

Meanwhile, the clock signal IN2 is supplied to the control circuits 28-2, 28-4, as pulse s through the path gate 44, and at the same time, inverted by an inverter 35, and pulse /s is supplied to the control circuits 28-1, 28-3, . . .

As shown in the Table 1, the time "L" of pulse s, that is, during the time "L" of the clock signal IN2, shown by, IN2 in FIG. 12, the forward-pulse delay circuits 27-1, 27-2, . . . function as inverters and propagate inputted forward pulse FCL'. When the clock signal IN2 becomes "H" and pulse s becomes "H", as shown in Table 1, rearward pulse is generated at the rearward-pulse delay line 29, and the generated rearward pulse propagates by the rearward-pulse delay line 29.

That is, the propagation time of forward pulse FCL' by the forward-pulse delay line 27 is the time from the rising of the forward pulse FCL' to the rising of the clock signal IN2, and it is the time $\Delta$ (=$\alpha$–D2) shown in FIG. 12. Timing when rising edge of rearward pulse is outputted from the rearward-pulse delay circuit 29-1 in the first stage is the time when the time $\Delta$ (=$\alpha$–D2) elapsed after generation of rearward pulse, after all, as shown in FIG. 12, rearward pulse RCL rises after 2$\Delta$=2($\alpha$–D2) from rising edge of forward pulse FCL'.

This rearward pulse RCL is delayed as much time as D2 by the output buffer 6, and outputted as an output clock signal OUT shown in FIG. 12. As shown in FIG. 12, the output clock signal OUT is delayed to the clock signal IN1 as much as:

$$D2+(\alpha-D2)+(\alpha-D2)+D2=2\alpha$$

As the clock signal IN2 has been delayed as much as a to the clock signal IN1, the output clock signal becomes a signal delayed as much as $\alpha$ to the clock signal IN2.

Thus, in this embodiment, when there is a delay of $\alpha$ between 2 input signals, a signal, which is further delayed as much as $\alpha$ to a delayed signal, can be generated. In this embodiment, too, as the delay units 31, 32 are used, it is apparent that accuracy of delay time of signals to be generated is improved.

Figure 13:
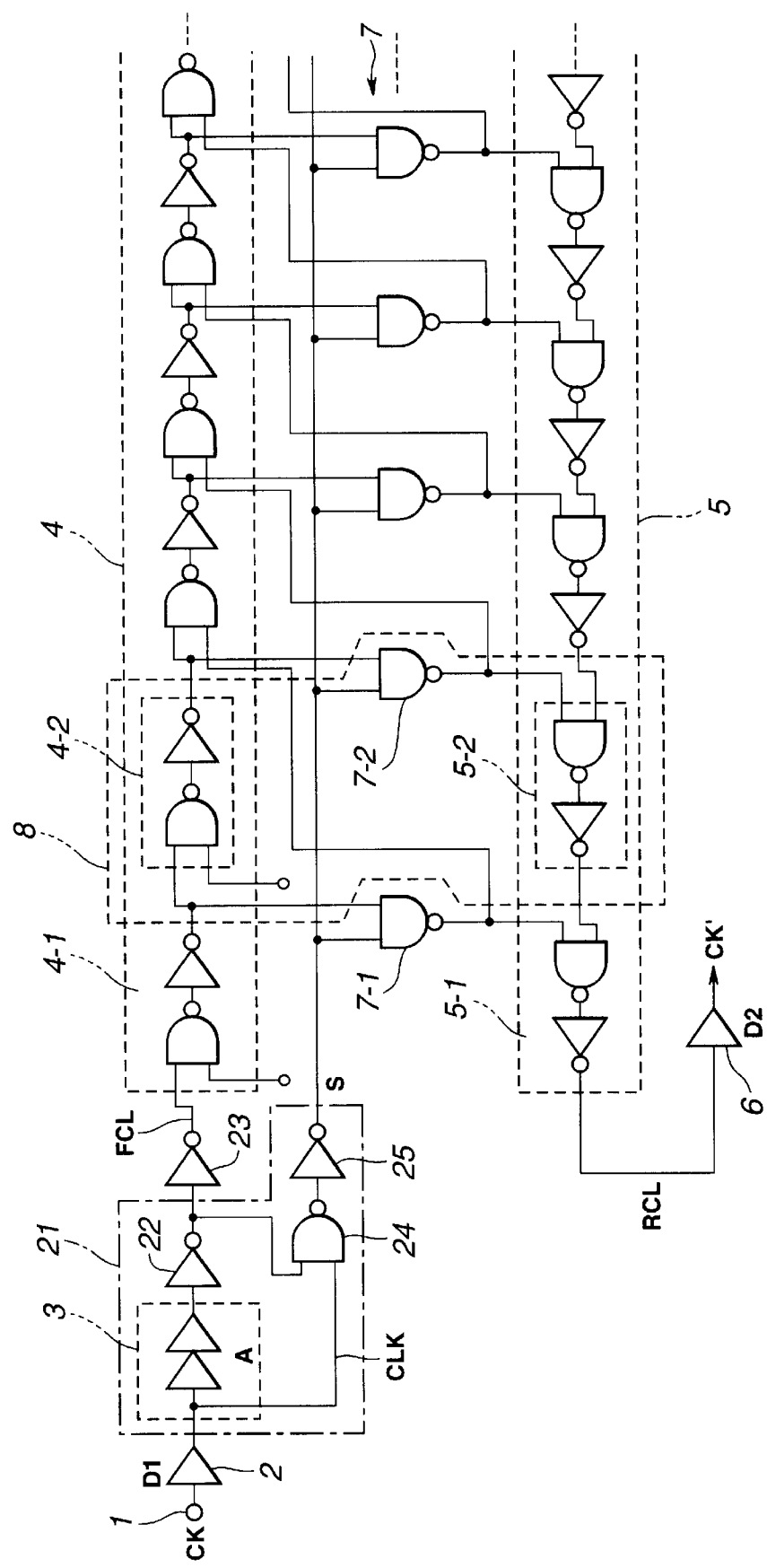
FIG. 13 is a circuit diagram showing another embodiment of the present invention.

FIG. 13 is a circuit diagram to show another embodiment of the present invention. In FIG. 13, the same elements as those in FIG. 8 are given the same reference numerals and description about them is omitted. As described above, the circuit in FIG. 8, such as forward-pulse delay lines, control circuit groups, and rearward-pulse delay lines, can be configured with circuits similar to those in the example of the related art. This embodiment shows an example of this case. That is, this embodiment, although it does not improve synchronization accuracy, can establish synchronization securely in high frequency between an external clock signal and an internal clock signal, because it need not generate pulse having narrow pulse width even when an external clock signal CK having a pulse width larger than the delay time A of a delay monitor.

This embodiment differs from that in FIG. 8 in points that, in addition to elimination of the path gate 26, configuration of forward-pulse delay lines, control circuit groups and rearward-pulse delay lines. The delay unit 8 is composed of forward-pulse delay circuits formed with AND circuits, control circuits formed with NAND circuits, and rearward-pulse delay circuits formed with AND circuits.

By cascading a plurality of delay unit 8, the forward-pulse delay line 4, the control circuit group 7 and the rearward-pulse delay line 5 are configured. That is, the forward-pulse delay line 4 is formed by cascading the forward-pulse delay circuits 4-1, 4-2, . . . the rearward-pulse delay line 5 is formed by cascading the rearward-pulse delay circuits 5-1, 5-2, . . . , and the control circuit group 7 is formed with the control circuits 7-1, 7-2, . . . . Both forward-pulse delay circuits and rearward-pulse delay circuits are composed of two-gate circuits by NAND circuits and inverters.

To one side of input terminal of the forward-pulse delay circuit 4-1, forward pulse FCL is supplied from the inverter 23, and to one side of input terminal of the forward-pulse delay circuits 4-2, 4-3, . . . , the output of the forward-pulse delay circuits 4-1, 4-2, . . . in the preceding stage is supplied. The output of the forward-pulse delay circuits 4-1, 4-2, . . . is respectively supplied to one side of the input terminals of the control circuits 7-1, 7-2, . . . , and to the other input terminal of the control circuits 7-1, 7-2, . . . , pulse s is supplied.

To one side of the input terminals of the rearward-pulse delay circuits 5-1, 5-2, . . . , the output of the rearward-pulse delay circuits 5-2, 5-3, . . . in the succeeding stage is supplied, and to the other input terminals, control signals from the control circuits 7-1, 7-2, . . . are supplied. It is designed so that, to one side of the input terminals of rearward-pulse delay circuits in the last stage, electric potential of "H" is supplied. Output terminals of the rearward-pulse delay circuit 5-1 in the first stage are connected with the output buffer 6.

The output of the control circuit 7-n in the n-th stage is designed to be supplied to the other input terminal of forward-pulse delay circuits in the (n+x)th stage. To the other input terminals of the forward-pulse delay circuits 4-1, 4-2, electric potential of "H" is supplied. FIG. 13 is an example where x is 2.

That is, in FIG. 13, configuration of the forward-pulse delay line 4, the control circuit group 7 and the rearward-pulse delay line 5 is the same as that in FIG. 1.

Next, the operation of an embodiment configured in such a manner will be described.

Now, suppose that an external clock signal CK having a pulse width larger than the delay time A of the delay monitor 3 is inputted through the input terminal 1. This external clock signal CK is delayed as much time as D1 by the receiver 2, and supplied to the pulse generating circuit 21 as a clock signal CLK. Thus, similarly to the embodiment in FIG. 8, from the pulse generating circuit 21, pulse s, which is synchronized with the rising of the clock signal CLK from the receiver 2 and has a pulse width of A, is outputted to the control circuits 7-1, 7-2, . . . . From the inverter 23, forward pulse FCL, which rises at the falling time of pulse s, is outputted to the forward-pulse delay line 4.

That is, when forward pulse FCL rises, pulse s is always "L", and rising of FCL propagates as much time as ($\tau$–A) without being stopped. As configuration of the forward-pulse delay line 4, the control circuit group 7 and the rearward-pulse delay line 5 is similar to that of the related art in FIG. 1, by using this pulse s for control of the control circuit group 7, similarly to the case in FIG. 2, an internal clock signal CK', which is synchronized with the external clock signal CK, can be generated.

Thus, in this embodiment, as pulse s, which rises at rising edge of the clock signal CLK and has a pulse width of A, is generated by the pulse generating circuit 21 in order to control the control circuits 7-1, 7-2, . . . , forward pulse FCL never rises during the time when pulse s is "H". Consequently, similarly to the embodiment in FIG. 8, even when an external clock signal CK having a pulse wider than the delay time A of the delay monitor 3 is inputted, synchronization becomes establishable between the external clock signal CK and the internal clock signal CK' without generating pulse having a width narrower than A.

Figure 14:
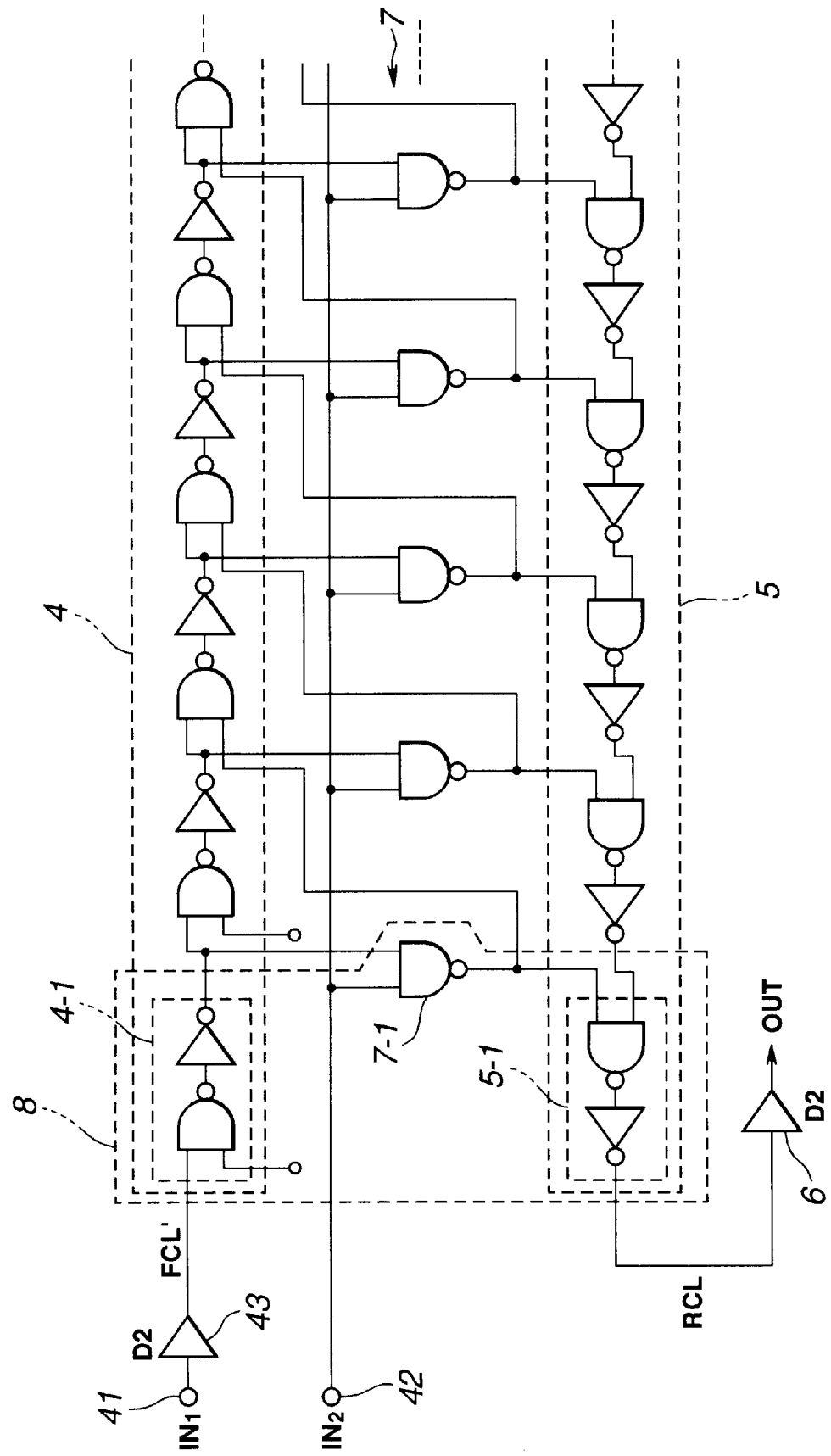
FIG. 14 is a circuit diagram showing another embodiment of the present invention.

FIG. 14 is a block diagram to show another embodiment of the present invention. In FIG. 14, the same elements as those in FIG. 11 and FIG. 13 are given the same reference numerals and description about them is omitted. This embodiment is applied, similarly to the embodiment in FIG. 11, to a circuit to generate a signal, which is further delayed as much as α to a delayed signal, when there is a delay of α between two input signals.

This embodiment differs from that in FIG. 11 in points that the path gate 44 and the inverter 45 are eliminated, and at the same time, the forward-pulse delay line 4, the control circuit group 7 and the rearward-pulse delay line 5 are used instead of the forward-pulse delay line 27, the control circuit group 28 and the rearward-pulse delay line 29 respectively.

That is, it is designed so that forward pulse FCL' from the delay circuit 43 is given to the forward-pulse delay circuit 4-1 in the first stage of the forward-pulse delay line 4, and the clock signal IN2 from the input terminal 42 is supplied to each of the control circuits 7-1, 7-2, . . . of the control circuit group 7.

In the embodiment configured in such a manner, forward pulse FCL' will be the one shown by FCL' in FIG. 12, and the clock signal IN2 to be supplied to the control circuits 7-1, 7-2, . . . will be the one shown by IN2 in FIG. 12.

Other operation is similar to that of the embodiment in FIG. 11.

In this embodiment, too, similarly to the embodiment in FIG. 13, as all of forward-pulse delay circuits and rearward-pulse delay circuits of the delay unit 8 have a delay time of 2 gates, synchronization accuracy is similar to that in the example of the related art. Other advantages are the same as those of the embodiment in FIG. 11.

Figure 15:
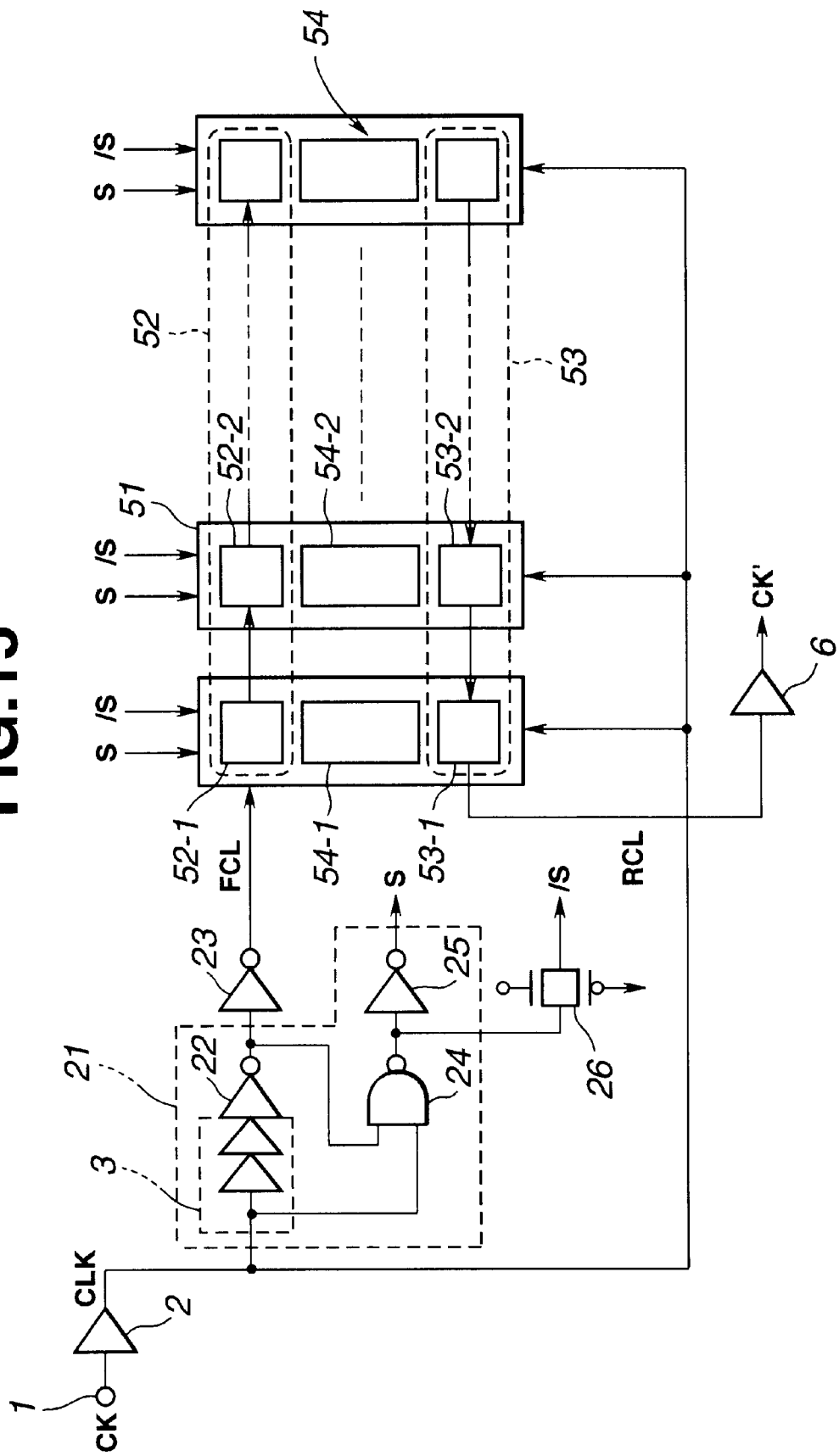
FIG. 15 is a circuit diagram showing another embodiment of the present invention.

FIG. 15 is a circuit diagram to show another embodiment of the present invention. In FIG. 15, the same elements as those in FIG. 8 are given the same reference numerals and description about them is omitted. This embodiment is an example where it is applied to a device which has adopted STBD (Synchronous Traced Backwards Delay). This embodiment differs from that in FIG. 8 in points that a forward-pulse delay line 52, a state-holding circuit group 54 and a rearward-pulse delay line 53 are adopted instead of the forward-pulse delay line 27, the control circuit group 28 and the rearward-pulse delay line 29 respectively.

The forward-pulse delay line 52, the state-holding circuit group 54 and the rearward-pulse delay line 53 are formed by cascading a plurality of the delay unit 51. The delay unit 51 is composed of forward-pulse delay circuits, state-holding circuits and rearward-pulse delay circuits.

Figure 16:
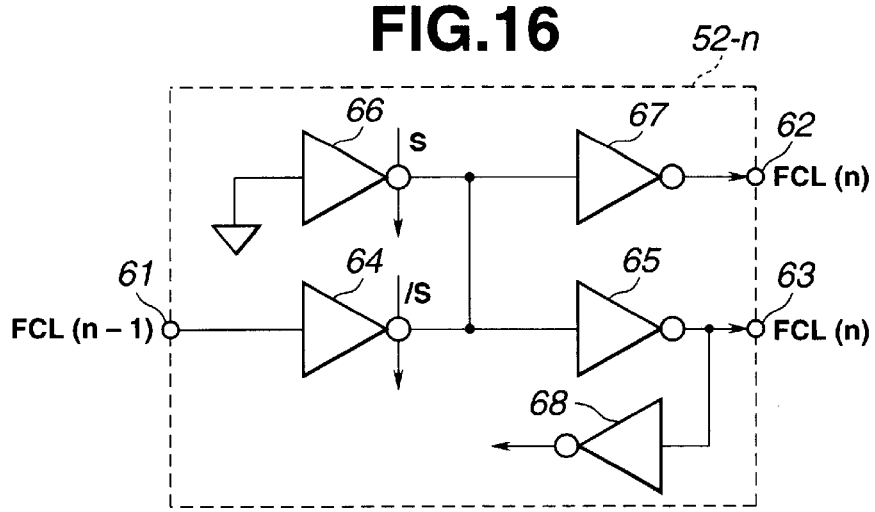
FIG. 16 is a circuit diagram showing a forward-pulse delay circuit 52-n in FIG. 15.
Figure 17:
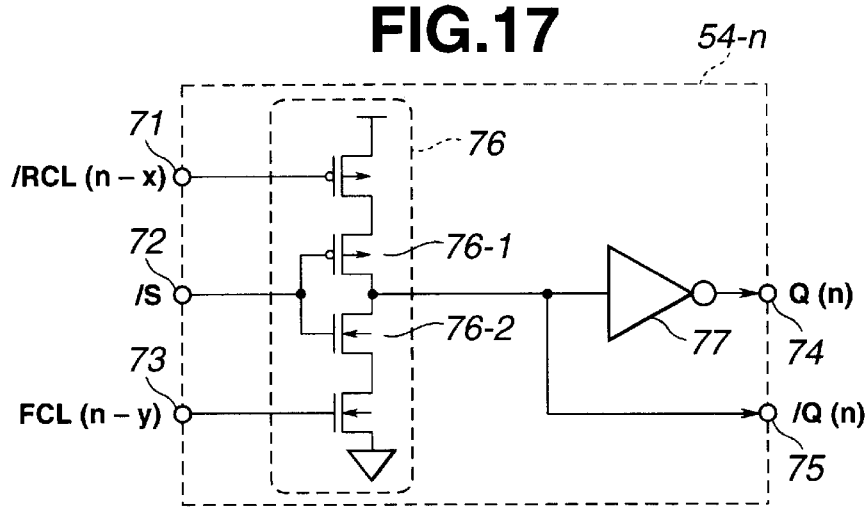
FIG. 17 is a circuit diagram showing a state-holding circuit 54-n in FIG. 15.
Figure 18:
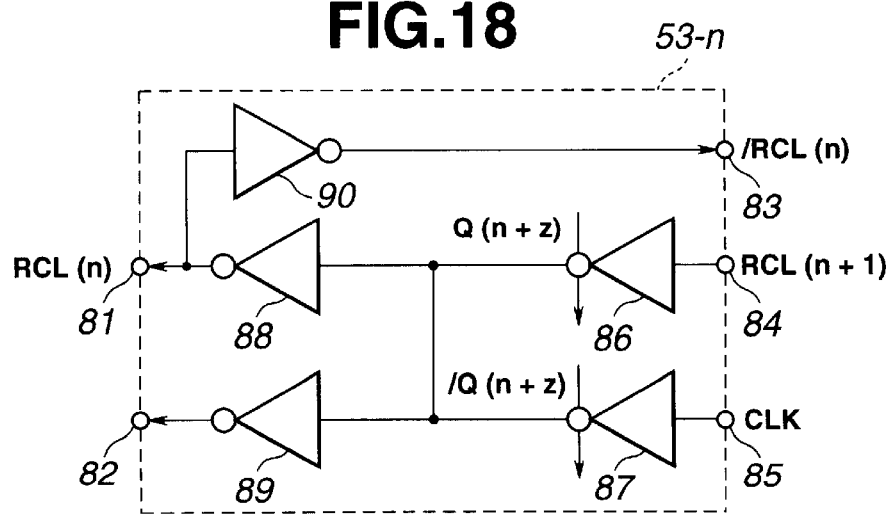
FIG. 18 is a circuit diagram showing a rearward-pulse delay circuit 53-n in FIG. 15.

FIGS. 16–18 are circuit diagrams to show respectively forward-pulse delay circuits, state-holding circuits and rearward-pulse delay circuits, which form the delay unit 51 in FIG. 15. A clock control circuit, which is configured with a delay array (STBD) formed with such delay unit 51, was proposed in the specification of Patent Application No. 8-100976 filed in Japan.

A clock control circuit, which has applied STBD, needs to initialize all forward-pulse delay circuits before forward pulse FCL is inputted to a delay unit in the first stage. For this purpose, in the circuit in the specification of Patent Application No. 8-100976, it was required to generate pulse P having a pulse width narrower than the delay time A of the delay monitor 3, and to carry out control by this pulse P. That is, even the proposed circuit had a shortcoming that it is unsuitable for operation in high-frequency band, because it needs to generate pulse having a width narrower than the delay time A.

In contrast to this, in this embodiment, use of pulses s, /s having pulse width of A generated by the pulse generating circuit 21 enables to establish synchronization of the external clock signal with the internal clock signal.

In FIG. 15, it is designed so that forward pulse FCL from the inverter 23 is supplied to the forward-pulse delay circuit 52-1 in the first stage of the forward-pulse delay line 52, and rearward pulse RCL from the rearward-pulse delay circuit 53-1 in the first stage of the rearward-pulse delay line 53 is supplied to the output buffer 6. In this embodiment, it is also designed so that, to the delay unit 51 in each stage, pulse s, pulse /s and the clock signal CLK are supplied.

In the clock control circuit in FIG. 15, too, similarly to the embodiment in FIG. 8, forward pulse FCL is propagated as much time as (τ–A) by the forward-pulse delay line 52, and at the same time, rearward-pulse is propagated as much time as (τ–A) by the rearward-pulse delay line 53. In order to propagate forward pulse and rearward pulse as much time as (τ–A), the state-holding circuit group 54 is adopted in this proposal.

That is, each of the state-holding circuits 54-1, 54-2, . . . of the state-holding circuit group 54 is designed to store two states, set state and reset state. The forward-pulse delay circuits 52-1, 52-2, . . . are set to the initialized state when pulse s is "H", and when pulse s is "L", forward pulse is propagated. When pulse s changes from "H" to "L", forward pulse is propagated, and the state-holding circuits 54-1, 54-2, . . . in stages where propagation occurred, sequentially get into set state.

Forward pulse is propagated as much time as (τ–A), and state-holding circuits shift from reset state to set state in as many stages as corresponding to this time (τ–A). That is, state-holding circuits are in set state in the preceding stages of the stage corresponding to that of the forward-pulse delay line 52 where forward pulse propagated, and in the succeeding stages, they are in reset state.

The rearward-pulse delay circuits 53-1, 53-2, . . . are designed to propagate the clock signal CLK while state-holding circuits are in reset state, and to propagate the output of rearward-pulse delay circuits in succeeding stages when state-holding circuits get in set state. Accordingly; when pulse s synchronizes with the rising of the clock signal CLK to become "H", in the succeeding stages of a stage of the rearward-pulse delay line 53, which corresponds to the stage where propagation of forward pulse stopped, output on "H" is outputted. This output "H" is sequentially propagated by the rearward pulse unit delay line in set state, and outputted as rearward pulse after the time (τ–A). It is designed so that state-holding circuits are put back to reset state from set state by propagated rearward pulse.

FIG. 16 shows the forward-pulse delay circuit 52-n in the n-th stage. To a terminal 61, forward pulse FCL(n–1), the output of the forward-pulse delay circuit 52-(n−1) in the (n−1)th stage, is inputted. Forward pulse FCL(n−1) is supplied to a clocked inverter 64. The clocked inverter 64 conducts on "L" of pulse /s. The output of the clocked inverter 64 is designed to be outputted from a terminal 63 through an inverter 65, and at the same time, to be outputted from a terminal 62 through an inverter 67. The output of the terminal 63 is designed to be supplied to the input terminal 61 of the forward-pulse delay circuit 52-(n+1) in the next stage as forward pulse FCL(n). The terminal 62 is connected with a terminal 73 of a state-holding circuit which will be described in the latter part.

To a clocked inverter 66, electric potential of "L" is supplied. The clocked inverter 66 is designed to conduct on "H" of pulse s, to output its output to the terminal 63 through the inverter 65, and at the same time, to output it to the terminal 62 through the inverter 67. To output terminals of the inverter 65, an inverter 68 is also connected for matching with load.

With such configuration, the forward-pulse delay circuit 52-n is designed to output, from the terminals 62, 63, the output of "L" when the inverter 66 conducts due to pulse s becoming "H", and when the inverter 64 conducts due to pulse s becoming "L", to propagate forward pulse from the preceding stage to the succeeding stage.

FIG. 17 shows the state-holding circuit 54-n in the n-th stage. The state-holding circuit 54-n is composed of a clocked inverter 76 and an inverter 77. The clocked inverter 76 is formed with two pMOS transistors and two nMOS transistors, and controlled by signals inputted through terminals 71–73. To the terminal 72, pulse /s is inputted, and to the terminal 73, forward pulse in the (n−y)th stage FCL(n−y) is inputted. To the terminal 71, inverted signals of rearward pulse in the (n−x)th stage from the rearward-pulse delay line 53, /RCL (n−x) is inputted. It may be designed so that /s inputted to terminals 71, 73 and pMOS 76-1 is controlled by /RCL (n−x) and nMOS 76-2 is controlled by FCL (n−y).

The clocked inverter 76 outputs a level based on rearward pulse in the (n−x)th stage due to pulse /s becoming "H", and outputs a level based on forward pulse in the (n−y)th stage due to pulse /s becoming "L". The output of the clocked inverter 76 is supplied as it is to a terminal 75 as well as to a terminal 74 through the inverter 77. The output of the terminals 74, 75 is designed to be supplied to the rearward-pulse delay line 53 as a state signal Q and its inverted signal /Q.

During the time while pulse s is "L", such configuration makes the state signal Q "H" (set state) in stages where forward pulse FCL(n−y) propagated.

During the time while pulse s is "H", the state signal Q, which corresponds to the output of inverted signal of rearward pulse in the (n−x)th stage /RCL(n−x), is outputted. That is, in a stage where rearward pulse RCL(n−x) is "L", the state signal Q is kept on "H" (set state), and in a stage where rearward pulse RCL(n−x) is "H", the state signal Q is put on a low level (reset state).

FIG. 18 shows the rearward-pulse delay circuit 53-n in the n-th stage. To a terminal 84, rearward pulse RCL(n+1) from the rearward-pulse delay circuit 53-(n+1) in the succeeding stage is inputted, and to a terminal 85, the clock signal CLK from the receiver 2 is inputted. Signals inputted to the terminals 84, 85 are supplied to clocked inverters 86, 87 respectively.

The clocked inverter 86 conducts by the state signal Q(n+z) from the state-holding circuit 54-(n+z) in the (n+z)th stage becoming "H", and the clocked inverter 87 conducts by the inverted signal /Q(n+z) of the state signal from the state-holding circuit 54-(n+z) in the (n+z)th stage becoming "H". Output terminals of the clocked inverter 86 are connected with a terminal 82 through an inverter 89 as well as with a terminal 81 through an inverter 88. Output terminals of the clocked inverter 87 are connected with the terminal 81 through the inverter 88 as well as with the terminal 82 through the inverter 89. Output terminals of the inverter 88 are connected with a terminal 83 through an inverter 90. The terminal 81 is connected with the terminal 84 of the rearward-pulse delay circuit 53-(n−1) in the preceding stage.

With such configuration, in a stage where the state signal Q showing reset state has been inputted, the clocked inverter 87 conducts, and the clock signal CLK from the terminal 85 is outputted from the terminal 81 to the rearward-pulse delay circuit 53-(n−1) in the preceding stage. In a stage where the state signal Q showing set state has been inputted, the clocked inverter 86 conducts, and rearward pulse RCL(n+1) from the rearward-pulse delay circuit 53-(n+1) in the succeeding stage is outputted from the terminal 81 to the rearward-pulse delay circuit 53-(n−1) in the preceding stage.

In FIGS. 16–18, x, y, z are to subtract the delay time between timing when as much time as (τ−A) elapsed since the start of propagation of forward pulse and the stop of propagation of forward pulse and the start of propagation of rearward pulse. However, (n) is an integer larger than 0, and x, y, z are integers.

Figure 19:
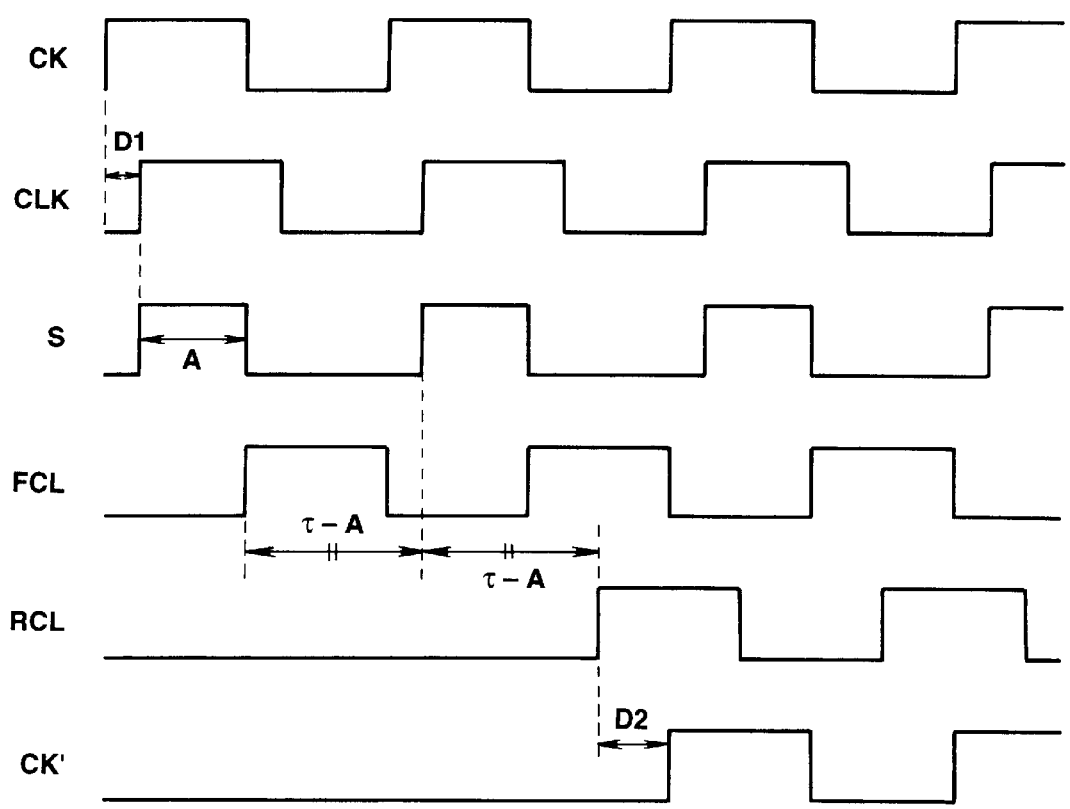
FIG. 19 is a timing chart illustrating the operation of the embodiment in FIG. 15.

Next, the operation of an embodiment configured in such a manner will be described with reference to FIG. 19. FIG. 19 shows the external clock signal CK, the clock signal CLK from the receiver 2, pulse s from the inverter 25, forward pulse FCL from the inverter 23, rearward pulse RCL which is the output of the rearward-pulse delay line 53, and the internal clock signal CK' from the output buffer 6.

In order to simplify the description, x, y, z in FIGS. 16–18 are described as x=y=0, z=1 respectively. The state-holding circuit 54-n is supposed to be initialized to reset state.

Operation before generation of pulse s and pulse /s is similar to that of the embodiment in FIG. 8. During the time while pulse s is "H", the inverter 66 of the forward-pulse delay circuit 52-n conducts, and all the output of the forward-pulse delay circuit 52-n is on "L" and in initialized state. During this time, the rearward-pulse delay circuit 53-n also outputs "L", and the rearward-pulse delay line 53 is supposed to be in initialized state.

When pulse s, shown in FIG. 19, becomes "L", the inverter 64 of the forward-pulse delay circuit 52-n conducts and propagates forward pulse. Forward pulse, which came out at the terminal 62, is also supplied to the clocked inverter 76 through the terminal 73 of the state-holding circuit 54-n. The output of the clocked inverter 76 becomes "L" in a stage where forward pulse on "H" passed during the time while pulse s is "L", and the state signal Q from the terminal 74 becomes "H".

That is, by propagation of forward pulse on "H" by the forward-pulse delay line 52, the state signal Q at a state-holding circuit in a stage, where forward pulse propagated, changes from reset state to set state sequentially. The state signal Q from the state-holding circuit 54-n and its inverted signal /Q are supplied to the rearward-pulse delay circuit 53-(n−1) in the (n−1)th stage. Rearward-pulse delay circuits, which have been shown reset state by the state signal Q, output the clock signal CLK of the receiver 2, and rearward-pulse delay circuits, which have been shown set state, propagate the output of the succeeding stage. Accordingly, at this time, the output of all the rearward-pulse delay circuits 53-1, 52-2, . . . stays on "L".

When the time (τ−A) elapsed after a start of propagation of forward pulse FCL, as shown in FIG. 19, pulse s changes to "H". Then, propagation of forward pulse stops, and the forward-pulse delay circuit 52-n returns to initialized state.

Supposing that the stage where forward pulse has propagated is the m-th stage, the state signal Q from state-holding circuits in the first stage up to the m-th stage becomes "H", and the rearward-pulse delay circuits in the first stage up to the (m−1)th stage propagate the output of the next stage to the preceding stage as it is. As the state signal Q from state-holding circuits of the state-holding circuit 54-(m+1) in and after the (m+1)th stage is "L", rearward-pulse delay circuits in and after the m-th stage output the clock signal CLK.

At this time, as shown in FIG. 19, as the clock signal CLK becomes "H", rearward-pulse delay circuits in and after the m-th stage output on "H". As the rearward-pulse delay circuit 53-m in the m-th stage propagates the output of the rearward-pulse delay circuit 53-(m+1) in the (m+1)th stage to the preceding stage, from the rearward-pulse delay circuit 53-m in the m-th stage, "H" is outputted as rearward pulse.

After this, rearward pulse propagates rearward-pulse delay circuits sequentially to the preceding stage side, and from the rearward-pulse delay circuit 53-1 in the first stage, rearward pulse is outputted FIG. 19). The number of stages of rearward-pulse delay circuits, where rearward pulse is to propagate, is the same as the number of stages of forward-pulse delay circuits, where forward pulse has propagated, and as the delay time of each of forward-pulse delay circuits and each of rearward-pulse delay circuits is equal, the time for rearward pulse to propagate by the rearward-pulse delay line 53 becomes (τ−A). Rearward pulse RCL from the rearward-pulse delay circuit 53-1 is supplied to the output buffer 6, and outputted as the internal clock signal CK' after the delay time D2.

In this embodiment, too, the delay time of the internal clock signal CK' to the external clock signal CK is:

$$D1+A+2(\tau-A)+D2$$

By designing it to become A=D1+D2, an internal clock signal CK', which is delayed as much time as 2τ to the external clock signal CK, can be generated.

Thus, in this embodiment, too, the same advantages as those in the embodiment in FIG. 8 are available.

Now, suppose that, at the time when a pulse width of a control signal is larger than A, and when forward pulse is inputted to the forward-pulse delay line 52, a signal to control the forward-pulse delay line 52 and the state-holding circuit group 54 (corresponds to pulse s) is "H". If so, as the clocked inverter 64 of the forward-pulse delay circuit 52-n does not get in conducting state, forward pulse does not propagate, and it becomes impossible to establish synchronization of the external clock signal CK with the internal clock signal CK'. Consequently, it is necessary to make the signal, which controls the forward-pulse delay line 52 and the state-holding circuit group 54, "L" and to make it complete initialization before forward pulse is inputted to the forward-pulse delay line 52. For this reason, in the proposal in the specification of the Patent Application No. 8-100976, it is designed to generate, using a pulse generating circuit to generate signals having pulse width shorter than A, a signal with a width narrower than A, and to control the forward-pulse delay line 52 and the state-holding circuit group 54, using this signal.

In contrast to this, in this embodiment, pulse s to control STBD is generated using the pulse generating circuit 21. As pulse s always becomes "L" at the time when forward pulse is inputted to the forward-pulse delay line 52, that is, at the time when forward pulse FCL becomes "H", it is unnecessary to have a pulse generating circuit to generate pulse having a width narrower than the time A, which was proposed in the specification of Patent Application No. 8-100976. With this, this embodiment enables operation in high-frequency band also for a clock control circuit which uses STBD.

Figure 20:
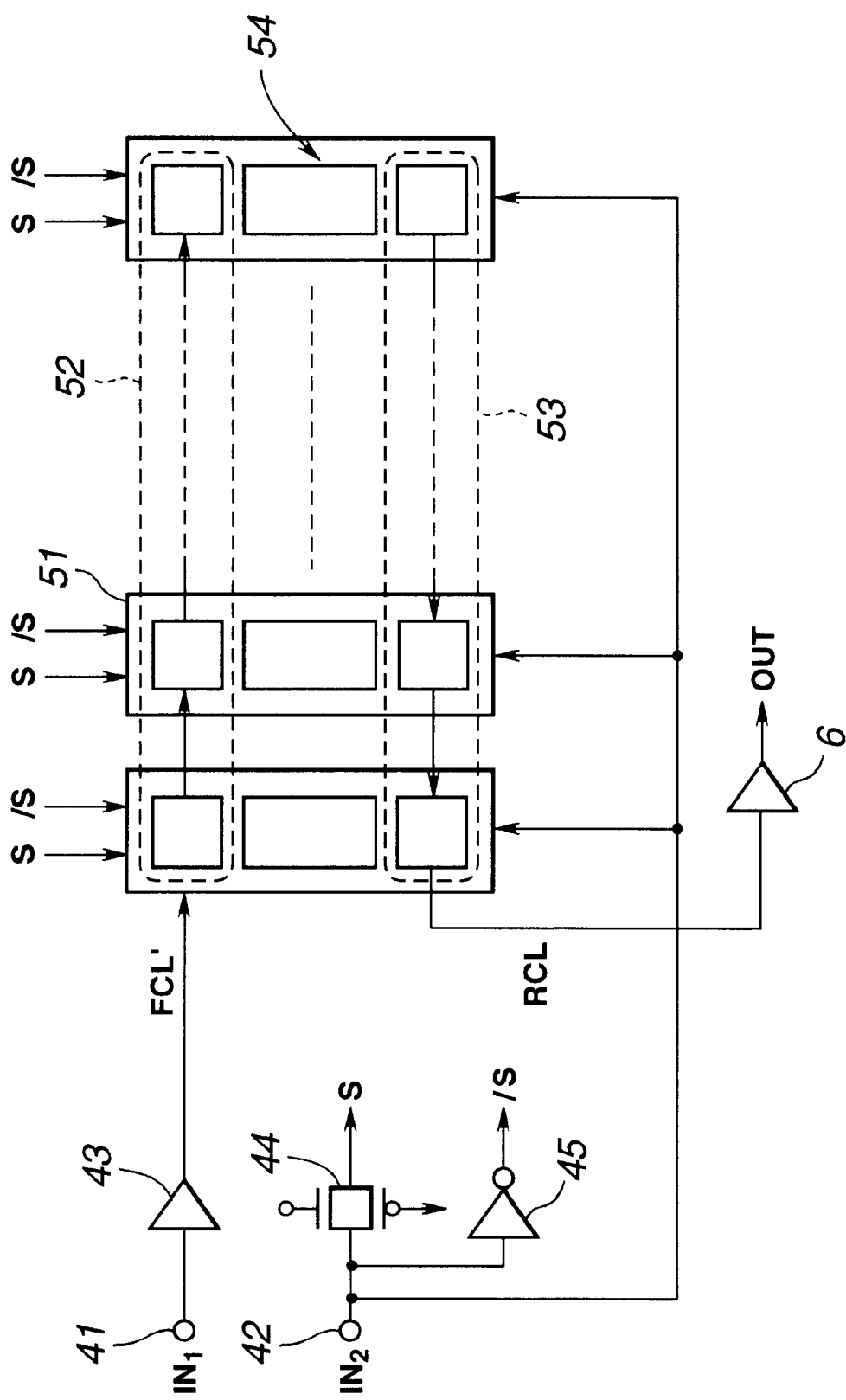
FIG. 20 is a circuit diagram showing another embodiment of the present invention.

FIG. 20 is a circuit diagram to show another embodiment of the present invention. In FIG. 20, the same elements as those in FIG. 11 and FIG. 15 are given the same reference numerals and description about them is omitted. This embodiment is an example where, when there is a delay of α between 2 input signals, it is applied to a circuit to generate a signal which is further delayed as much as α to a delayed signal.

To input terminals 41, 42, the clock signals IN1, IN2, which have a delay of α each other, are inputted. The clock signal IN1 is supplied to the delay circuit 43, and forward pulse FCL' from the delay circuit 43 is supplied to the forward-pulse delay circuit 52-1 in the first stage. The clock signal IN2 from the input terminal 42 is designed to be supplied to all the delay unit 51. It is also designed so that, to all the delay unit 51, pulse s from the path gate 44 and pulse /s from the inverter 45 are also supplied.

In the embodiment configured in such a manner, forward pulse FCL' appears to be as shown at FCL' in FIG. 12, and pulse s to be supplied to the delay units 51-1, 52-2. . . . appears to be as shown by (s) in FIG. 12. Other operation is similar to that of the embodiment in FIG. 11 and FIG. 15.

Figure 21:
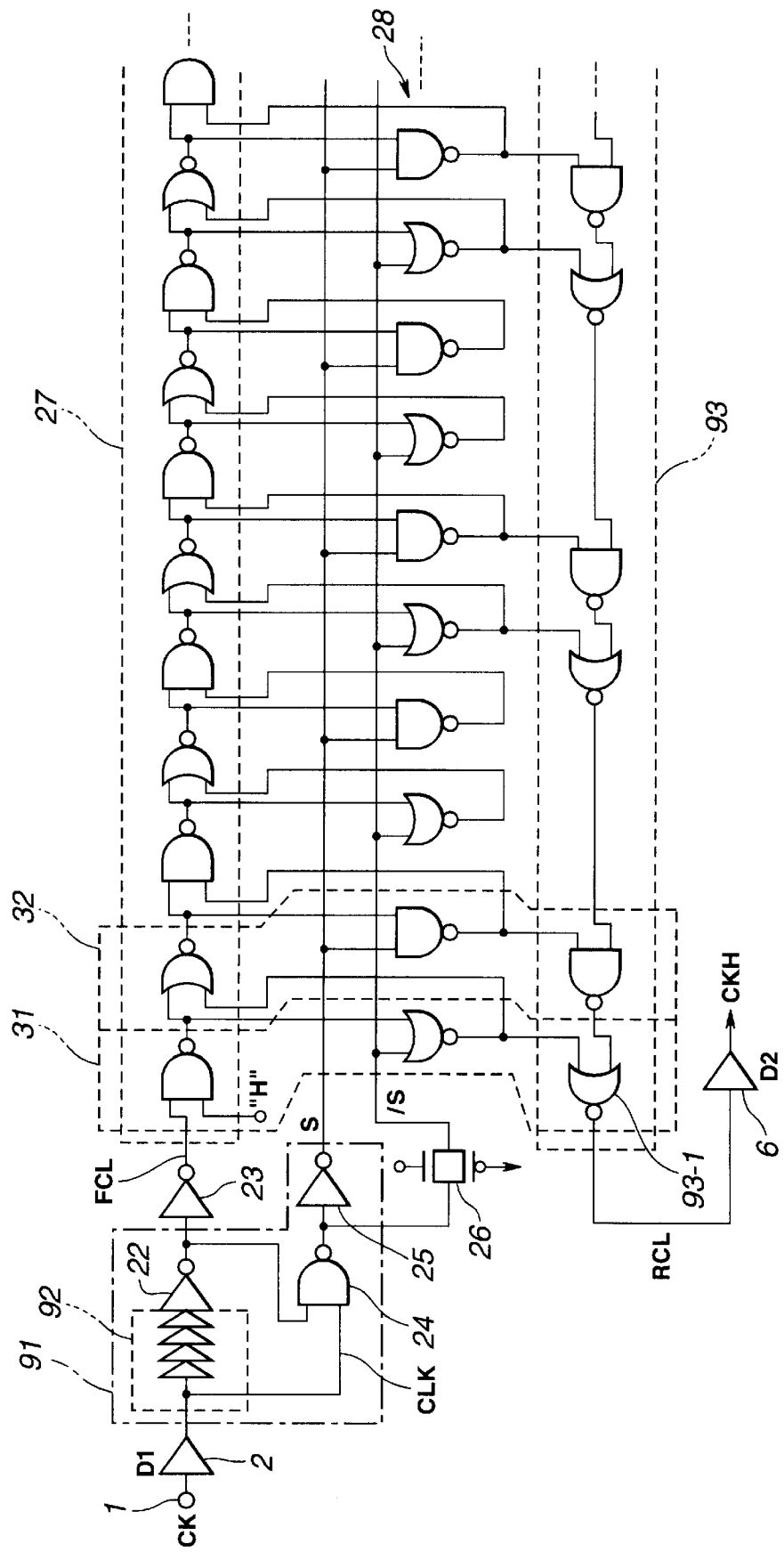
FIG. 21 is a circuit diagram showing another embodiment of the present invention.

FIG. 21 is a circuit diagram to show another embodiment of the present invention. In FIG. 21, the same elements as those in FIG. 8 are given the same reference numerals and description about them is omitted. This embodiment is an example where it is applied to a circuit to generate a signal delayed as much as τ/2 to the external clock signal CK whose period is τ.

This embodiment differs from that in FIG. 8 in points that a pulse generating circuit 91 is adopted instead of the pulse generating circuit 21 in FIG. 8, and a rearward-pulse delay line 93 is adopted instead of the rearward-pulse delay line 29. The pulse generating circuit 91 differs from the pulse generating circuit 21 in point that a delay circuit 92, which meets the delay time A'[=2(D1+D2)], is used instead of the delay monitor 3. The rearward-pulse delay line 93 differs from the rearward-pulse delay line 29 in point that the number of rearward-pulse delay circuits is halved, and a rearward-pulse delay circuit is provided in every two stages.

Figure 22:
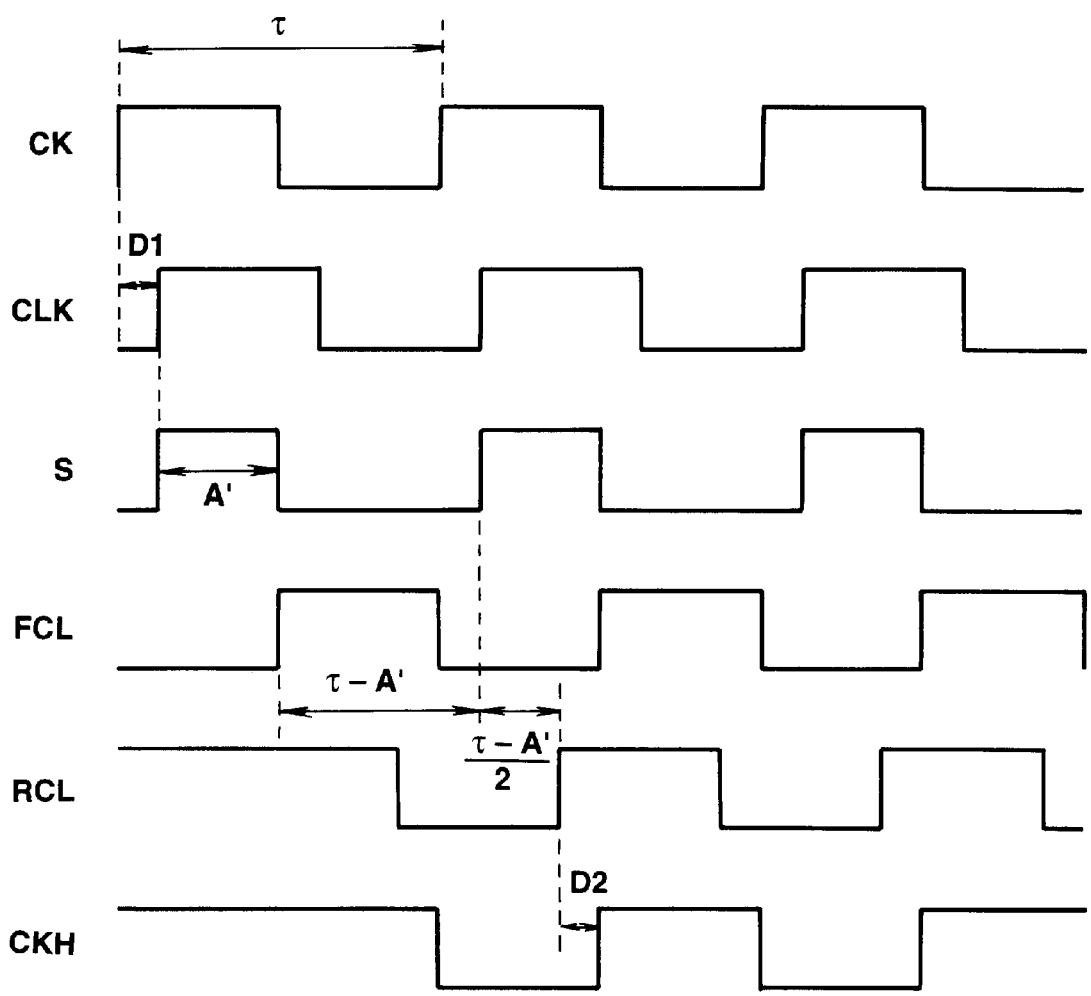
FIG. 22 is a waveform diagram illustrating the operation of the embodiment in FIG. 21.

Next, the operation of an embodiment configured in such a manner will be described with reference to the waveform diagram in FIG. 22. FIG. 22 shows the external clock signal CK, the clock signal CLK from the receiver 2, pulse s, forward pulse FCL, rearward pulse RCL and the output clock signal CKH from the output buffer 6.

The external clock signal CK having a period τ, shown in FIG. 22, is supplied to the receiver 2 through the input terminal 1, and from the receiver 2, the clock signal CLK shown as CLK in FIG. 22. As shown in FIG. 22, the clock signal CLK is delayed as much time as D1 to the external clock signal CK.

This clock signal CLK is supplied to the pulse generating circuit 91. The delay circuit 92 delays the clock signal CLK as much time as the delay time A', and the inverter 22 inverts the output of the delay circuit 92 and gives it to the NAND circuit 24. The NAND circuit 24 generates pulse which becomes "L" only as much time as A' from the rising of the clock signal CLK. This pulse is inverted by the inverter 25, and, as shown in FIG. 22, outputted to the control circuits 28-2, 28-4, . . . as pulse s which rises synchronously with the rising of CLK and has a pulse width of A'. The path gate 26 outputs inverted signal /s of pulse s, to the control circuits 28-1, 28-3, . . . .

Forward pulse FCL from the inverter 23, as shown in FIG. 22, is delayed as much time as A' to the clock signal CLK. When pulse s becomes "L", forward pulse FCL shown in FIG. 22 propagates by the forward-pulse delay line 27. When the time (τ−A') elapses from falling of pulse s, pulse s becomes "H", and propagation of forward pulse stops at the same time as rearward pulse is generated.

This rearward pulse propagates by the rearward-pulse delay line 93, and is outputted from the rearward-pulse delay circuit 93-1 in the first stage. As the number of elements of rearward-pulse delay circuits is ½ of the number of elements of forward-pulse delay circuits, the number of elements of rearward-pulse delay circuits for rearward pulse to propagate by is ½ of the number of elements where forward pulse propagated. Accordingly, rising edge of rearward pulse is outputted after propagating by the rearward-pulse delay line 93 for half the time which forward pulse propagated for, that is, for (τ−A')/2.

Rearward pulse RCL from the rearward-pulse delay line 93 is delayed by the output buffer as much as D2, and outputted as the output clock signal CKH.

As the delay time of the output clock signal CKH to the external clock signal CK is A'=2(D1+D2):

$$D1+A'+(\tau-A')+(\tau-A')/2+D2$$
$$=D1+\tau+\tau/2-A'/2+D2$$
$$=(D1+D2)+3\tau/2-A'/2$$
$$=(D1+D2)+3\tau/2-(D1+D2)$$
$$=3\tau/2$$

Thus, in this embodiment, rising of the output clock signal CKH is delayed as much as τ/2 to the external clock signal CK. That is, as shown in FIG. 22, a clock signal, which is delayed as much as half period to the external clock signal CK, can be generated.

Figure 23:
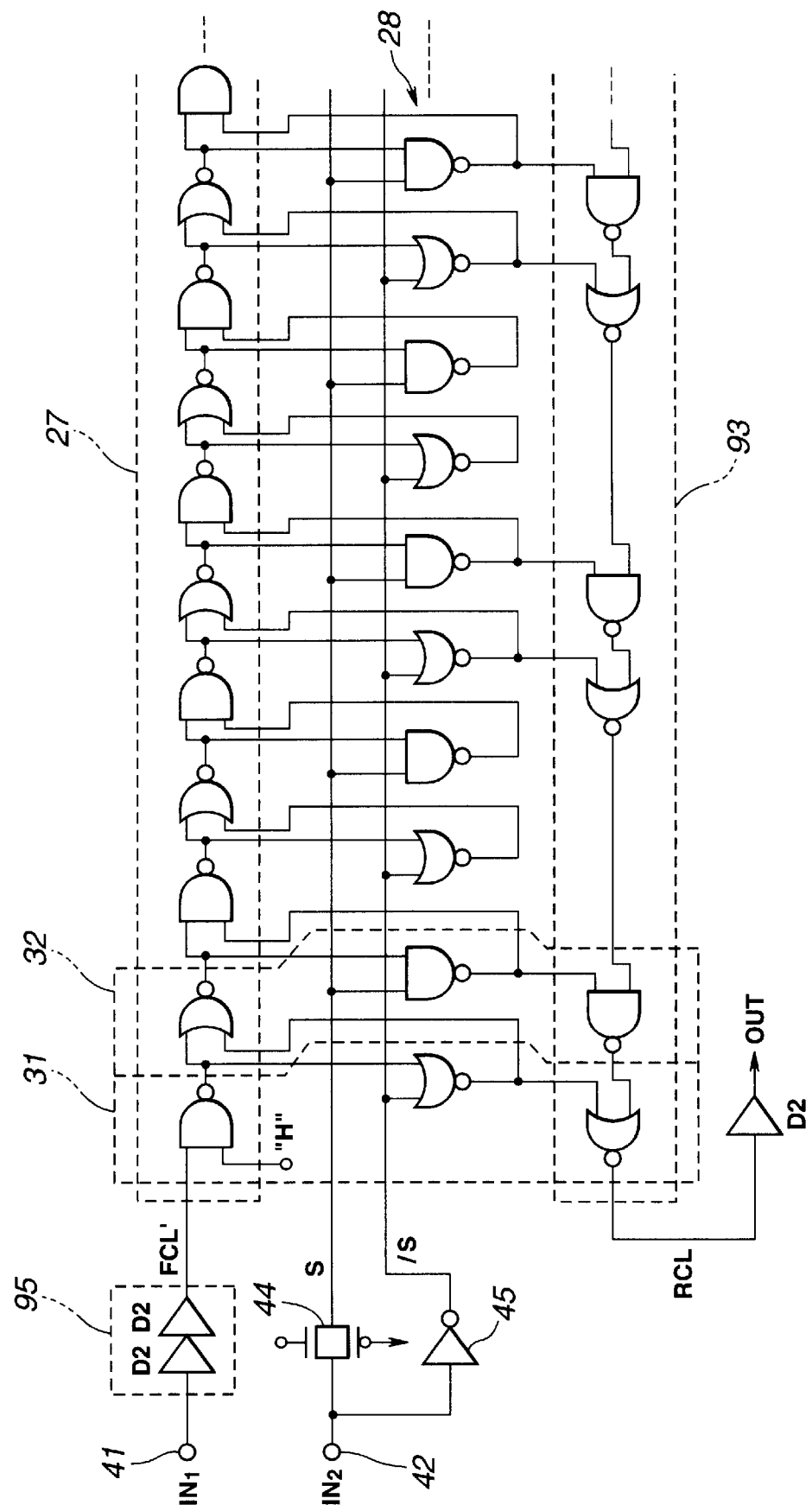
FIG. 23 is a circuit diagram showing another embodiment of the present invention.

FIG. 23 is a block diagram to show another embodiment of the present invention. In FIG. 23, the same elements as those in FIG. 11 and FIG. 21 are given the same reference numerals and description about them is omitted. This embodiment is to generate clock signals CKQ, CK3Q, which are delayed as much as τ/4 period or 3τ/4 period to the external clock signal CK by inputting the internal clock signal CK' synchronized with the external clock signal CK and the clock signal CKH delayed as much as half period to the external clock signal CK.

This embodiment differs from that in FIG. 11 in points that a delay circuit 95 is adopted instead of the delay circuit 43, and the rearward-pulse delay line 93 is adopted instead of the rearward-pulse delay line 29. To the input terminals 41, 42, the clock signals IN1, IN2 are inputted. Clock signals used as the clock signals IN1, IN2 are, for example, a clock signal CKH, which is delayed as much as half period to the external clock signal CK, or an internal clock signal CK', which is synchronized with the external clock signal CK.

The delay circuit 95 is designed to delay the clock signal IN1 as much as 2D2 and to supply it as forward pulse FCL' to one side of input terminal of the forward-pulse delay circuit 27-1, The path gate 44 is designed to give the clock signal IN2 as pulse s to the control circuits 28-2, 28-4, . . . , and the inverter 45 is designed to give inverted signals of the clock signal IN2 to the control circuits 28-1, 28-3, . . . as pulse /s.

Figure 24:
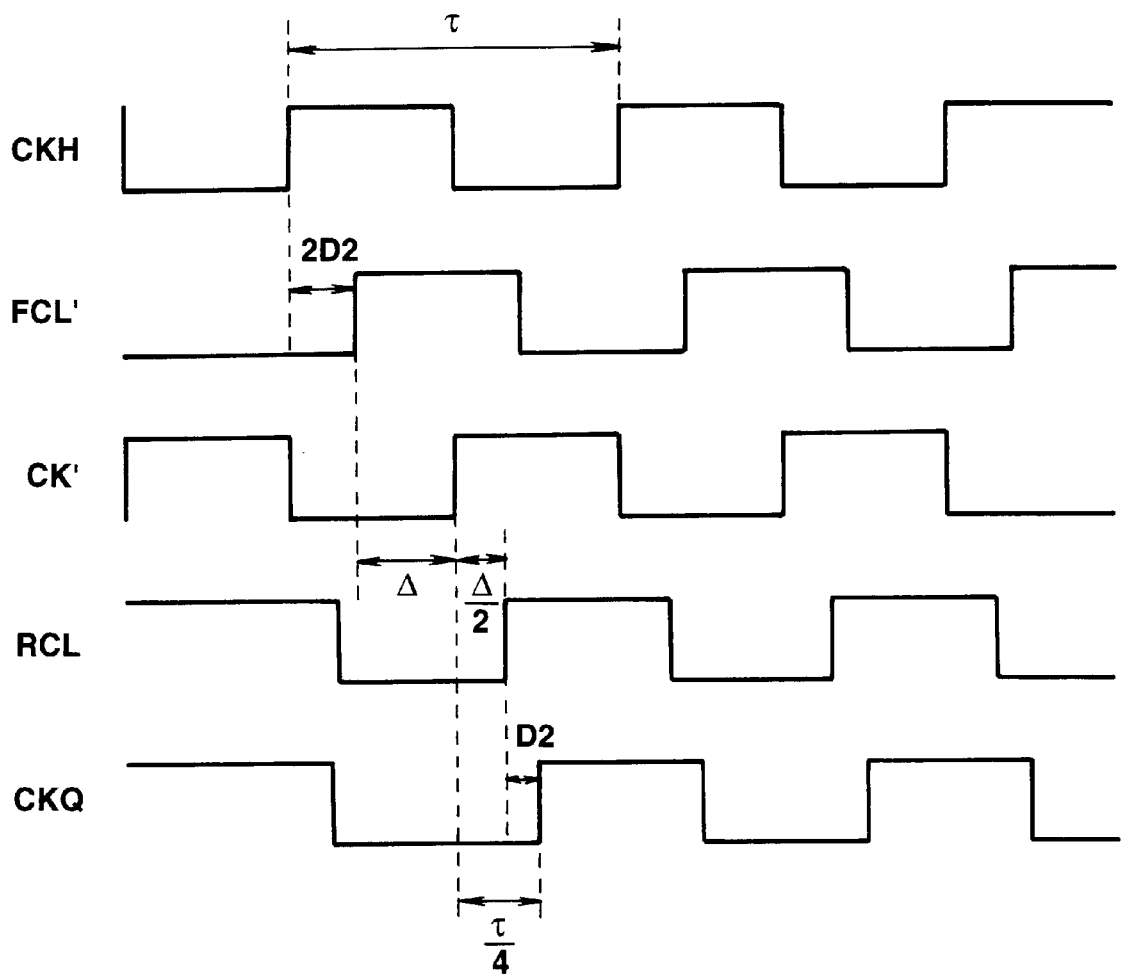
FIG. 24 is a waveform diagram illustrating the operation of the embodiment in FIG. 23.
Figure 25:
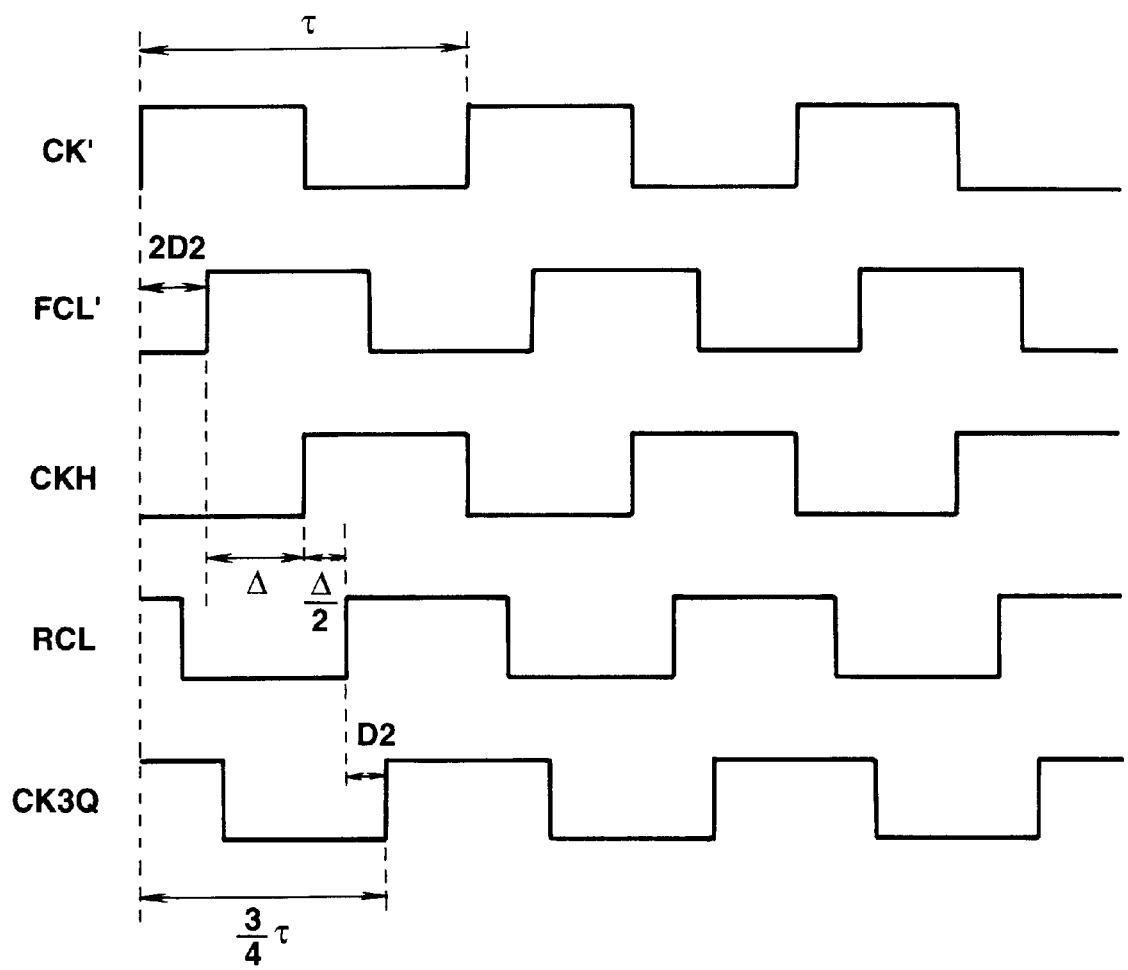
FIG. 25 is a waveform diagram illustrating the operation of the embodiment in FIG. 23.

Next, the operation of an embodiment configured in such a manner will be described with reference to the operating waveform diagrams in FIG. 24 and FIG. 25. FIG. 24 shows the clock signal CKH to be inputted to the input terminal 41, forward pulse FCL', the clock signal CK' to be inputted to the input terminal 42, rearward pulse RCL and the clock signal CKQ which is the output OUT from the output buffer 6. FIG. 25 shows the clock signal CK' to be inputted to the input terminal 41, forward pulse FCL', the clock signal CKH to be inputted to the input terminal 42, rearward pulse RCL and the clock signal CK3Q which is the output OUT from the output buffer 6. FIG. 24 shows an example where the clock signal CKQ is generated to be delayed as much as τ/4 to the external clock signal CK, and FIG. 25 shows an example where the clock signal CK3Q is generated to be delayed as much as 3τ/4 to the external clock signal CK.

First, a description will be given on a case where a clock signal CKQ, which is delayed as much as τ/4 to the external clock signal CK, is generated. In this case, a clock signal CKH, which is delayed as much as half period to the external dock signal CK, is used as the clock signal IN1, and as the clock signal IN2, a clock signal CK', which is synchronized with the external clock signal CK, is used.

The clock signal CKH (FIG. 24) inputted through the input terminal 41 is delayed by the delay circuit 95 as much as 2D2, and supplied to the forward-pulse delay line 27 as forward pulse FCL' shown in FIG. 24. Meanwhile, the clock signal CK' inputted through the input terminal 42 is supplied to the control circuits 28-1, 28-3, . . . through the inverter 45 as pulse /s as well as to the control circuits 28-2, 28-4, . . . through the path gate 44 as pulse s.

During the time of "L" of the clock signal CK' (pulse s), the forward-pulse delay line 27 propagates forward pulse FCL'. When the clock signal CK' (pulse s) rises after the time Δ from the rising of the forward pulse FCL', propagation of forward pulse FCL' stops and propagation of rearward pulse starts. The time Δ for forward pulse FCL' to propagate by the forward-pulse delay line 27 is, as shown in FIG. 24, (τ/2−2D2)

Rising edge of rearward pulse is, after the clock signal CK' became "H", propagated by the rearward-pulse delay line 93 as much time as Δ/2, and outputted from the rearward-pulse delay circuit 93-1 in the first stage. Rearward pulse RCL from the rearward-pulse delay line 93 is delayed by the output buffer 6 as much time as D2 and outputted.

Accordingly, the output clock signal CKQ from the output buffer 6 is delayed to the clock signal CKH as much as:

$$2D2+(\tau/2-2D2)+(\tau/2-2D2)/2+D2$$
$$=\tau2+\tau/4$$
$$=3\tau/4$$

As the clock signal CKH is delayed to the external clock signal CK as much as τ/2, the delay time of the output clock signal CKQ to the external clock signal CK is:

$$\tau2+3\tau/4$$
$$=5\tau/4$$

Accordingly, as shown in FIG. 24, the clock signal CKQ, which is delayed as much as τ/4 to the external clock signal CK, is available.

Next, a description will be given on a case where a clock signal CK3Q, which is delayed as much as 3τ/4 to the external clock signal CK, is generated. In this case, the clock signal CK', which is synchronized with the external clock signal CK, is used as the clock signal IN1, and as the clock signal IN2, the clock signal CKH, which is delayed to the external clock signal CK as much as half period is used.

The clock signal CK', shown in FIG. 25, is supplied to the delay circuit 95 through the input terminal 41 to be delayed as much as 2D2. The output of the delay circuit 95 is supplied to the forward-pulse delay line 27 as forward pulse FCL', shown in FIG. 25. Meanwhile, to the input terminal 42, the clock signal CKH is inputted.

During the time when the clock signal CKH (pulse s) is "L", forward pulse FCL' propagates by the forward-pulse delay line 27. When the clock signal CKH (pulse s) rises after the time Δ from the rising of the forward pulse FCL', propagation of forward pulse FCL' stops, and propagation of rearward pulse starts. The time Δ for forward pulse FCL' to propagate by the forward-pulse delay line 27 is, as shown in FIG. 25, (τ/2–2D2).

Rising edge of rearward pulse is, after the clock signal CKH became "H", propagated by the rearward-pulse delay line 93 for the time Δ/2, and outputted from the rearward-pulse delay circuit 93-1 in the first stage. Rearward pulse RCL from the rearward-pulse delay line 93 is delayed by the output buffer 6 as much time as D2, and outputted as the output clock signal CK3Q.

Delay time of the clock signal CK3Q to the clock signal CK' is, as shown in FIG. 25:

$$2D2+(\tau/2-2D2)+(\tau/2-2D2)/2+D2$$
$$=\tau/2+\tau/4$$
$$=3\tau/4$$

As the clock signal CK' is synchronized with the external clock signal CK, delay time of the output clock signal CK3Q to the external clock signal CK also becomes 3τ/4. Thus, the clock signal CK3Q, which is delayed as much as 3τ/4 to the external clock signal CK, can be generated.

Thus, in this embodiment, by inputting the internal clock signal CK', which is synchronized with the external clock signal CK, and the clock signal CKH, which is delayed as much as half period to the external clock signal CK, a clock signal, which is delayed as much as τ/4 or 3τ/4 to the external clock signal CK, can be generated.

Figure 26:
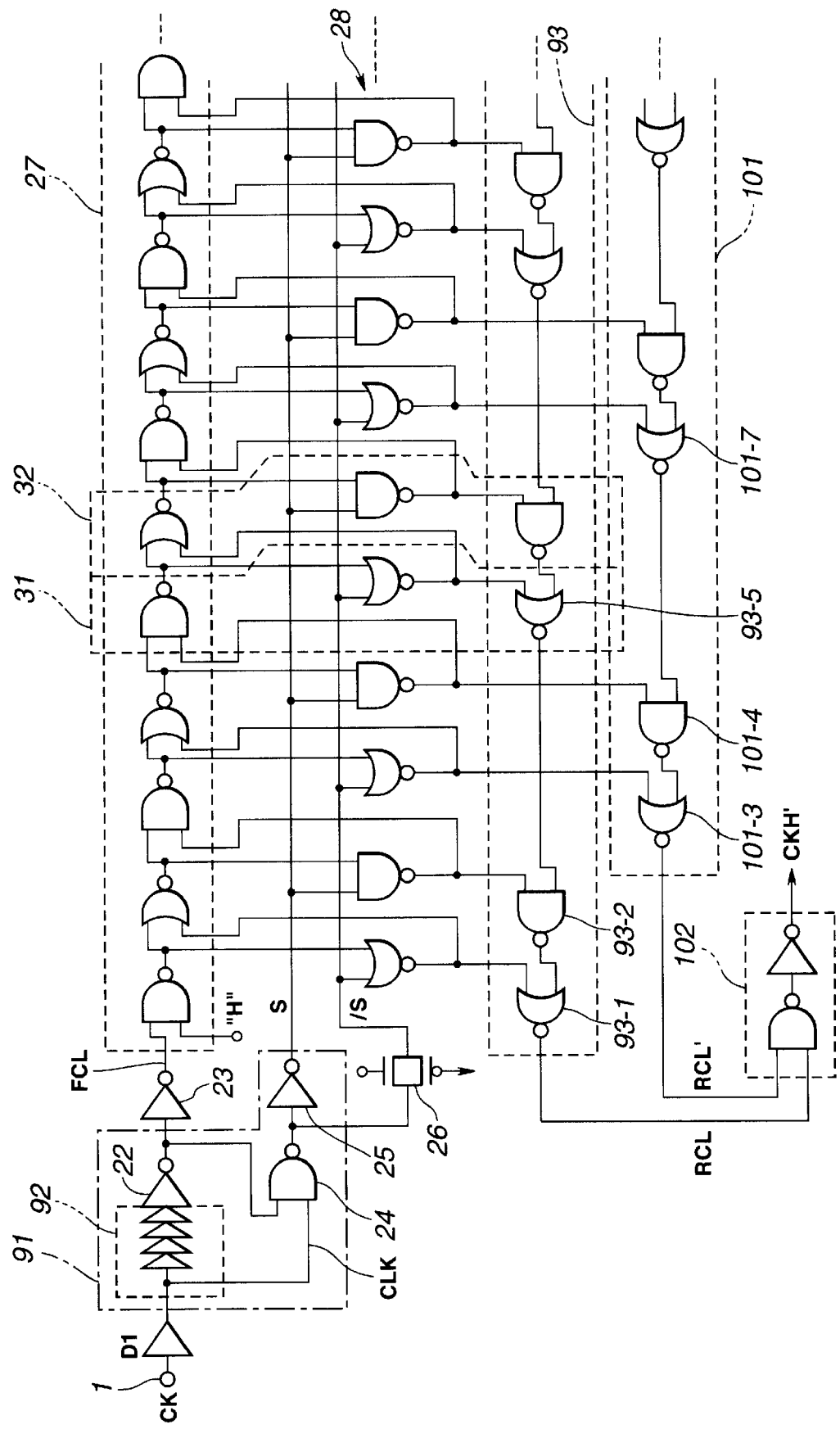
FIG. 26 is a circuit diagram showing another embodiment of the present invention.

FIG. 26 is a block diagram to show another embodiment of the present invention. In FIG. 26, the same elements as those in FIG. 21 are given the same reference numerals and description about them is omitted. In this embodiment, compared to that in FIG. 21, synchronization accuracy is improved, almost doubled.

This embodiment differs from that in FIG. 21 in points that a rearward-pulse delay line 101 configured similarly to the rearward-pulse delay line 93 is added, and an AND circuit 102 having a delay time of D2 is adopted instead of the output buffer 6.

That is, while, in the rearward-pulse delay line 93, the rearward-pulse delay circuits 93-1, 93-2, 93-5, 93-6, . . . are provided in the 1st stage, 2nd stage, 5th stage, 6th stage,..., in the rearward-pulse delay line 101, the rearward-pulse delay circuits 101-3, 101-4, 101-7, 101-8, . . . are provided in the 3rd stage, 4th stage, 7th stage, 8th stage . . . .

The output of the rearward-pulse delay lines 93, 101 is designed to be supplied to the AND circuit 102 as rearward pulse RCL, RCL' respectively. The AND circuit 102 is designed to carry out AND operation on rearward pulse RCL, RCL' and to output operated results as the output clock signal CKH'.

An OR circuit may be used instead of the AND circuit 102. In this case, too, a similar output clock signal CKH' is available.

Next, the operation of an embodiment configured in such a manner will be described.

In this embodiment, too, similarly to that in FIG. 21, during the time while pulse s is "L", forward pulse FCL propagates by the forward-pulse delay line 27, and at the time after (τ–A) from the rising of the forward pulse FCL, pulse s rises, and rearward pulse is generated at the same time as propagation of forward pulse stops.

In either of the rearward-pulse delay lines 93, 101, as the number of elements is ½ of that of the forward-pulse delay line 27, the number of stages, where rearward pulse propagates, is ½ of the number of stages where forward pulse propagates. Accordingly, rising edge of rearward pulse RCL, RCL', which propagate by the rearward-pulse delay lines 93, 101 and are outputted, is generated at almost similar timing each other. The AND circuit 102 carries out AND operation on these rearward pulse RCL, RCL', and outputs the clock signal CKH' which is in almost the same phase as that of the clock signal CKH shown in FIG. 22 (f).

Next, the reason why synchronization accuracy is almost doubled in this embodiment compared to that in FIG. 21 will be described.

First, synchronization accuracy in the embodiment in FIG. 21 will be described.

The forward-pulse delay line 27 propagates forward pulse as much time as (τ–A). Actually, however the time for the forward-pulse delay line 27 to propagate forward pulse is a time obtained by multiplying forward-pulse delay circuits integral times, causing an error ε between this and the time (τ–A). Now, suppose that the time (τ–A) is T, and either delay time of forward-pulse delay circuits by NAND circuits or NOR circuits is Δdu.

If forward pulse is propagated up to the m-th stage during the time (τ–A) which is a time from input of forward pulse to the forward-pulse delay line 27 to rising of pulse s, the following equation (2) holds good:

$$T-\Delta du \times m = \epsilon \quad (2)$$

On the error ε, the following equation (3) holds good:

$$0 \leq \epsilon < \Delta du \quad (3)$$

Meanwhile, at the rearward-pulse delay line 93, it is tried to delay the rearward pulse as much as T/2. From equation (2) above, T/2 is expressed by the following equation (4):

$$T/2=(\Delta du \times m)/2+\epsilon/2 \quad (4)$$

On the other hand, the rearward-pulse delay line 93 can propagate rearward pulse only for a delay time which is the delay time of rearward-pulse delay circuits multiplied integral times. Now, suppose that the error, which arises when rearward pulse is propagated by the rearward-pulse delay line 93 as much as (Δdu×m)/2, is ζ, and the delay time of rearward-pulse delay circuits is, similarly to that of forward-pulse delay circuits, Δ du. When rearward pulse is propagated (n) stages of rearward-pulse delay circuits, and is outputted from the rearward-pulse delay line 93, the following equation (5) holds good:

$$(\Delta du \times m)/2 = \Delta du \times n + \zeta \quad (5)$$

Now, where m=2k, the following equation holds good:

$$n=k, \zeta=0 \quad (6)$$

And, where m=2k+1, $$n=k, \zeta=\Delta du/2 \quad (7)$$

Accordingly, equation (4) above, from equations (5)–(7), goes, as follows:

$$T/2 = \Delta du \times k + \zeta + \epsilon/2$$

The error $\zeta+\epsilon/2$, which arises during the time between input of forward pulse and the output of rearward pulse, satisfies the following equation (8) which is based on equation (6) and equation (7):

$$0 \leq \zeta+\epsilon/2 < \Delta du/2 + \Delta du/2 = \Delta du \quad (8)$$

Next, accuracy in this embodiment will be described.

In this embodiment, in addition to the rearward-pulse delay line 93, the rearward-pulse delay line 101 is added. Accordingly, either output of the rearward-pulse delay line 93 or of the rearward-pulse delay line 101 meets above equation (6). Consequently, AND operation on the output of the rearward-pulse delay lines 93, 101 gives $\zeta=0$, and equation (8) above can be changed into the following equation (9):

$$0 \leq \zeta+\epsilon/2 < 0 + \Delta du/2 = \Delta du/2 \quad (9)$$

As apparent from equation (8) and equation (9) above, the error $\zeta+\epsilon/2$ in this embodiment is a half of the error $\zeta+\epsilon/2$ in the embodiment in FIG. 21.

Thus, in this embodiment, by adding the rearward-pulse delay line 101 having similar configuration to that of the rearward-pulse delay line 93, and carrying out AND operation on the output of the rearward-pulse delay lines 93, 101, synchronization accuracy can be improved almost twice compared to that in the embodiment in FIG. 21. Similar advantages are available even when OR operation is performed on the output of the rearward-pulse delay lines 93, 101.

Figure 27:
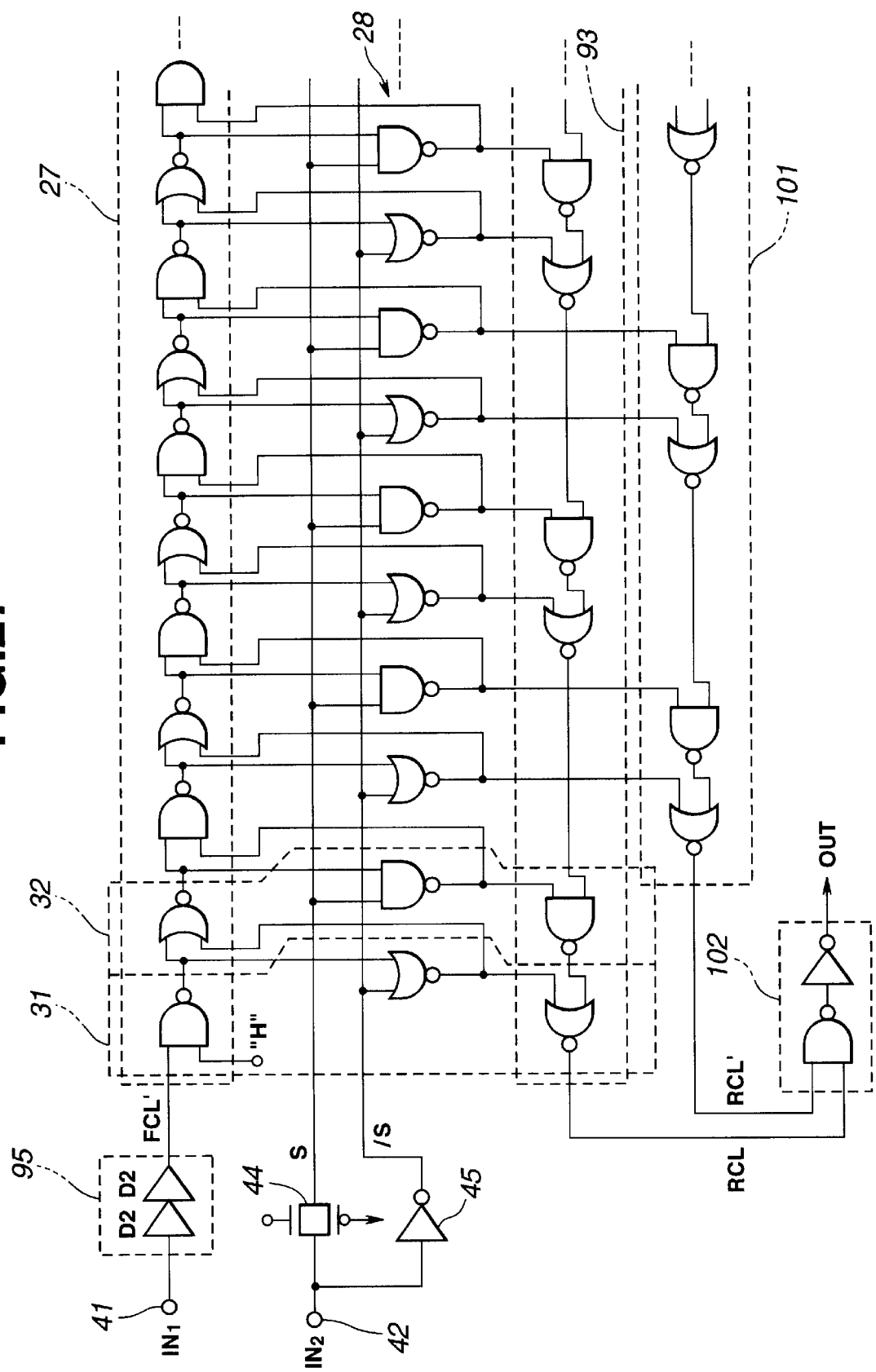
FIG. 27 is a circuit diagram showing another embodiment of the present invention.

FIG. 27 is a circuit diagram to show another embodiment of the present invention. In FIG. 27, the same elements as those in FIG. 23 and FIG. 26 are given the same reference numerals and description about them is omitted. This embodiment is as example where synchronization accuracy in the embodiment in FIG. 23 is about twice improved.

This embodiment differs from that in FIG. 23 in points that the rearward-pulse delay line 101, which is configured similarly to the rearward-pulse delay line 93, is added, and the AND circuit 102, whose delay time is D2, is adopted instead of the output buffer 6.

The AND circuit 102 may be replaced with an OR circuit. In this case, too, a similar output clock signal OUT is available.

In the embodiment configured in such a manner, from the rearward-pulse delay line 101, output RCL', which is similar to output RCL of the rearward-pulse delay line 93, is obtained, and from the AND circuit 102, a clock signal, which is similar to the output clock signal OUT of the output buffer 6 in FIG. 23, is available. That is, in this embodiment, by using the clock signal CKH, which is delayed as much as half period to the external clock signal CK, as the input signal IN1, and the clock signal CK', which is synchronized with the external clock signal CK, as the input signal IN2, a clock signal CKQ, which is delayed as much as τ/4 to the external clock signal CK, can be generated. In addition, by using the clock signal CK', which is synchronized with the external clock signal CK, as input signal IN1, and the clock signal CKH, which is delayed as much as half period to the external clock signal CK, as input signal IN2, a clock signal CK3Q, which is delayed as much as 3τ/4 to the external clock signal CK, can be generated.

In this embodiment, too, similarly to that in FIG. 26, synchronization accuracy is twice improved compared to the embodiment in FIG. 23.

Figure 28:
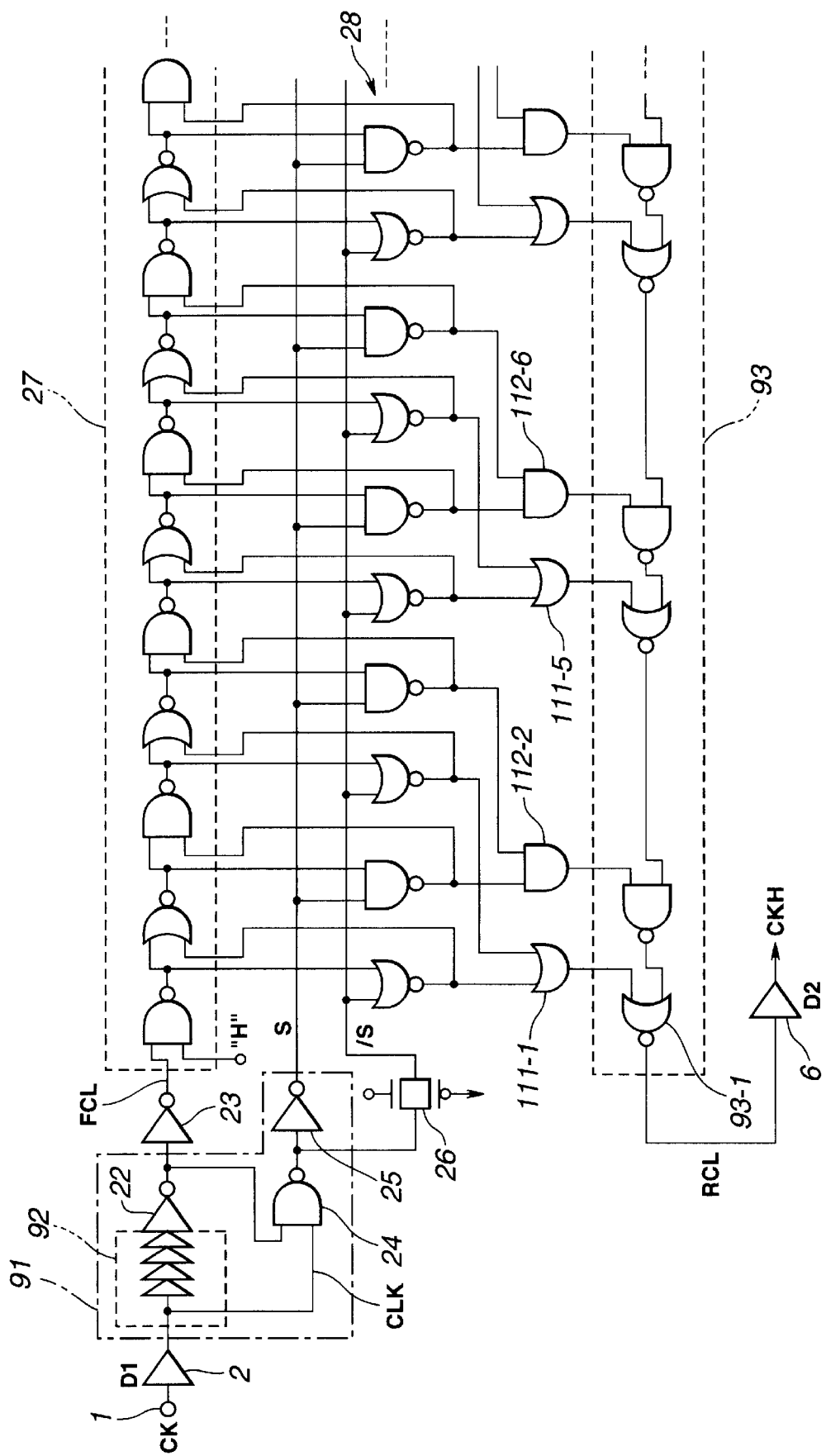
FIG. 28 is a circuit diagram showing another embodiment of the present invention.

FIG. 28 is a block diagram to show another embodiment of the present invention. In FIG. 28, the same elements as those in FIG. 21 are given the same reference numerals and description about them is omitted. In this embodiment, too, it is designed so that a clock signal CKH, which is delayed as much as τ/2, is generated when an external clock signal CK having a period of τ is inputted.

This embodiment differs from that in FIG. 21 in points that OR circuits 111-1, 111-5, 111-9, . . . and AND circuits 112-2, 112-6, 112-10, . . . are provided. The OR circuits 111-1, 111-5, 111-9, . . . are designed to output respectively results of OR operation on control signals in two consecutive odd stages from the control circuit group 28 to the rearward-pulse delay circuits 93-1, 93-5, . . . as control signals, and the AND circuits 112-2, 112-6, 112-10, . . . are designed to output respectively results of AND operation on control signals in two consecutive even stages from the control circuit group 28 to the rearward-pulse delay circuits 93-2, 93-6, . . . as control signals.

In the embodiment configured in such a manner, too, the operation similar to that shown in the operating waveform diagram in FIG. 22 is operated. That is, forward pulse FCL from the inverter 23 is propagated by the forward-pulse delay line 27 as much time as τ−A'. In this embodiment, the output of the control circuits 28-1, 28-3 is supplied to the OR circuit 111-1, and the output of the control circuits 28-2, 28-4 is supplied to the AND circuit 112-2. The OR circuit 111-1 outputs two-input result of OR operation to the rearward-pulse delay circuit 93-1 as a control signal, and the AND circuit 112-2 outputs two-input result of AND operation to the rearward-pulse delay circuit 93-2 as a control signal.

Similarly, the output of two consecutive control circuits in odd stages is given OR operation by an OR circuit, and the operated result is given to the rearward-pulse delay circuits 93-5, 93-9, . . . as a control signal. The output of two consecutive control circuits in even stages is given AND operation by an AND circuit, and the operated result is given to the rearward-pulse delay circuits 93-6, 93-10, . . . as a control signal.

With this, rearward pulse is generated by a control signal in a stage which corresponds to the stage where forward pulse FCL was propagated, and after the time (τ−A')/2 from generation of this rearward pulse, rearward pulse RCL is outputted from the rearward-pulse delay circuit in the first stage 93-1.

Other function is similar to that in the embodiment in FIG. 21.

Thus, this embodiment has advantages that, in addition to the similar effect to that in the embodiment in FIG. 21, it can improve synchronization accuracy between the external clock signal CK and the internal clock signal CK' than in the embodiment in FIG. 21, because it controls the rearward-pulse delay line 93 with the output of the control circuits 28-1, 28-2 in all stages.

As far as a similar effect is available, other circuits may be used instead of the OR circuit 111-n, the AND circuit 112-n.

Figure 29:
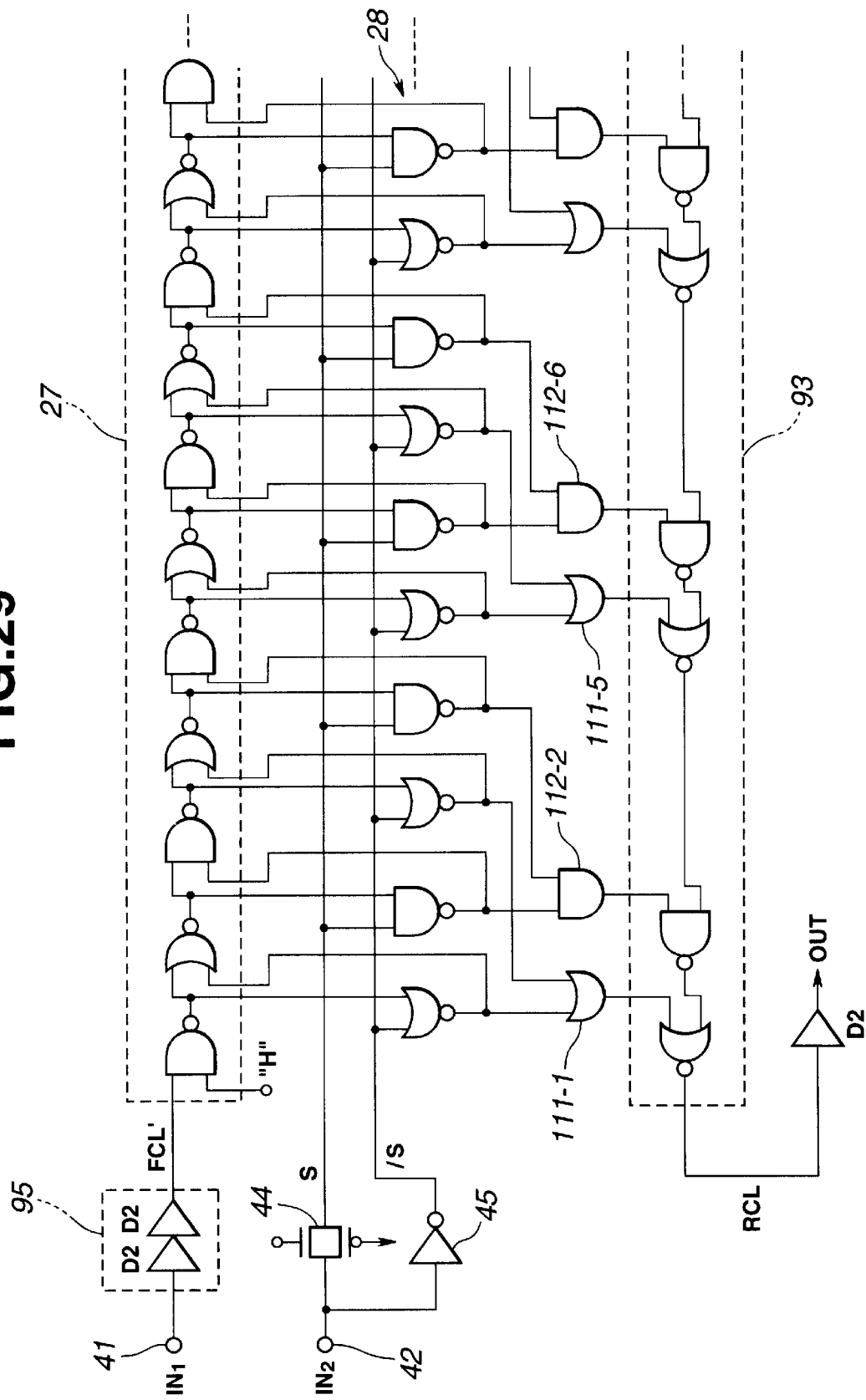
FIG. 29 is a circuit diagram showing another embodiment of the present invention.

FIG. 29 is a circuit diagram to show another embodiment of the present invention. In FIG. 29, the same elements as those in FIG. 23 and FIG. 28 are given the same reference numerals and description about them is omitted.

This embodiment is, similarly to that in FIG. 23, to generate the clock signals CKQ, CK3Q, which are delayed as much as τ/4 period or 3τ/4 period to the external clock signal CK by inputting the internal clock signal CK', which is synchronized with the external clock signal CK, and the clock signal CKH, which is delayed as much as half period to the external clock signal CK.

This embodiment differs from that in FIG. 23 in points that the OR circuits 111-1, 111-5, 111-9, . . . and the AND circuits 112-2, 112-6, 112-10, . . . are provided therein. The OR circuits 111-1, 111-5, 111-9, . . . are designed to output respectively results of OR operation on control signals in two consecutive odd stages from the control circuit group 28 to the rearward-pulse delay circuits 93-1, 93-5, . . . as a control signal. The AND circuits 112-2, 112-6, 112-10, . . . are designed to output respectively results of AND operation on control signals in two consecutive even stages from the control circuit group 28 to the rearward-pulse delay circuits 93-2, 93-6, . . . as a control signal.

In the embodiment configured in such a manner, too, operation similar to that shown in the operating waveform diagrams in FIG. 24 and FIG. 25 is operated. Similarly to the embodiment in FIG. 28, the output of two consecutive control circuits in odd stages is given OR operation by an OR circuit, and the operated result is given to the rearward-pulse delay circuits 93-1, 93-5, . . . as a control signal, and the output of two consecutive control circuits in even stages is given AND operation by an AND circuit, and the operated result is given to the rearward-pulse delay circuits 93-2, 93-6, . . . as a control signal.

Other function is similar to that in the embodiment in FIG. 23.

Thus, this embodiment, too, has advantages that, in addition to the similar effect to that in the embodiment in FIG. 23, it can improve generation accuracy of rearward pulse than in the embodiment in FIG. 23, because it controls the rearward-pulse delay line 93 with the output of the control circuits 28-1, 28-2, . . . in all stages.

As far as a similar effect is available, other circuits may be used instead of the OR circuit 111-n, the AND circuit 112-n.

Figure 30:
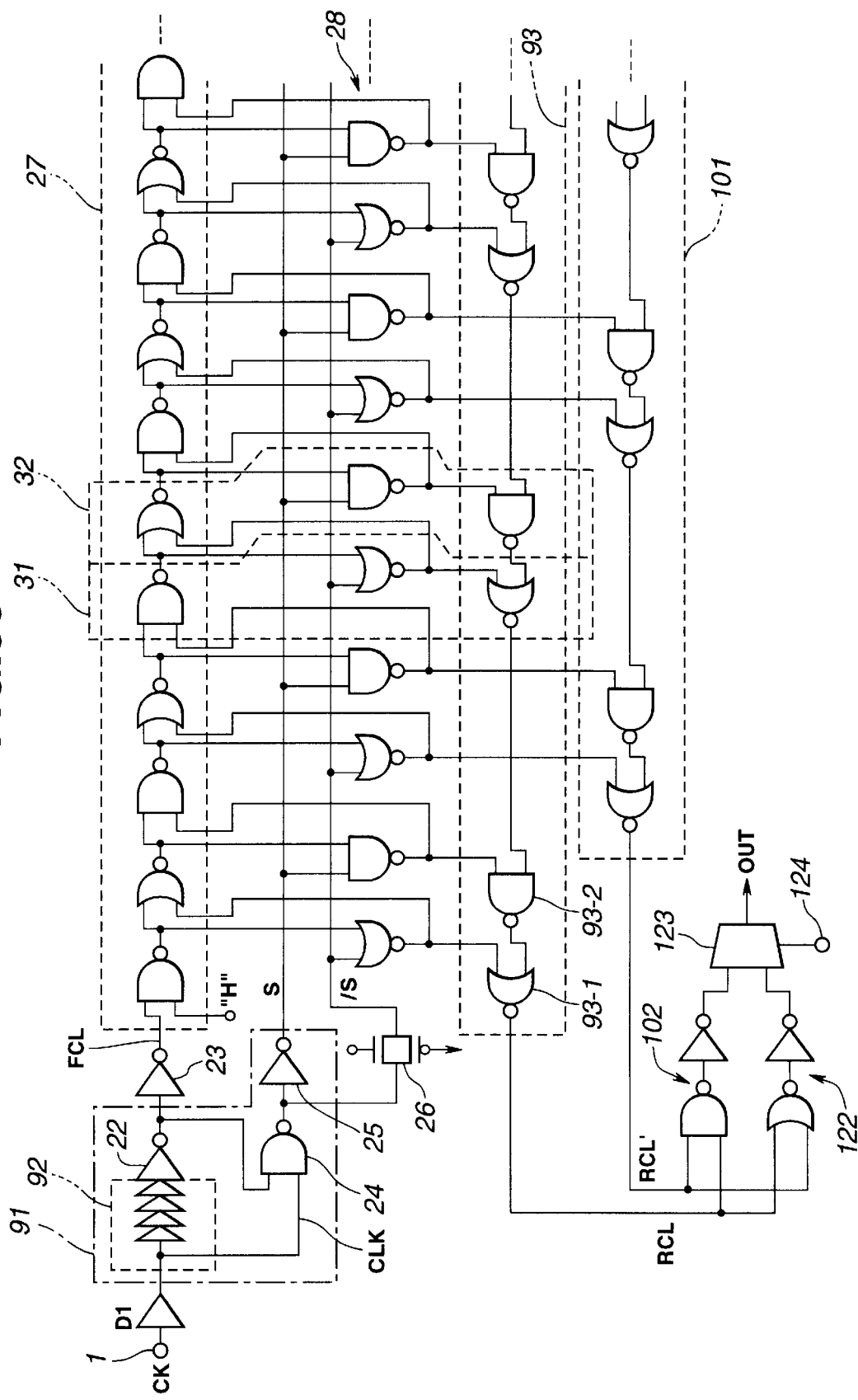
FIG. 30 is a circuit diagram showing another embodiment of the present invention.

FIG. 30 is a circuit diagram to show another embodiment of the present invention. In FIG. 30, the same elements as those in FIG. 26 are given the same reference numerals and description about them is omitted.

This embodiment differs from that in FIG. 26 in points that an OR circuit 122 and a multiplexer 123 are added therein. In the embodiment in FIG. 26, an OR circuit may be used instead of the AND circuit 102. In this case, all required is to add an AND circuit and a multiplexer.

The OR circuit 122 is designed to be given rearward pulse RCL, RCL' from the rearward-pulse delay lines 93, 101, to give OR operation, and to output the operated result to the multiplexer 123. The multiplexer 123 is designed to be given output of the AND circuit 102 and the OR circuit 122, to select one of two-input on the basis of a control signal from terminals, and to output it as an output clock signal CKH'.

The delay time by the AND circuit 102, the OR circuit 122 and the multiplexer 123 is set to be D2.

In the embodiment configured in such a manner, rearward pulse RCL, RCL' from the rearward-pulse delay lines 93, 101 are given AND operation by the AND circuit 102, and at the same time, given OR operation by the OR circuit 122. The multiplexer 123 selects one of the output and outputs it.

Other function is similar to that in the embodiment in FIG. 26.

Thus, this embodiment has advantages that, in addition to the similar effect to that in the embodiment in FIG. 26, it can improve accuracy of the output clock signal CKH' than in the embodiment in FIG. 26.

Figure 31:
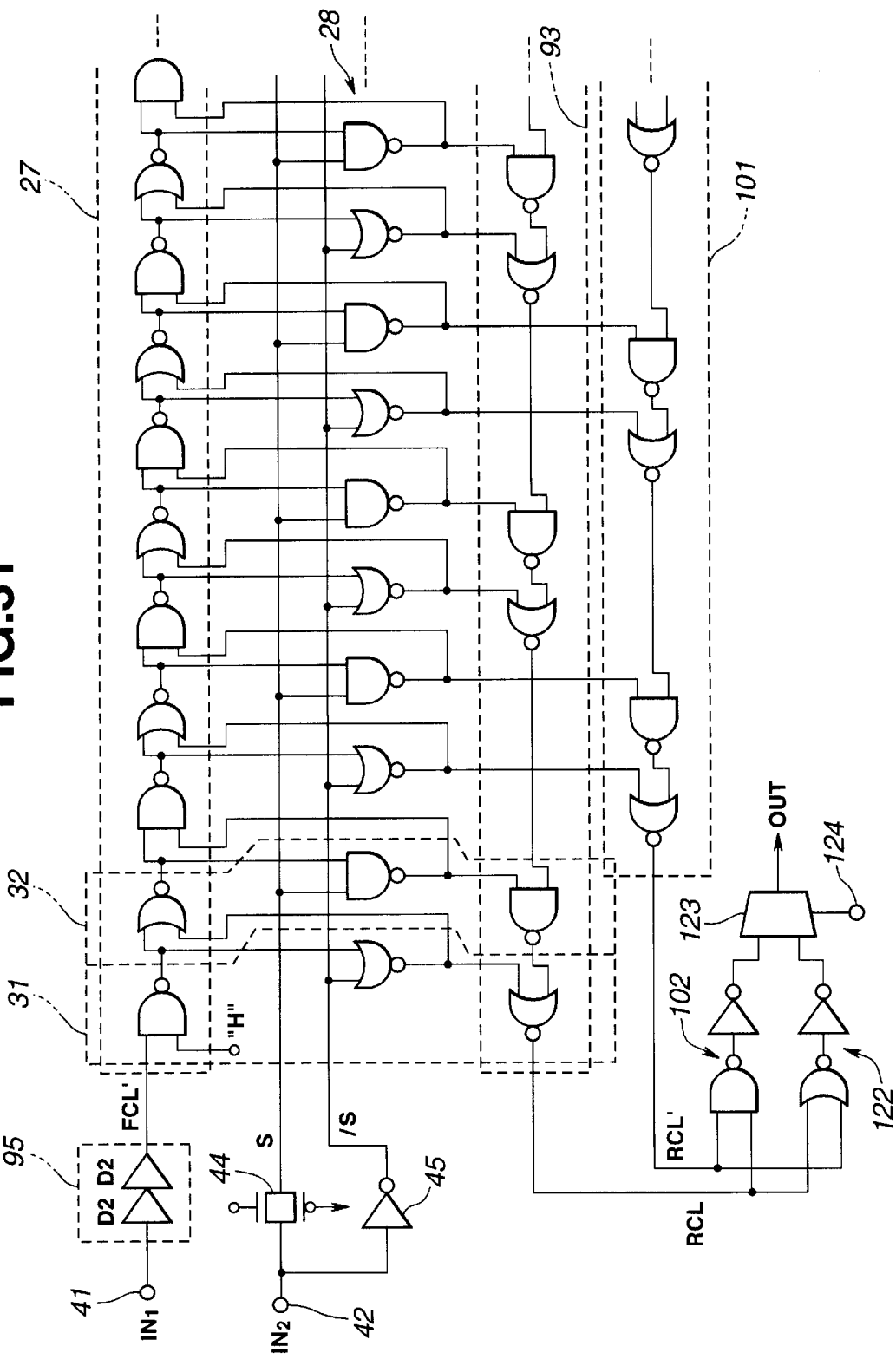
FIG. 31 is a circuit diagram showing another embodiment of the present invention.

FIG. 31 is a circuit diagram to show another embodiment of the present invention. In FIG. 31, the same elements as those in FIG. 27 and FIG. 30 are given the same reference numerals and description about them is omitted.

This embodiment differs from that in FIG. 27 in point that the OR circuit 122 and the multiplexer 123 are added therein. In the embodiment in FIG. 27, an OR circuit may be used instead of the AND circuit 102. In this case, all required is to add an AND circuit and a multiplexer.

In the embodiment in FIG. 31, too, similarly to that in FIG. 30, it is designed so that rearward pulse RCL, RCL' from the rearward-pulse delay lines 93, 101 are given to the AND circuit 102 and the OR circuit 122, and the multiplexer 123 selects the output of the AND circuit 102 and the OR circuit 122 and outputs it.

In the embodiment configured in such a manner, rearward pulse RCL, RCL' from the rearward-pulse delay lines 93, 101 are given AND operation by the AND circuit 102, and at the same time, given OR operation by the OR circuit 122. The multiplexer 123 selects one of the output and outputs it.

Other function is similar to that in the embodiment in FIG. 27.

Thus, this embodiment has advantages that, in addition to the similar effect to that in the embodiment in FIG. 27, it can improve accuracy of the output clock signal OUT than in the embodiment in FIG. 27.

Figure 32:
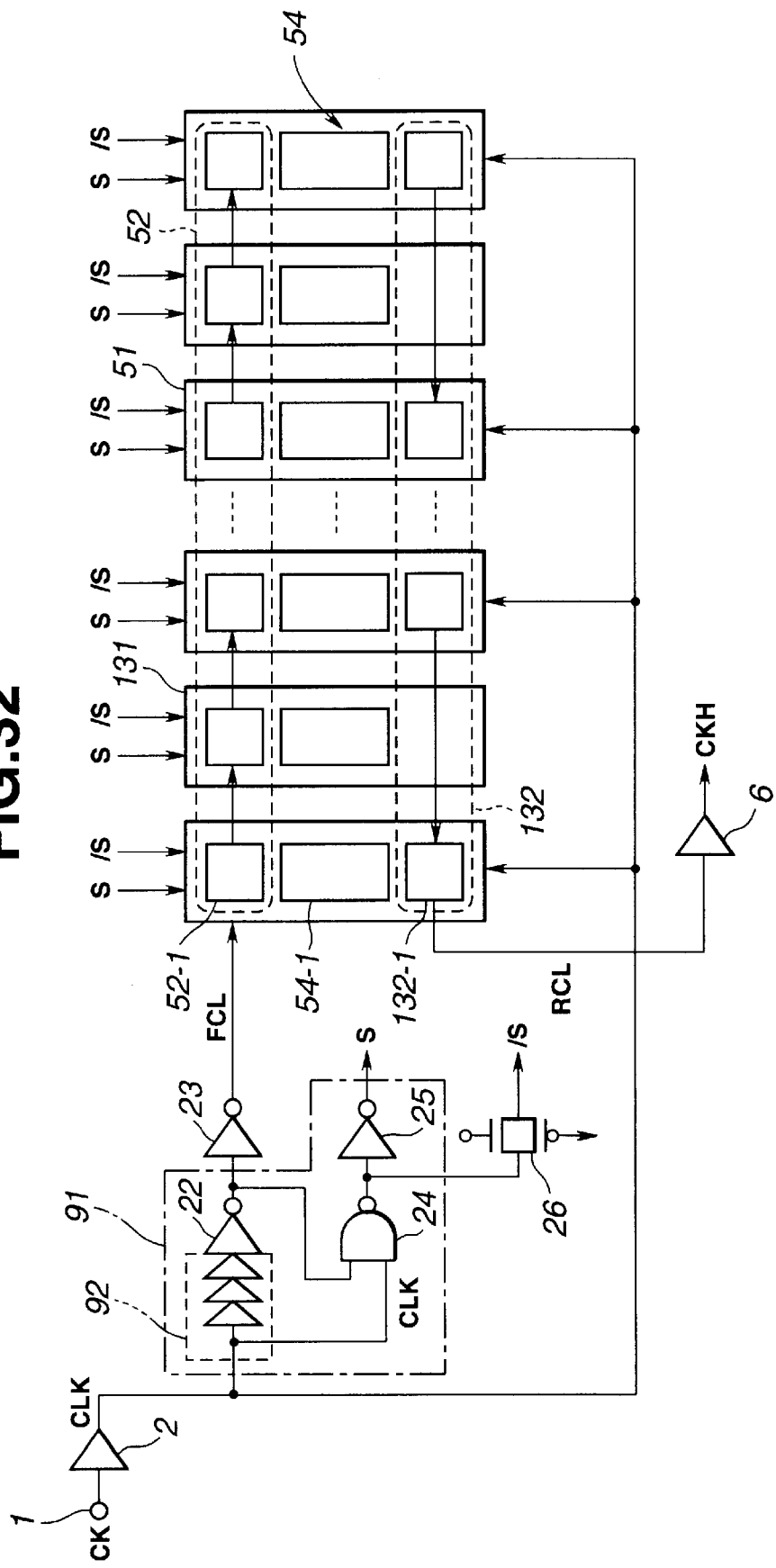
FIG. 32 is a circuit diagram showing another embodiment of the present invention.

FIG. 32 is a circuit diagram to show another embodiment of the present invention. In FIG. 32, the same elements as those in FIG. 15 and FIG. 21 are given the same reference numerals and description about them is omitted.

This embodiment differs from that in FIG. 21 in points that the forward-pulse delay line 52 by STBD, the state-holding circuit group 54 and a rearward-pulse delay line 132 are used instead of the forward-pulse delay line 27, the control circuit group 28 and the rearward-pulse delay line 93 in the embodiment in FIG. 21.

The forward-pulse delay line 52, the state-holding circuit group 54 and the rearward-pulse delay line 132 are composed of delay units 51, 131. The delay unit 51 is configured in the same manner as the circuits shown in FIGS. 16–18. The delay unit 131 differs from the delay unit 51 in point that it does not include rearward-pulse delay circuits.

The rearward-pulse delay line 132 is formed by directly connecting rearward-pulse delay circuits included in the delay unit 51-2k+1 and the delay unit 51-2(k+1)+1. Rearward pulse generated at the rearward-pulse delay line 132 is propagated by the rearward-pulse delay line 132 as much time as to be propagated half the number of stages of the forward-pulse delay line 52 where forward pulse FCL has been propagated, and outputted from the rearward-pulse delay circuit 132-1 in the first stage.

In the embodiment configured in such a manner, too, as shown in the operating waveform diagram in FIG. 22, forward pulse FCL is propagated by the forward-pulse delay line 52 as much time as (τ–A'). Meanwhile, rearward pulse generated at the rearward-pulse delay line 132 is propagated as much time as (τ–A')/2, outputted from the first stage, and supplied to the output buffer 6.

Other function is similar to that in the embodiment in FIG. 21.

Thus, in this embodiment, the embodiment in FIG. 21 can be applied to a device which uses STBD.

Figure 33:
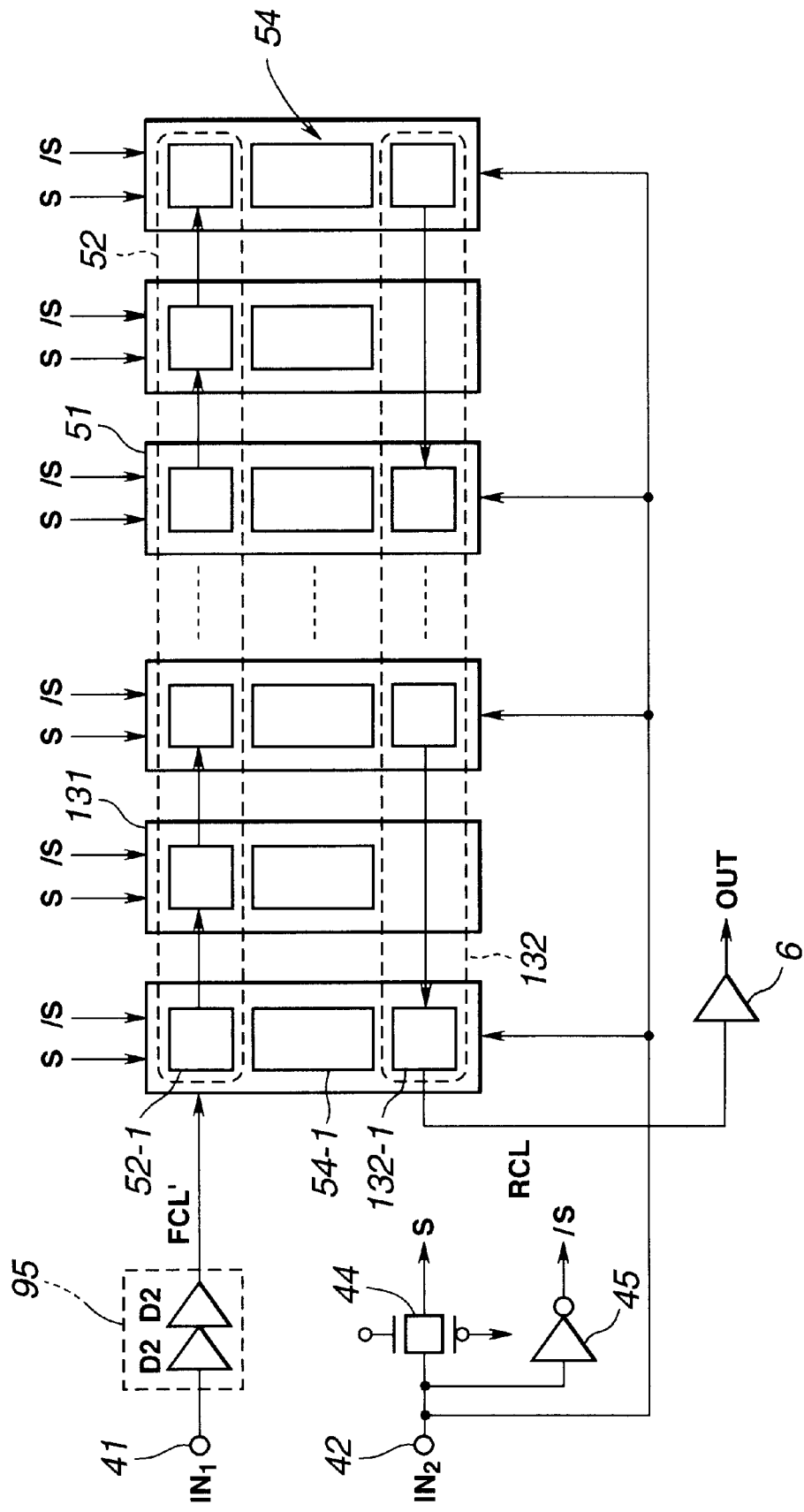
FIG. 33 is a circuit diagram showing another embodiment of the present invention.

FIG. 33 is a circuit diagram to show another embodiment of the present invention. In FIG. 33, the same elements as those in FIG. 23 and FIG. 32 are given the same reference numerals and description about them is omitted.

This embodiment differs from that in FIG. 23 in points that the forward-pulse delay line 52 by STBD, the state-holding circuit group 54 and the rearward-pulse delay line 132 are used instead of the forward-pulse delay line 27, the control circuit group 28 and the rearward-pulse delay line 93 in the embodiment in FIG. 23.

In this embodiment, too, the delay unit 131 does not include rearward-pulse delay circuits, and rearward-pulse delay lines are formed by directly connecting the rearward-pulse delay circuits included in the delay unit 51-2k+1 and the delay unit 51-2(k+1).

Accordingly, the number of delay elements, which compose the rearward-pulse delay line 132, is half of the number of forward-pulse delay circuits which compose the forward-pulse delay line 52.

In the embodiment configured in such a manner, operation is operated similarly to that shown in the waveform diagrams in FIG. 24 and FIG. 25. Forward pulse FCL' is propagated by the forward-pulse delay line 52 as much time as Δ, and rearward pulse is propagated by the rearward-pulse delay line 132 as much time as Δ/2, and outputted from the first stage.

Other function is similar to that in the embodiment in FIG. 23.

Thus, in this embodiment, the embodiment in FIG. 23 can be applied to a device which uses STBD.

Figure 34:
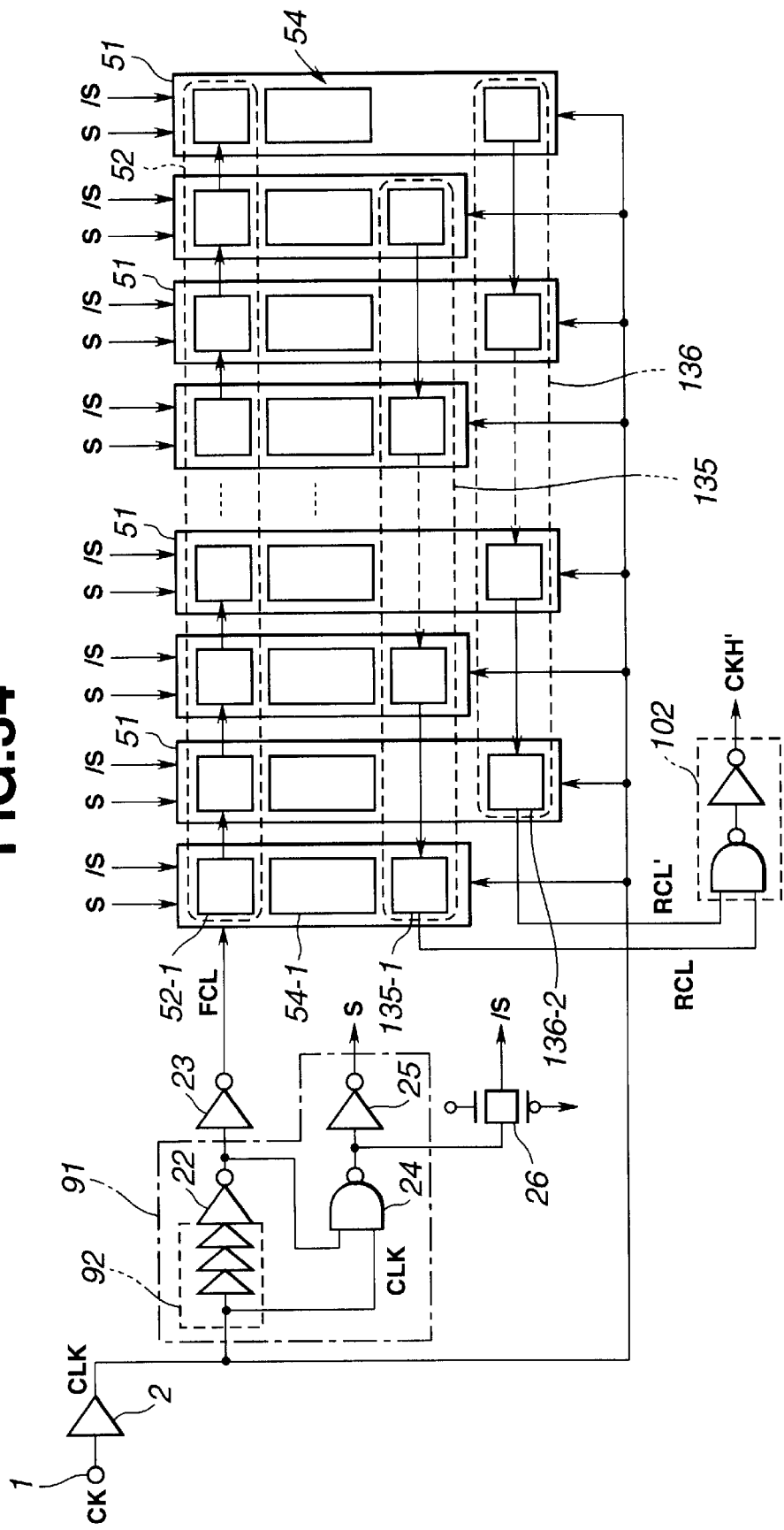
FIG. 34 is a circuit diagram showing another embodiment of the present invention.

FIG. 34 is a circuit diagram to show another embodiment of the present invention. In FIG. 34, the same elements as those in FIG. 15 and FIG. 26 are given the same reference numerals and description about them is omitted.

This embodiment differs from that in FIG. 26 in points that the forward-pulse delay line 52 by STBD, the state-holding circuit group 54 and the rearward-pulse delay lines 135, 136 are used instead of the forward-pulse delay line 27, the control circuit group 28 and the rearward-pulse delay lines 93, 101 in the embodiment in FIG. 26.

Although the delay unit 51, which is similar to that in the embodiment in FIG. 15, is used, it differs from that in FIG. 15 in points that two rearward-pulse delay lines 135, 136 are formed with rearward-pulse delay circuits of the delay unit 51. That is, the rearward-pulse delay line 135 is formed with the rearward-pulse delay circuits 135-1, 135-3, . . . in odd stages, and the rearward-pulse delay line 136 is formed with the rearward-pulse delay circuits 136-2, 136-4, . . . in even stages.

The rearward-pulse delay circuits 135-1, 135-3, . . . in odd stages are designed to output the output of rearward-pulse delay circuits in odd stages in the succeeding stage to rearward-pulse delay circuits in odd stages in the preceding stage, and the rearward-pulse delay circuits 136-2, 136-4, . . . in even stages are designed to output the output of rearward-pulse delay circuits in even stages in the succeeding stage to rearward-pulse delay circuits in even stages in the preceding stage. It is designed so that the output of the rearward-pulse delay circuits 135-1, 136-2 in the first and the second stages is supplied to the AND circuit 102 as rearward pulse RCL, RCL'.

Figure 35:
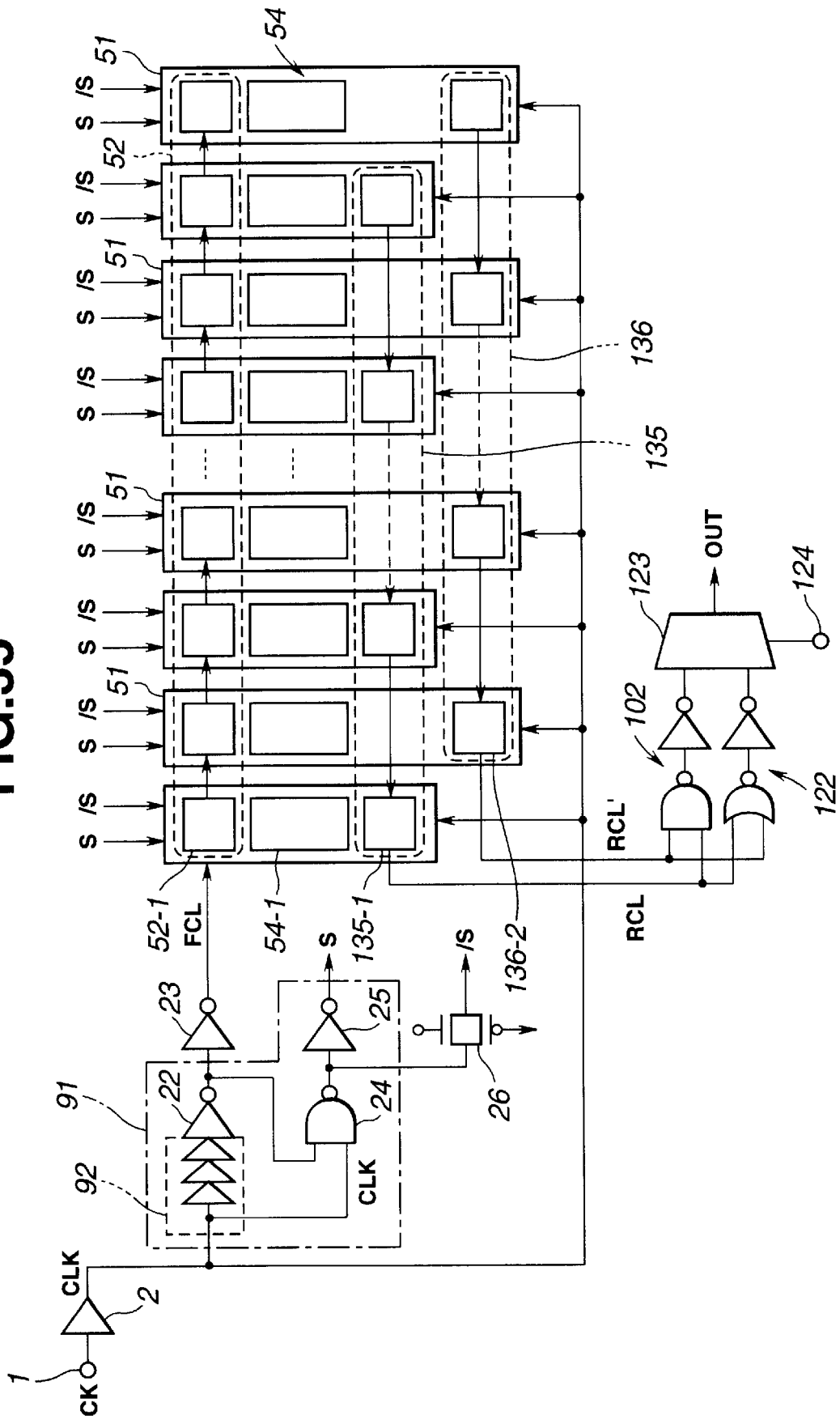
FIG. 35 is a circuit diagram illustrating the embodiment in FIG. 34.

The AND circuit 102 may be replaced with an OR circuit, or, similarly to the embodiment in FIG. 31, a circuit by AND circuits, OR circuits and multiplexers may be used. FIG. 35 shows a circuit in this case.

In the embodiment configured in such a manner, the rearward-pulse delay lines 135, 136 respectively propagate rearward pulse, which was generated for the time which is half of the delay time of forward pulse FCL by the forward-pulse delay line 52, and output it from the rearward-pulse delay circuits 135-1, 136-2 in the first and the second stages. That is, while forward pulse FCL is delayed as much time as (τ–A') by the forward-pulse delay line 52, rearward pulse is generated for as much time as (τ–A')/2 and propagated.

Rearward pulse RCL, RCL' from the rearward-pulse delay lines 135, 136 are given AND operation by the AND circuit 102, and outputted as the clock signal CKH'.

Other function is similar to that in the embodiment in FIG. 26.

Thus, in this embodiment, the embodiment in FIG. 26 can be applied to a device which uses STBD.

Figure 36:
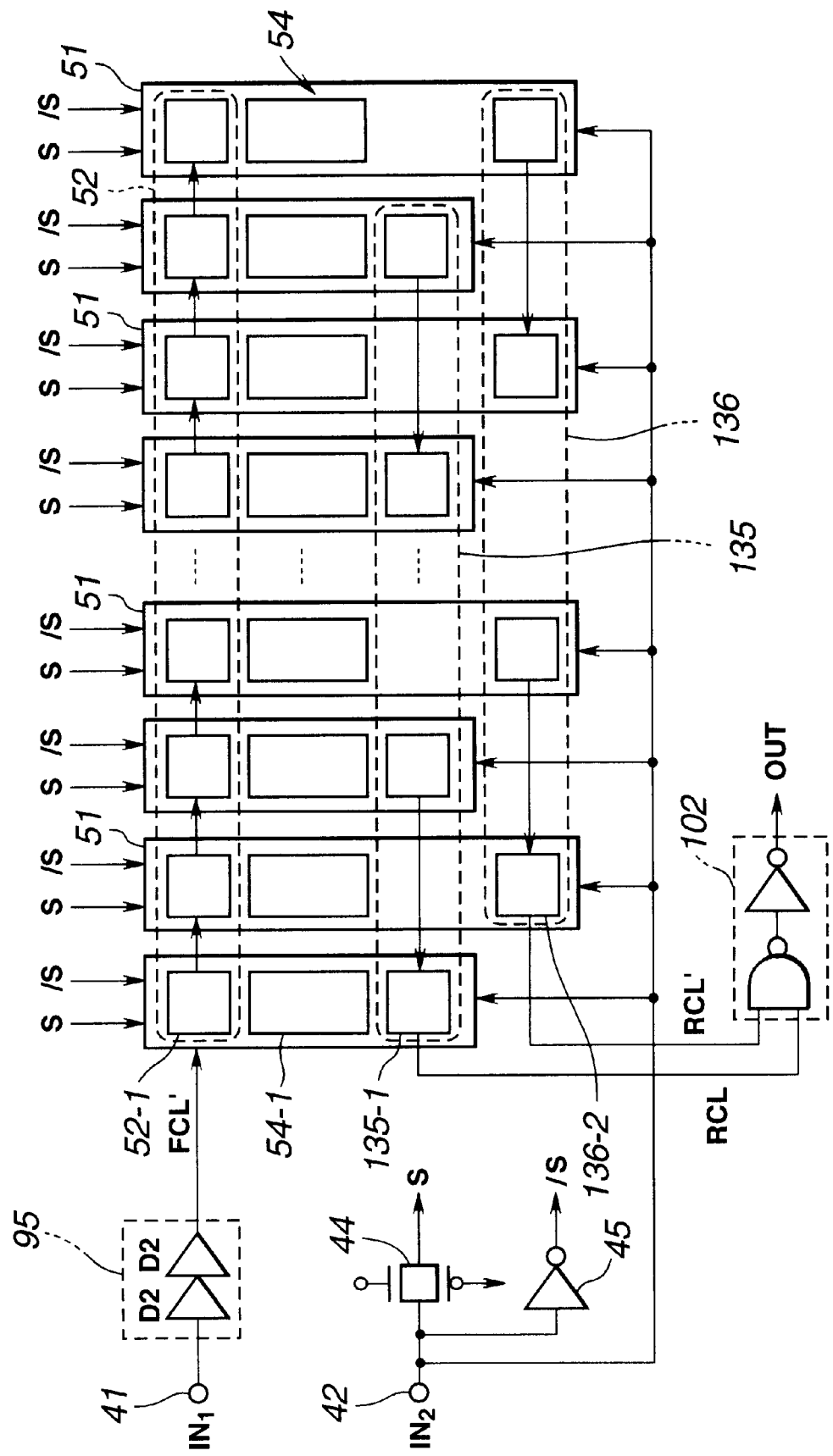
FIG. 36 is a circuit diagram showing another embodiment of the present invention.

FIG. 36 is a circuit diagram to show another embodiment of the present invention. In FIG. 36, the same elements as those in FIG. 27 and FIG. 34 are given the same reference numerals and description about them is omitted.

This embodiment differs from that in FIG. 27 in points that the forward-pulse delay line 52 by STBD, the state-holding circuit group 54 and the rearward-pulse delay lines 135, 136 are used instead of the forward-pulse delay line 27, the control circuit group 28 and the rearward-pulse delay lines 93, 101 in the embodiment in FIG. 27.

In this embodiment, too, the rearward-pulse delay lines 135, 136 are designed to propagate generated rearward pulse as much time as half the propagation time of forward pulse FCL, and to output it.

Figure 37:
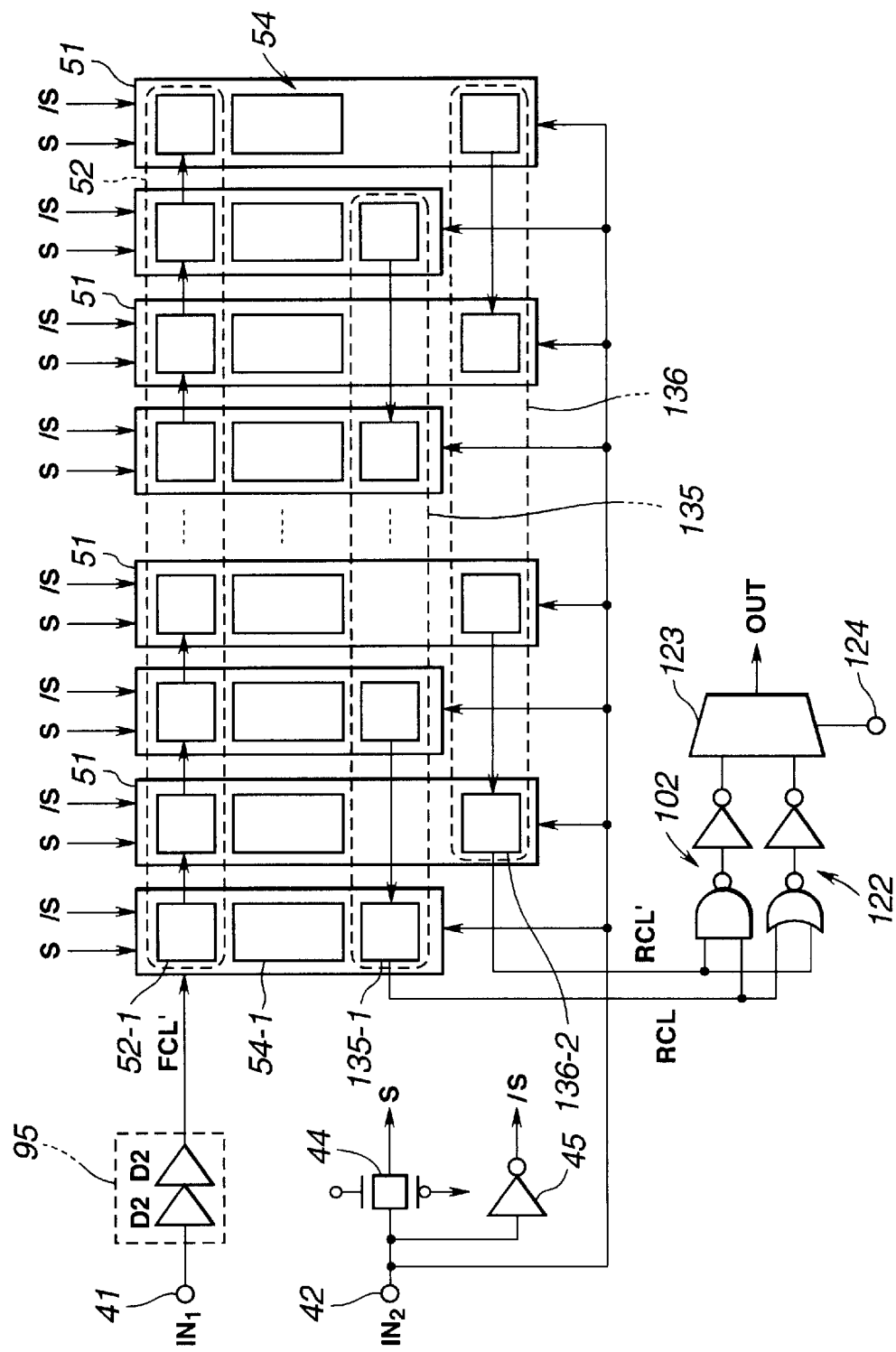
FIG. 37 is a circuit diagram illustrating the embodiment in FIG. 36.

The AND circuit 102 may be replaced with an OR circuit, and, similarly to the embodiment in FIG. 31, a circuit by AND circuits, OR circuits and multiplexers may be used. FIG. 37 shows a circuit in this case.

In the embodiment configured in such a manner, as shown in the waveform diagrams in FIG. 24 and FIG. 25, forward pulse FCL' is propagated by the forward-pulse delay line 52 for as much time as Δ, and rearward pulse is generated at the two rearward-pulse delay lines 135, 136, and after being propagated as much time as Δ/2, outputted from the rearward-pulse delay circuits 135-1, 136-2 in the first or the second stage.

Other function is similar to that in the embodiment in FIG. 27.

Thus, in this embodiment, the embodiment in FIG. 27 can be applied to a device which uses STBD.

Figure 38:
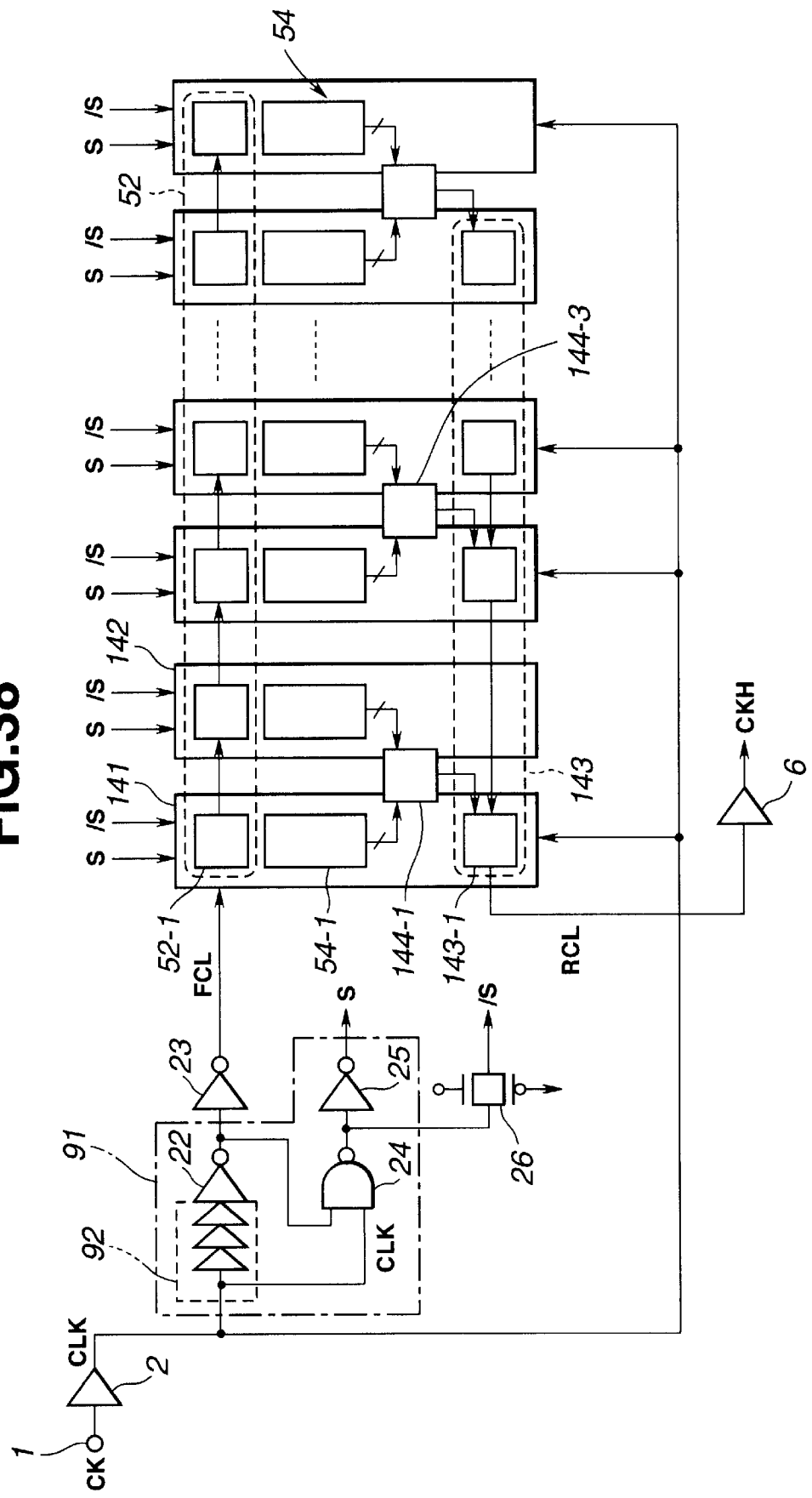
FIG. 38 is a circuit diagram showing another embodiment of the present invention.

FIG. 38 is a circuit diagram to show another embodiment of the present invention. In FIG. 38, the same elements as those in FIG. 15 and FIG. 28 are given the same reference numerals and description about them is omitted.

This embodiment differs from that in FIG. 28 in points that the forward-pulse delay line 52 by STBD, the state-holding circuit group 54 and a rearward-pulse delay line 143 are used instead of the forward-pulse delay line 271, the control circuit group 28 and the rearward-pulse delay lines 93 in the embodiment in FIG. 28.

In this embodiment, the forward-pulse delay lines 52, the state-holding circuit group 54 and the rearward-pulse delay line 143 are formed by cascading delay units 141, 142 alternately. The delay unit 141 has a forward-pulse delay circuit composed in the same configuration as that in FIG. 16, a state-holding circuit composed in the same configuration as that in FIG. 17, and a rearward-pulse delay circuit composed in the same configuration as that in FIG. 18. The delay unit 142 has a forward-pulse delay circuit composed in the same configuration as that in FIG. 16, and a state-holding circuit composed in the same configuration as that in FIG. 17. The delay unit 142 does not include a rearward-pulse delay circuit. A rearward-pulse delay line 143 is formed by directly connecting rearward-pulse delay circuits included in the delay unit 51-2k+1 and the delay unit 51-2(+1)+1.

Further, in this embodiment, logic circuits 144-1, 144-3, . . . are provided to compound the output of each of state-holding circuits of the delay units 141, 142. The logic circuits 144-1, 144-3, . . . are composed of AND circuits or OR circuits or others. They are designed to generate state signals Q, /Q by compounding the output of state-holding circuits in consecutive two stages, and to supply generated state signals Q, /Q to the rearward-pulse delay circuits 143-1, 143-3, . . .

In this embodiment, too, the rearward-pulse delay lines 143 is designed to propagate rearward pulse which is generated for as much time as half of the propagation time of forward pulse FCL, for (τ–A')/2, and to output it from the rearward-pulse delay circuit 143-1 in the first stage.

In the embodiment configured in such a manner, too, operation is operated similarly to that shown in the operating waveform diagram in FIG. 22. In this embodiment, the output of two consecutive state-holding circuits in odd stages is compounded by the logic circuits 144-1, 144-3, . . . , and compounded result is given to the rearward-pulse delay circuits 143-1, 143-3, . . . as state signals Q, /Q.

Thus, rearward pulse generated at the rearward-pulse delay line 143 is propagated through each of the rearward-pulse delay circuits 143-1, 143-3, . . . as much time as (τ–A')/2, and outputted from the rearward-pulse delay circuit 143-1 in the first stage.

Other function is similar to that in the embodiment in FIG. 28.

Thus, in this embodiment, the embodiment in FIG. 28 can be applied to a device which uses STBD.

Figure 39:
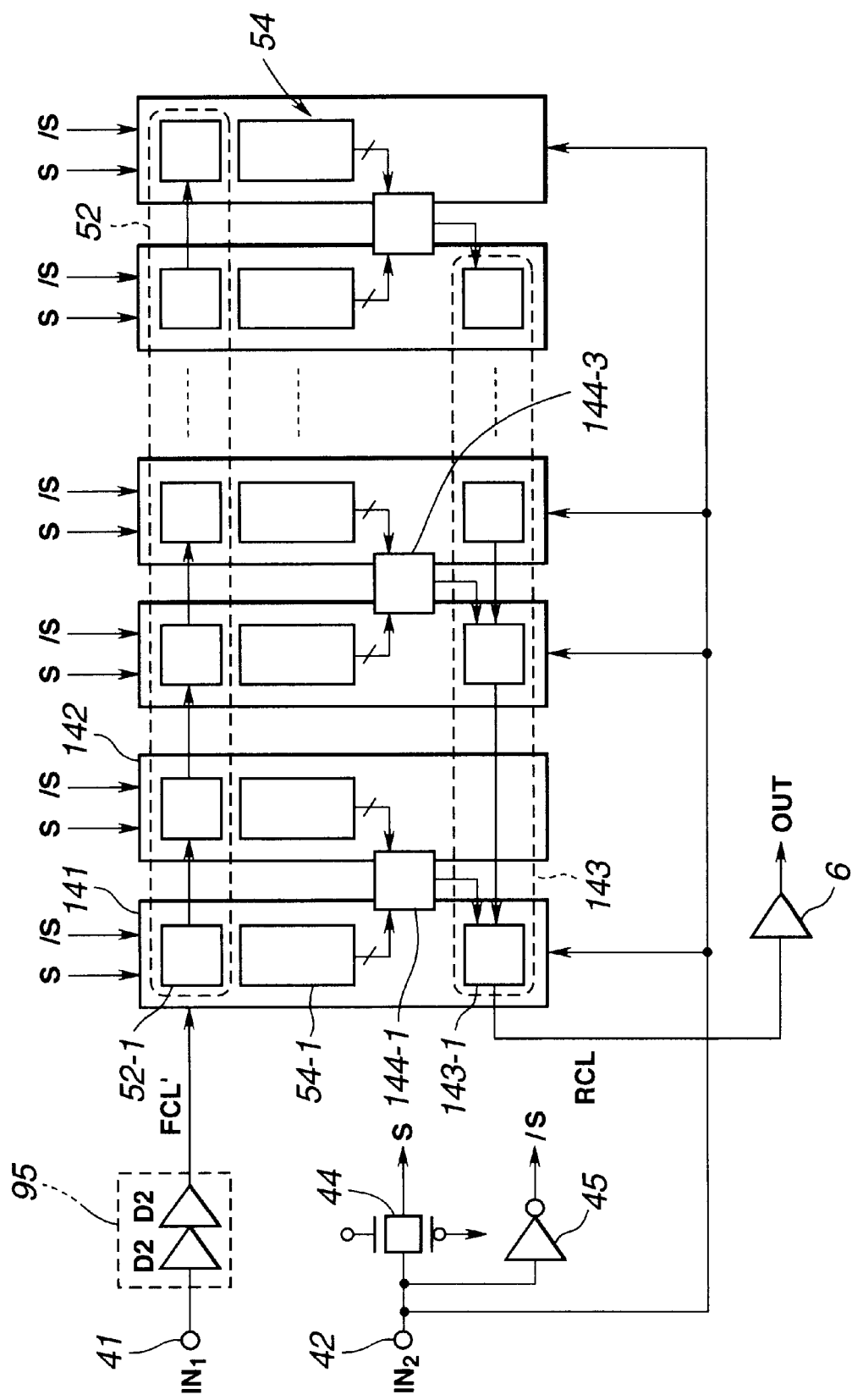
FIG. 39 is a circuit diagram showing another embodiment of the present invention.

FIG. 39 is a circuit diagram to show another embodiment of the present invention. In FIG. 39, the same elements as those in FIG. 29 and FIG. 38 are given the same reference numerals and description about them is omitted.

This embodiment differs from that in FIG. 29 in points that the forward-pulse delay line 52 by STBD, the state-holding circuit group 54 and the rearward-pulse delay line 143 are used instead of the forward-pulse delay line 27, the control circuit group 28 and the rearward-pulse delay lines 93 in the embodiment in FIG. 29.

In this embodiment, too, it is designed to control the rearward-pulse delay circuits 143-1, 143-3, . . . respectively by the logic circuits 144-1, 144-3, . . . , which are to compound the output of state-holding circuits in two consecutive stages.

In the embodiment configured in such a manner, too, as shown in the waveform diagrams in FIG. 24 and FIG. 25, forward pulse FCL' is propagated by the forward-pulse delay line 52 as much time as Δ, and rearward pulse is generated at the rearward-pulse delay line 143, and propagated as much time as Δ/2, before being outputted from the rearward-pulse delay circuit 143-1 in the first stage.

Other function is similar to that in the embodiment in FIG. 29 and FIG. 38.

Thus, in this embodiment, the embodiment in FIG. 29 can be applied to a device which uses STBD.

Although in the embodiments in FIGS. 18, 20, 22, 23, 24, 26, 28, the clock signals CKQ, CK3Q, which are delayed as much a τ/4 or 3 τ/4 to the external clock signal CK, are generated by inputting an internal clock signal CK', which is synchronized with the external clock signal CK, and a clock signal CKH, which is delayed as much as τ/2 from the external clock signal CK, in a similar manner, a clock signal, which is delayed as much as $\tau/2^{(n+2)}$, can be generated by inputting signals, which are delayed as much as $\tau/2^N$ and $\tau/2^{(N+1)}$.

It is obvious that the present invention is, without any departure from the spirit and scope of it, able to become the basis of configuration for different aspects of embodiments in a wide scope. The present invention should not be limited, except by the appended claims, only to these embodiments.

What is claimed is:

1. A clock control circuit, comprising:
    a forward-pulse delay line which is configured by cascading delay elements in a first number of stages;
    a rearward-pulse delay line which is configured by cascading delay elements in a second number of stages;
    an input device for taking in a first clock signal and outputting a second clock signal which is delayed as much as a first delay time from said first clock signal;
    a pulse generating device including a forward-pulse generating device for generating a forward pulse by delaying said second clock signal as much as second delay time;
    a control circuit, connected to said delay elements of said forward-pulse delay line and said rearward-pulse delay line, which controls a period of time for said forward pulse to propagate in said forward-pulse delay line, controls said forward-pulse delay line to be initialized, controls a rearward pulse to be produced in said rearward-pulse delay line and controls a period of time for said rearward-pulse to propagate in said rearward-pulse delay line;
    said pulse generating device generating a control pulse, which is synchronized with said second clock signal, using said second clock signal and forward pulse from said forward-pulse generating device, inputting said control pulse to said control circuit and controlling the operation of said control circuit; and
    an output device for outputting a third clock signal, which is synchronized with said first clock signal by delaying said rearward pulse outputted from said rearward-pulse delay line as much as third delay time.

2. A clock control circuit according to claim 1, wherein said pulse generating device outputs a pulse, which is synchronized with said second clock signal and has the same time width as said second delay time, as said control pulse.

3. A clock control circuit according to claim 1, wherein said pulse generating device outputs a pulse, which is synchronized with said second clock signal and has a time width shorter than said second delay time, as said control pulse.

4. A clock control circuit according to claim 1, wherein said forward-pulse delay line and rearward-pulse delay line set a delay time of each delay element to be the same as each other, and at the same time, set said first number of stages of delay elements and said second number of stages of delay elements to be the same.

5. A clock control circuit according to claim 1, wherein
    said forward-pulse delay line and rearward-pulse delay line set a delay time of each delay element to be the same as each other, and at the same time, set the second number of stages to be one having a predetermined relation to the first number of stages, and
    said output device delays said rearward pulse outputted from said rearward-pulse delay line by as much as said third delay time, and outputs said third clock signal which has a predetermined phase relation to said first clock signal.

6. A clock control circuit according to claim 1, wherein
    said forward-pulse delay line and rearward-pulse delay line set a delay time of each delay element to be the same as each other, and at the same time, set said second number of stages to be the same as the first number of stages, and
    said output device outputs said third clock signal which is delayed to said first clock signal by as much as a half period thereof by either an AND operation or an OR operation on the outputs of said two delay lines.

7. A clock control circuit according to claim 1, wherein said control circuit has a holding device to store the number of stages where said forward pulse is propagated by said forward-pulse delay line, and, by the output of said holding device, generates rearward pulse in a corresponding stage of said rearward-pulse delay line.

8. A clock control circuit according to claim 1, wherein said rearward-pulse delay line controls each rearward-pulse delay element by compounding the output which corresponds to a plurality of stages of said control circuit.

9. A clock control circuit according to claim 1, wherein said forward-pulse delay line and rearward-pulse delay line, which have delay elements using NAND circuits and delay elements using NOR circuits, are configured with the delay elements using NAND circuits and delay elements using NOR circuits cascaded alternately.

10. A clock control circuit according to claim 1, wherein said pulse generating device sets said second delay time to correspond to a relation in the number of stages of said forward-pulse delay line and rearward-pulse delay line.

11. A clock control circuit according to claim 1, wherein said second delay time is the sum of said first delay time and said third delay time.

12. A clock control circuit according to claim 1, wherein said pulse generating device controls the propagation of said forward pulse in said forward-pulse delay line by setting the level of said control pulse to a level that allows the forward pulse to propagate at the timing where the edge of said forward pulse is inputted to said forward-pulse delay line, and said control circuit generates said rearward pulse in a stage of said rearward-pulse delay line, which corresponds to the stage where said forward pulse was propagated at the timing corresponding to the edge of said control pulse, propagates the rearward pulse in said rearward-pulse delay line and outputs it.

13. A clock control circuit, comprising:

a receiver for taking in a first clock signal, and outputting a second clock signal which is delayed as much as a first delay time from said first clock signal;

a pulse generating device including a forward-pulse generating device for generating a forward pulse by delaying said second clock signal as much as a second delay time;

a forward-pulse delay line which is configured by cascading delay elements in a first number of stages;

a rearward-pulse delay line which is configured by cascading delay elements in a second number of stages;

a control circuit, connected to said delay elements of said forward-pulse delay line and said rearward-pulse delay line;

said pulse generating device generating a control pulse, which is synchronized with said second clock signal, using said second clock signal and forward pulse from said forward-pulse generating device, inputting said control pulse to said control circuit and controlling the operation of said control circuit; and an output buffer for delaying said rearward pulse outputted from said rearward-pulse delay line as much as a third delay time, and outputting a third clock signal which is synchronized with said first clock signal, wherein said control circuit controls said forward pulse to propagate in said forward-pulse delay line until said control pulse is inputted, controls said forward-pulse delay line to be initialized, controls a rearward pulse to be produced in said rearward-pulse delay line and controls a period of time for said rearward-pulse to propagate in said rearward-pulse delay line.

14. A clock control circuit according to claim 13, wherein said control circuit is configured with a plurality of stages of gate circuits where said control pulse and the output of said forward-pulse delay line in each stage are inputted, and controls propagation of said forward pulse and rearward pulse by supplying the output of said gate circuits in each stage to each stage of said forward-pulse delay line and rearward-pulse delay line.

* * * * *